(12) United States Patent
Morimoto et al.

(10) Patent No.: US 8,775,998 B2
(45) Date of Patent: Jul. 8, 2014

(54) SUPPORT DEVICE OF THREE-DIMENSIONAL INTEGRATED CIRCUIT AND METHOD THEREOF

(75) Inventors: Takashi Morimoto, Osaka (JP); Takashi Hashimoto, Fukuoka (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 13/576,515

(22) PCT Filed: Nov. 10, 2011

(86) PCT No.: PCT/JP2011/006290
§ 371 (c)(1),
(2), (4) Date: Aug. 1, 2012

(87) PCT Pub. No.: WO2012/077280
PCT Pub. Date: Jun. 14, 2012

(65) Prior Publication Data
US 2012/0304142 A1 Nov. 29, 2012

(30) Foreign Application Priority Data

Dec. 9, 2010 (JP) .................................. 2010-274669

(51) Int. Cl.
| | | |
|---|---|---|
| *G06F 17/50* | (2006.01) | |
| *H01L 29/00* | (2006.01) | |
| *H01L 23/04* | (2006.01) | |
| *H01L 29/40* | (2006.01) | |

(52) U.S. Cl.
USPC ........... 716/119; 716/106; 716/114; 716/120; 716/123; 716/132; 257/528; 257/698; 257/774; 257/784

(58) Field of Classification Search
USPC ................. 716/106, 114, 119, 120, 123, 132; 257/528, 698, 774, 784
See application file for complete search history.

(56) References Cited

U.S. PATENT DOCUMENTS

| | | | | |
|---|---|---|---|---|
| 5,973,392 A | * | 10/1999 | Senba et al. ................... | 257/686 |
| 6,209,123 B1 | * | 3/2001 | Maziasz et al. ............... | 716/123 |

(Continued)

FOREIGN PATENT DOCUMENTS

| | | |
|---|---|---|
| JP | 5-243535 | 9/1993 |
| JP | 2006-19328 | 1/2006 |

(Continued)

OTHER PUBLICATIONS

International Search Report issued Jan. 24, 2012 in corresponding International Application No. PCT/JP2011/006290.

(Continued)

*Primary Examiner* — Helen Rossoshek
(74) *Attorney, Agent, or Firm* — Wenderoth, Lind & Ponack, L.L.P.

(57) ABSTRACT

To provide a design support device of a three-dimensional integrated circuit capable of, in the case where a placement position of a through-via changes in the design phase of a three-dimensional integrated circuit composed of a plurality of semiconductor chips in layers, avoiding change of respective placement positions of other parts as much as possible. A design support device includes a TSV placement unit that determines respective placement positions of through-vias on one semiconductor chip, the through-bias each penetrating to connect to another semiconductor chip, a TSV reserved cell placement unit that determines, based on the respective placement positions of the through-vias, respective placement positions of reserved cells as respective spare placement positions of the through-vias, and a mask data generation unit that generates layout data that includes the respective placement positions of the through-vias and the respective placement positions of the reserved cells.

18 Claims, 31 Drawing Sheets

(56) References Cited

U.S. PATENT DOCUMENTS

| | | | |
|---|---|---|---|
| 6,598,206 B2* | 7/2003 | Darden et al. | 716/120 |
| 7,383,521 B2* | 6/2008 | Smith et al. | 716/114 |
| 7,496,875 B2* | 2/2009 | Sasaki et al. | 716/106 |
| 7,526,741 B2* | 4/2009 | Lee et al. | 716/106 |
| 7,626,257 B2* | 12/2009 | Knorr | 257/698 |
| 7,759,784 B2* | 7/2010 | Ono et al. | 257/688 |
| 7,845,954 B2* | 12/2010 | Tomura et al. | 439/66 |
| 8,030,113 B2* | 10/2011 | Hsu et al. | 438/55 |
| 8,249,736 B2* | 8/2012 | Kelley | 700/121 |
| 8,378,462 B2* | 2/2013 | Matsumoto | 257/621 |
| 8,392,870 B2* | 3/2013 | Zhang et al. | 716/138 |
| 8,482,137 B2* | 7/2013 | Yoshioka et al. | 257/784 |
| 2006/0001176 A1 | 1/2006 | Fukaishi et al. | |
| 2008/0066023 A1* | 3/2008 | Xu et al. | 716/4 |
| 2008/0244489 A1 | 10/2008 | Tanamoto et al. | |
| 2010/0031217 A1 | 2/2010 | Sinha et al. | |
| 2010/0140790 A1* | 6/2010 | Setiadi et al. | 257/698 |
| 2010/0171218 A1* | 7/2010 | Aoi | 257/741 |
| 2010/0176506 A1* | 7/2010 | Hsu et al. | 257/698 |
| 2010/0244251 A1* | 9/2010 | Torazawa et al. | 257/741 |
| 2011/0104846 A1* | 5/2011 | Hsu et al. | 438/54 |
| 2011/0304057 A1* | 12/2011 | Matsumoto | 257/774 |
| 2012/0161329 A1* | 6/2012 | Bobba et al. | 257/773 |
| 2012/0198409 A1* | 8/2012 | Zhang et al. | 716/132 |
| 2012/0272202 A1* | 10/2012 | Emma et al. | 716/119 |
| 2012/0280406 A1* | 11/2012 | Domae | 257/777 |
| 2013/0037965 A1* | 2/2013 | Morimoto et al. | 257/774 |
| 2013/0097574 A1* | 4/2013 | Balabanov et al. | 716/123 |
| 2013/0105939 A1* | 5/2013 | Domae | 257/528 |
| 2013/0127028 A1* | 5/2013 | Morimoto et al. | 257/666 |
| 2013/0132914 A1* | 5/2013 | Sproch et al. | 716/55 |
| 2013/0135004 A1* | 5/2013 | Hashimoto et al. | 324/762.03 |

FOREIGN PATENT DOCUMENTS

| | | |
|---|---|---|
| JP | 2007-250754 | 9/2007 |
| JP | 2008-243993 | 10/2008 |
| WO | 2010/014445 | 2/2010 |

OTHER PUBLICATIONS

Mohit Pathak et al., "Through-silicon-via management during 3D physical design: When to add and how many?", Computer-Aided Design (ICCAD), 2010 IEEE/ACM International Conference, Nov. 7, 2010, pp. 387-394, ISBN: 978-1-4244-8193-4. See IV. TSV Placement.

Ang-Chih Hsieh et al., "TSV Redundancy: Architecture and Design Issues in 3D IC", Design, Automation & Test in Europe Conference & Exhibition (Date), Mar, 8, 2010, pp. 166-171, ISBN: 978-1-4244-7054-9. See III Redundant TSV Architecture.

* cited by examiner

FIG. 21

```
module mc_dp_top(
          clk_dat
          ,clk_cmd
          ,rst_n
          ,mc_tsv_dp
          ,mc_tsv_valid
          ,mc_uid
          ,mc_ctyp
          ,mc_valid
          );
//clock
input                     clk_dat;    //Clock Signal
input                     clk_cmd;    //Clock Signal //reset
input                     rst_n;      //Async.Reset Signal
input    [127:0]          mc_tsv_dp;
input                     mc_tsv_valid;
・・・・・Omitted・・・・・
TSVCELL1 tsv_dp_0(.in(mc_tsv_dp[0]),..out(dp[0]));
TSVCELL1 tsv_dp_1(.in(mc_tsv_dp[1]),..out(dp[1]));
TSVCELL1 tsv_dp_2(.in(mc_tsv_dp[2]),..out(dp[2]));
・・・・・Omitted・・・・・
assign mc_uid = 3{valid}&dp[3:1];

endmodule
```

FIG. 23

```
module mc_dp_top(
            clk_dat
            ,clk_cmd
            ,rst_n
            ,mc_tsv_dp
            ,mc_tsv_valid
            ,mc_uid
            ,mc_ctyp
            ,mc_valid
            );
//clock
input                       clk_dat;    //Clock Signal
input                       clk_cmd;    //Clock Signal //reset
input                       rst_n;      //Async.Reset Signal
input    [127:0]            mc_tsv_dp;
input                       mc_tsv_valid:
・・・・・Omitted・・・・・
TSVCELL1 tsv_dp_0(.in(mc_tsv_dp[0]),.out(dp[0]));
TSVCELL1 tsv_dp_1(.in(mc_tsv_dp[1]),.out(dp[1]));
TSVCELL1 tsv_dp_2(.in(mc_tsv_dp[2]),.out(dp[2]));
・・・・・Omitted・・・・・
NAND2D1 m200(.A(w1020),.B(w1021),.Y(m1022));
NOR2D4  m201(.A(w1120),.B(w1121),.Y(m1122));
INVD1   m201(.A(w1122),.Y(m1125));

endmodule
```

US 8,775,998 B2

SUPPORT DEVICE OF THREE-DIMENSIONAL INTEGRATED CIRCUIT AND METHOD THEREOF

TECHNICAL FIELD

The present invention relates to an art of supporting design of a three-dimensional integrated circuit constituted from a plurality of semiconductor integrated circuit chips arranged in layers.

BACKGROUND ART

In order to realize high integration of semiconductor integrated circuits, there has been used a method of layering a plurality of semiconductor integrated circuit chips (hereinafter "semiconductor chips") to be a single package. An integrated circuit manufactured with use of such a method is called a three-dimensional integrated circuit. Patent Literatures 1 and 2 each disclose a three-dimensional integrated circuit design device that designs layout of each of a plurality of layered semiconductor chips constituting a semiconductor integrated circuit.

Layered first and second semiconductor chips constituting a three-dimensional integrated circuit are connected to each other through an electrode called a through-silicon via (TSV) penetrating the first semiconductor chip. Around the TSV, a placement prohibited region, which is a region where placement of a cell such as a transistor is prohibited, is placed. Also, a placement prohibition region is placed in a position of the second semiconductor chip corresponding to the position of the TSV of the first semiconductor chip. This is in order to prevent a stress, which occurs due to bonding of the first semiconductor chip and the second semiconductor chip, from exercising an influence on surrounding cells.

CITATION LIST

Patent Literature

[Patent Literature 1] Japanese Patent Application Publication No. 2007-250754
[Patent Literature 2] Japanese Patent Application Publication No. 2008-243993

SUMMARY OF INVENTION

Technical Problem

Once the design of a three-dimensional integrated circuit completes, it is sometimes necessary to change respective placement positions of cells and wiring on the three-dimensional integrated circuit, which have been already placed. For example, once the design completes, verification is performed as to whether the layout of the three-dimensional integrated circuit satisfies design conditions by performing DRC (Design Rule Check), LUVS (Layout Versus Schematic), antenna rule check, and so on. In the case where results of the verification shows that the design conditions are not satisfied, the respective placement positions of the cells and the wiring need to be changed as described above. In this case, a placement position of the TSV also sometimes needs to be changed in accordance with change of the respective placement positions of the cells and the wiring. Then, the change of the placement position of the TSV causes change of a placement position of the placement prohibition region on a first semiconductor chip. Also, in this case, the design change is performed on not only the first semiconductor chip. The reason for this is as shown below. A placement prohibition region needs to be placed in a position of a second semiconductor chip corresponding to the position of the TSV on the first semiconductor chip. The change of the placement position of the TSV on the first semiconductor chip causes change of the placement position of the placement prohibition region on the second semiconductor chip. As a result, in accordance with the change of the placement position of the prohibition region on the second semiconductor chip, it is necessary to change respective positions of cells and wiring which have been originally placed in the new placement prohibition region.

In the case where the placement position of the TSV on the semiconductor chip is changed in this way, there occurs a problem that this change causes a large change of respective placement positions of many parts such as other cells.

In order to solve the above problem, the present invention aims to provide a design support device, a design support method, a computer program for design support, and a recording medium having recorded therein the computer program, which are capable of, in the case where a placement position of a TSV changes, avoiding change of placement of other circuit parts as much as possible.

Solution to Problem

In order to achieve the above aim, the present invention provides a design support device that supports design of a three-dimensional integrated circuit that is composed of a plurality of semiconductor chips arranged in layers including a first semiconductor chip and a second semiconductor chip, the design support device comprising: a through-via placement unit operable to determine respective placement positions of one or more through-vias on the first semiconductor chip, the through-vias each penetrating the first semiconductor chip to connect to the second semiconductor chip; a reserved cell placement unit operable to determine, based on the respective placement positions of the through-vias, respective placement positions of one or more reserved cells on the first semiconductor chip, as respective spare placement positions of the through-vias; and a generation unit operable to generate layout data that includes the respective placement positions of the through-vias and the respective placement positions of the reserved cells.

Advantageous Effects of Invention

With this structure, in the case where a placement position of a TSV needs to be changed during the design phase of a three-dimensional integrated circuit, it is possible to use a placement position of a reserved cell that has been determined beforehand as a new placement position of the TSV after change. This exhibits an excellent effect of avoiding a large design change in other circuit parts.

BRIEF DESCRIPTION OF DRAWINGS

FIG. 21 shows an HDL (Hardware Description Language) file 454 as an example of an HDL file described in an HDL.

FIG. 23 shows an HDL file 471 as an example of a netlist.

DESCRIPTION OF EMBODIMENTS

1. Embodiment

A design support device 400 is described as an embodiment of the present invention.

1.1 Structure of Three-Dimensional Integrated Circuit

The following describes the structure of a three-dimensional integrated circuit designed with use of the design support device 400.

Note that the structure of the three-dimensional integrated circuit described below is not that of an integrated circuit that has been actually manufactured, but that of an integrated circuit that is under the design phase by the design support device 400. Terms such as "structure", "form", "connect", and "provide" are used not in order to describe the physical mechanism of an integrated circuit that has been actually manufactured, but in order to describe the logical mechanism of an integrated circuit represented in a logical three-dimensional space by the design support device 400.

Figure 1:
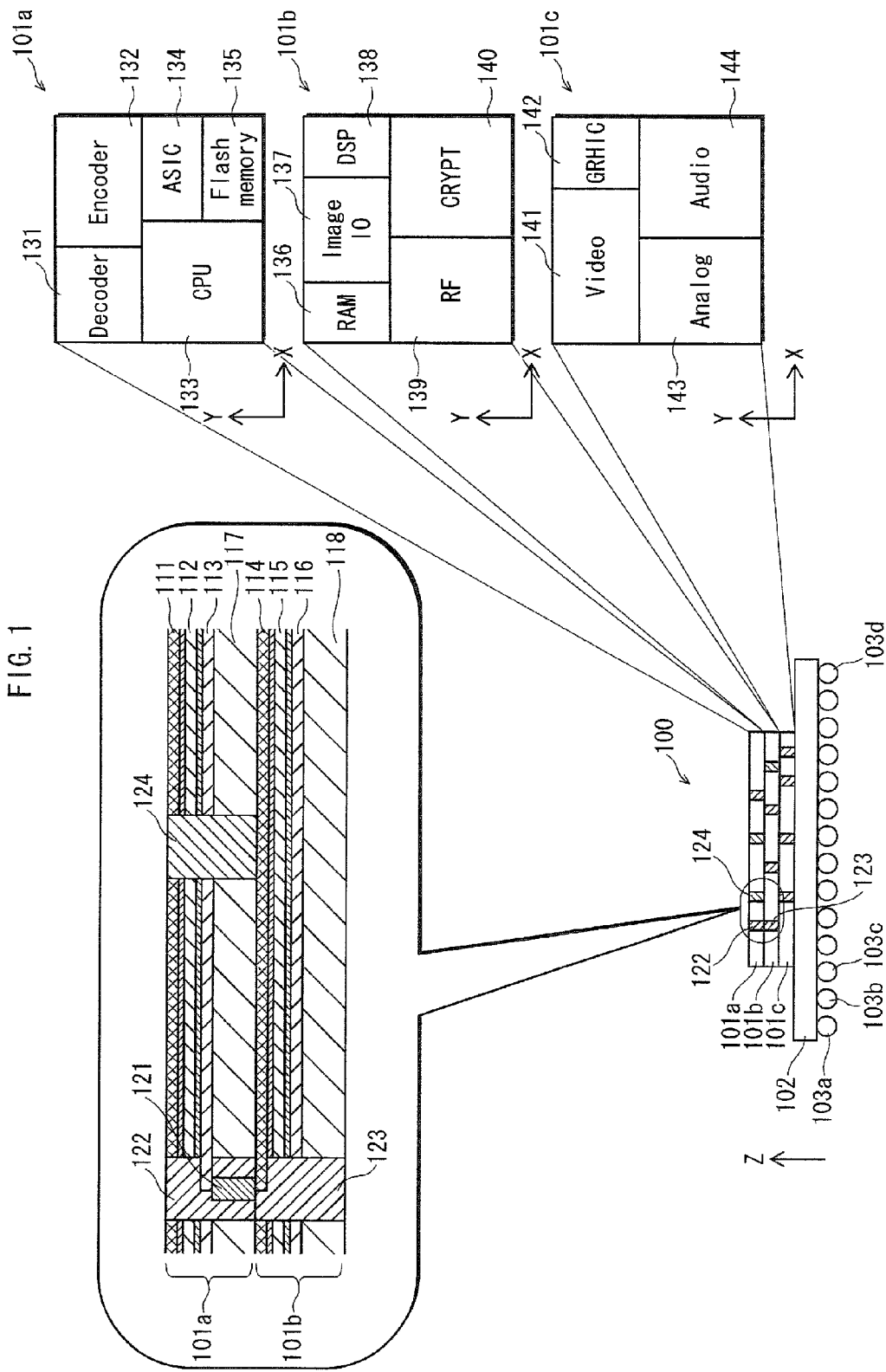
FIG. 1 includes a cross-sectional conceptual view showing a three-dimensional integrated circuit 100 and a plan conceptual view showing semiconductor chips constituting the three-dimensional integrated circuit 100.

A three-dimensional integrated circuit 100, which is an example of a three-dimensional integrated circuit designed with use of the design support device 400, includes, as shown in FIG. 1, an interposer 102, three semiconductor chips 101c, 101b, and 101a, and a plurality of bumps 103a, 103b, 103c, . . . , 103d. On a top surface of the interposer 102, the three semiconductor chips 101c, 101b, and 101a are layered in this order, in other words, arranged in layers. Also, on a bottom surface of the interposer 102, the bumps 103a, 103b, 103c, . . . , 103d are arranged. The three-dimensional integrated circuit 100 is mounted on a circuit board (not illustrated). The semiconductor chips 101a, 101b, and 101c are connected to the circuit board through the interposer 102 and the bumps 103a, 103b, 103c, . . . , 103d.

Note that, in the design support device 400, a three-dimensional space is defined by setting a Z-axis in a direction perpendicular to the top surface of the interposer 102 and setting an X-axis and a Y-axis perpendicular to the X-axis on the top surface of the interposer 102.

The interposer 102 has a thin structure for converting the size of a wiring provided between a semiconductor chip and the circuit board. The bumps 103a, 103b, 103c, . . . , 103d are each a minute connecting pin for use in connecting the interposer 102 and the circuit board.

As shown in FIG. 1, the semiconductor chips 101a, 101b, and 101c are, for example, composed of a plurality of blocks 131 to 135, a plurality of blocks 136 to 140, and a plurality of blocks 141 to 144, respectively. The blocks each have a single function as shown in FIG. 1 as an example. For example, the block 131 is a decoder for decoding compressed image data, the block 132 is an encoder for encoding the decoded image data, and the block 137 is an image 10 unit for mediating between these pieces of image data.

The semiconductor chip 101a is connected to the semiconductor chip 101b through at least one TSV penetrating the semiconductor chip 101a. The semiconductor chip 101b is connected to the semiconductor chip 101c through at least one TSV penetrating the semiconductor chip 101b. The semiconductor chip 101c is connected to the interposer 102 through at least one TSV penetrating the semiconductor chip 101c.

The semiconductor chip 101a is formed by layering a layer 117 such as a poly-Si layer and a well layer, a metal wiring layers 3 (113), 2 (112), and 1 (111) in this order. In the layer 117, various types of cells are formed. Here, the cells are each for example an electronic component, such as a logic circuit including an AND gate and an NOR gate, an external terminal, an SRAM memory, and a TSV. Also, in each of the metal wiring layers 1 (111), 2 (112), and 3 (113), a plurality of wirings are formed.

The semiconductor chip 101b is formed by layering a layer 118 such as a poly-Si layer and a well layer, a metal wiring layers 3 (116), 2 (115), and 1 (114) in this order, in the same way as the semiconductor chip 101a. The semiconductor chip 101c is also formed in the same way.

In each of the semiconductor chips 101a, 101b, and 101c, one or more placement prohibition regions are placed so as to one-to-one correspond to one or more TSVs. Each of the placement prohibition regions penetrates a semiconductor chip and surrounds a TSV. Also, in a semiconductor chip to which the TSV is to be connected, a placement prohibition region is placed in a position corresponding to the TSV.

The TSV is for example a rectangular solid whose cross section in a surface direction of the semiconductor chip is a square. In the following description, a placement position of the TSV indicates a position on the semiconductor chip where the center of the square that is the cross section of the TSV is to be placed. Note that, the center of the square is an intersection point of two diagonal lines of the square. Also, the cross section of the TSV in the surface direction of the semiconductor chip is not limited to be square. Alternatively, the cross section may be a rectangle, a polygon, a circle, or an ellipse, for example.

Also, the placement prohibition region is for example a rectangular solid whose cross section in a surface direction of the semiconductor chip is a square. In the following description, a placement position of the placement prohibition region indicates a position on the semiconductor chip where the center of the square that is the cross section of the placement prohibition region is to be placed. Note that, the center of the square is an intersection point of two diagonal lines of the square. Also, the cross section of the placement prohibition region in the surface direction of the semiconductor chip is not limited to be square. Alternatively, the cross section may be a rectangle, a polygon, a circle, or an ellipse, for example.

In each of the semiconductor chips 101a, 101b, and 101c, a placement position of at least one TSV reserved cell (hereinafter, "reserved cell") is determined. In the case where a placement position of a TSV needs to be changed, the placement position of the reserved cell is used as a new placement position of the TSV after change. In other words, the placement position of the reserved cell is a spare placement position where the TSV is to be newly placed after change of its placement position. The reserved cell is a spare region for use in placing the TSV, and accordingly has an area equal to or larger than the sum of an area of the TSV and an area of the placement prohibition region.

In the case where the total region of the TSV and the placement prohibition region is a rectangular solid for example, the reserved cell is a rectangular solid whose cross section in the surface direction of the semiconductor chip is a square. The length of a side of the cross section of the reserved cell is referred to as a "width" of the reserved cell. In the following description, the placement position of the reserved cell indicates a position on the semiconductor chip where the center of the square that is the cross section of the reserved cell is to be placed.

As shown in FIG. 1 as an example, on the semiconductor chip 101a, a TSV 121 is placed so as to penetrate the layer 117 of the semiconductor chip 101a in a direction perpendicular to the bottom surface of the semiconductor chip 101a, in order to connect the semiconductor chip 101a to the semiconductor chip 101b. One end of the TSV 121 is connected to a wiring formed in the metal wiring layer 3 (113), and the other end of the TSV 121 is connected to a wiring formed in the metal wiring layer 1 (114) of the semiconductor chip 101b. The blocks formed on the semiconductor chip 101a are connected to the corresponding blocks formed on the semiconductor chip 101b through the wirings formed in all (or any one or two) of the metal wiring layers 1 (111), 2 (112), and 3 (113), and the TSV 121, and the wirings formed in all (or any one or two) of the metal wiring layers 1 (114), 2 (115), and 3 (116).

Also, as shown in FIG. 1 as an example, on the semiconductor chip 101a, a placement prohibition region 122 is placed so as to penetrate the metal wiring layers 1 (111), 2 (112), and 3 (113) and the layer 117 of the semiconductor chip 101a in the direction perpendicular to the bottom surface of the semiconductor chip 101a and surround the TSV 121.

Also on the semiconductor chip 101b, a placement prohibition region 123 is placed, as shown in FIG. 1 as an example. In a position on the semiconductor chip 101b facing a bottom surface of the TSV 121, the placement prohibition region 123 so as to penetrate the metal wiring layers 1 (114), 2 (115), and 3 (116) and the layer 118 of the semiconductor chip 101b in the perpendicular direction from the bottom surface of the TSV 121 to the semiconductor chip 101b. The placement prohibition region 123 has a volume equal to or greater than the sum of a volume of the placement prohibition region 122 and a volume of the TSV 121.

Furthermore, as shown in FIG. 1 as an example, on the semiconductor chip 101a, a reserved cell 124 is placed so as to penetrate the semiconductor chip 101a, namely, the metal wiring layers 1 (111), 2 (112), and 3 (113) of the semiconductor chip 101a. The placement position of the reserved cell 124 on the semiconductor chip 101a is described later.

FIG. 1 shows the method of connecting between the semiconductor chips 101a and 101b, and its description has been provided above. The same applies to connection between the semiconductor chips 101b and 101c and connection between the semiconductor chip 101c and the interposer 102. Accordingly, their descriptions are omitted here.

As described above, the three-dimensional integrated circuit 100 is a single integrated circuit that is formed by layering a plurality of semiconductor chips (referred to also as "dies") and perpendicularly interconnecting the layered semiconductor chips. The three-dimensional integrated circuit 100 functions as a single electronic component.

1.2 Design Process of Three-Dimensional Integrated Circuit

The following describes the design process of a three-dimensional integrated circuit.

According to the structure of the three-dimensional integrated circuit, one semiconductor chip is connected to another semiconductor chip through one or more TSVs. The design of the three-dimensional integrated circuit does not greatly differ from that of an integrated circuit composed of a single semiconductor chip (called "two-dimensional integrated circuit"), excepting the design of placement of TSVs and so on. A design method of the two-dimensional integrated circuit can be used for design of the three-dimensional integrated circuit.

Figure 2:
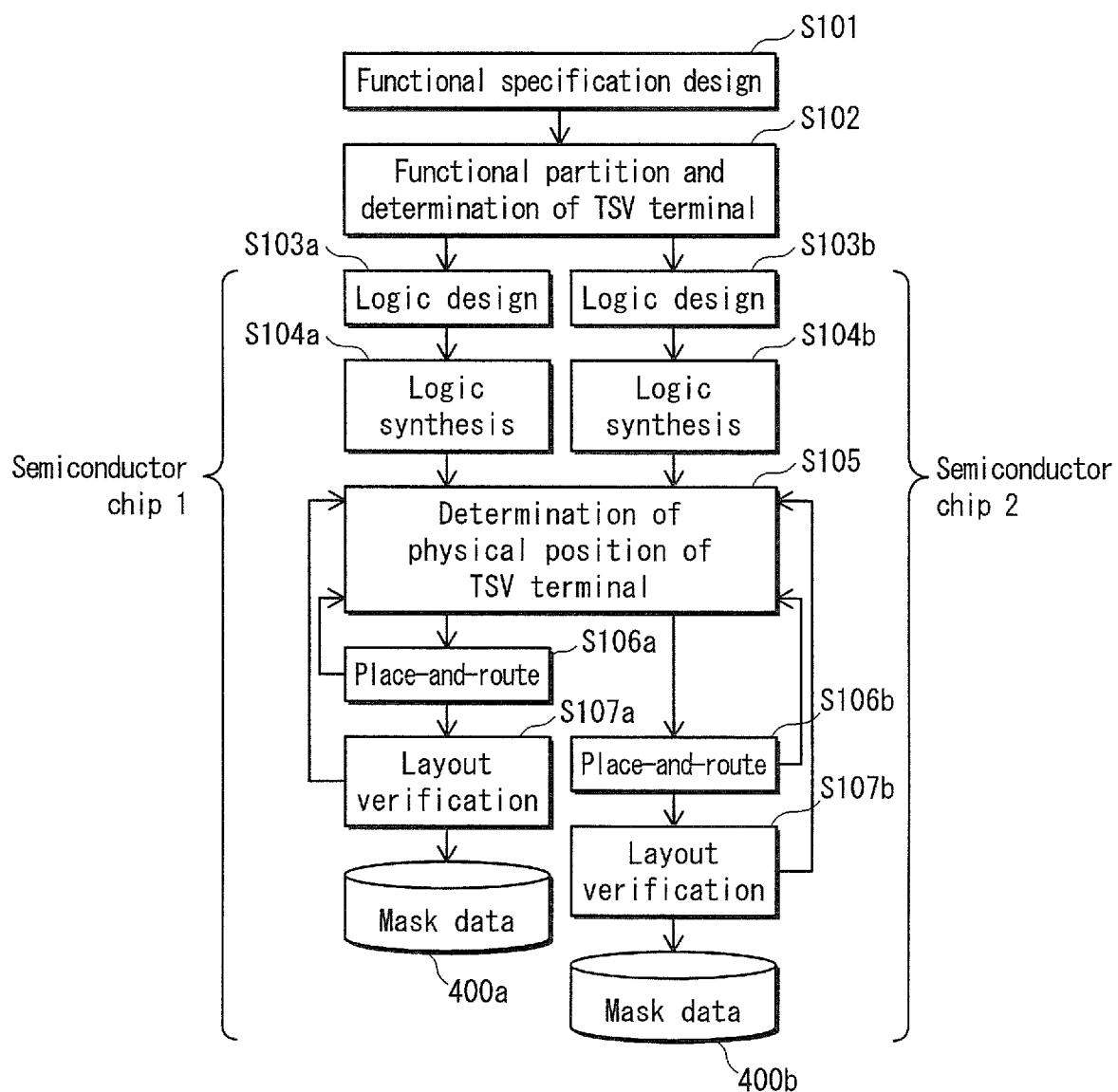
FIG. 2 is a flowchart of design process of the three-dimensional integrated circuit 100.

FIG. 2 is a flowchart of design process of a three-dimensional integrated circuit. In FIG. 2, the three-dimensional integrated circuit is composed of semiconductor chips 1 and 2 that are layered.

Firstly, in functional specification design process, processing functions such as codec and the type of high-resolution image processing are determined, which the three-dimensional integrated circuit needs to have as commodity system (Process S101).

Next, in processes of functional partition and TSV terminal determination, functional partition is performed with respect to functions to be implemented in each of a plurality of semiconductor chips constituting the three-dimensional integrated circuit. In the case where the functions, which have been determined in the functional specification design process in Process S101, are realized by a plurality of semiconductor chips, specifications are determined (Process S102). For example, determination is made as to which function is to be implemented in which semiconductor chip, how many terminals (TSVs) are to be placed between the semiconductor chips, how interface such as communication protocol is to be defined, and so on.

In the processes so far, design is performed in a process group (Processes S101 to S102) as a single flow with respect to the whole three-dimensional integrated circuit. From process subsequent to Process S102, design is performed in a single flow for each semiconductor chip (excepting Process S105 described below).

In logic design process, functions to be realized on the semiconductor chips are described by expression according to which circuit mapping can be performed, with use of a hardware description language such as Verilog-HDL (Hardware Description Language) (Process S103a and Process S103b).

In subsequent logic synthesis process, the hardware description language is analyzed to perform circuit mapping on a standard cell (hereinafter, referred to also as just "cell"), which is the minimum unit of a logic circuit such as an AND gate and an NOR gate (Process S104a and Process S104b).

In process of TSV terminal physical position determination for determining terminals necessary for external communication such as terminals for power sources, respective placement positions of TSVs for data signals between the semiconductor chips and for the power source (Process S105). This process is performed with respect to the whole three-dimensional integrated circuit. This Process S105 is not performed in the design of a two-dimensional integrated circuit. Respective placement positions of TSVs need to be determined before subsequent place-and-route processing.

Next, in the place-and-route process, cell placement and routing between cells are performed. Here, cell placement and routing between cells are performed such that the circuit operating frequency is satisfied (Process S106a and Process S106b). If the circuit operating frequency is not satisfied as required in the design specifications at this stage for example, correction is sometimes performed returning to the logic design process in Process S104a and Process S104b. Also, correction is sometimes performed returning to the process of TSV terminal physical position determination in Process S105. In the place-and-route process, firstly, netlist representing processing results of the logic synthesis process and files such as design specifications constraints are read. Next, a floor plan of layout of the semiconductor chips is determined. Macro cells such as an external terminal and an SRAM memory are placed. Cells are placed such that paths of all the circuits satisfy the timing constraints of the design specifications, and power routing is performed. Then, global routing processing and detailed routing processing are performed in this order for routing between cells. Note that TSVs are one kind of terminals from the side of chips, but are placed as macro cells, unlike normal terminals. Furthermore, in order to directly bond the semiconductor chips onto each other, the semiconductor chips need to coincide in position where a corresponding TSV is to be placed with each other.

In the place-and-route process, design needs to be performed so as to satisfy the timing constraints between cells and the wiring resource constraints. If even one of these constraints is not satisfied, normal operations of the semiconductor chips might not be performed. In such a case, correction is necessary. However, indeed, the correction often can be performed by just changing respective placement positions of terminals to re-perform the processing subsequent to cell placement.

In layout verification process, verification and final confirmation are performed on mask layout, by DRC (Design Rule Check), LVS (Layout Versus Schematic), antenna rule check, and the like. If the verification results in some troubles, correction needs to be performed returning to a necessary process.

Finally, pieces of mask data 400$a$ and 400$b$ indicating mask layout of the three-dimensional integrated circuit are generated through these design processes.

The three-dimensional integrated circuit has been described as being composed of the semiconductor chips 1 and 2 that are layered. Also in the design of a three-dimensional integrated circuit composed of more than three semiconductor chips that are layered, processes similar to the above processes are performed. In such a case, the functional specification and design process, and the process of functional partition and TSV terminal determination are each performed as a single process flow with respect to the whole three-dimensional integrated circuit. In the subsequent processes, design is performed in a single flow for each semiconductor chip excepting the above process of TSV terminal physical position determination. In the process of TSV terminal physical position determination, design is performed in a process group as a single process flow with respect to the whole three-dimensional integrated circuit.

1.3 Placement of Reserved Cells

As described above, on each of a plurality of semiconductor chips constituting a three-dimensional integrated circuit, a placement position of at least one reserved cell is determined. In the case where a placement position of a TSV needs to be changed, the placement position of the reserved cell is used as a new placement position of the TSV after change. In other words, the placement position of the reserved cell is a spare placement position where the TSV is to be newly placed after change of its placement position.

The following describes how to place a reserved cell on each semiconductor chip.

(1) Target Region where Reserved Cells are to be Placed

A reserved cell is, for example, placed in a block where a TSV is to be placed among the blocks 131 to 135, the blocks 136 to 140, and the blocks 141 to 144 shown in FIG. 1. Here, a region that is a target for placing a reserved cell is referred to as "target region". A target region in this case is the whole block where the TSV is to be placed. Accordingly, no reserved cell is placed in a block where no TSV is to be placed.

Figure 3:
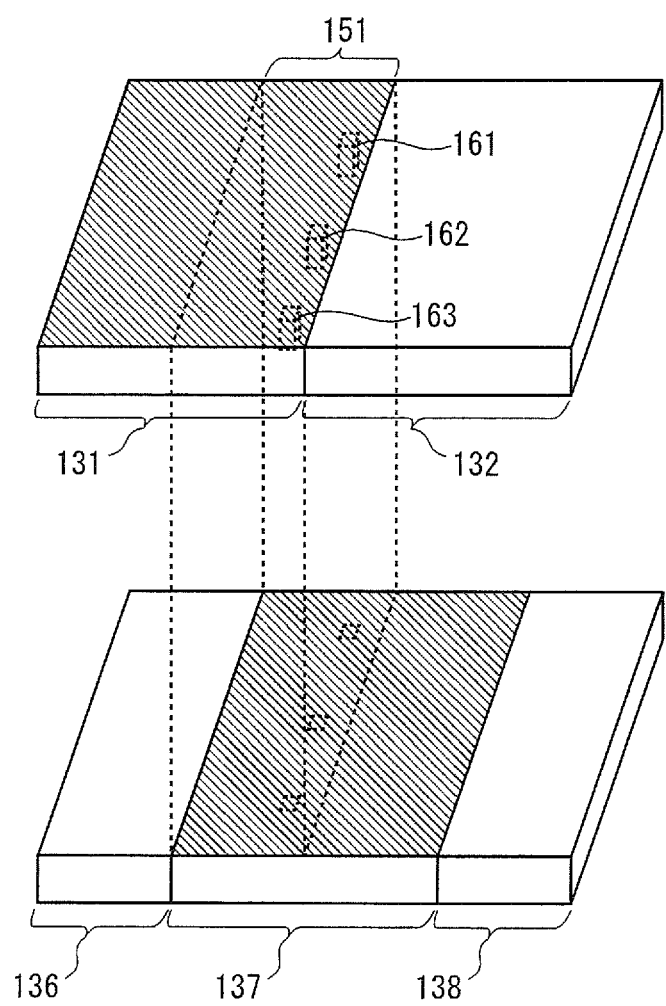
FIG. 3 is a conceptual view showing an overlap region 151 overlapping between a block 131 of a semiconductor chip 101a and a block 137 of a semiconductor chip 101b constituting the three-dimensional integrated circuit 100.

As shown in FIG. 3 as an example, in the block 131 of the semiconductor chip 101$a$, TSVs 161 to 163 are placed so as to each penetrate the block 131. The TSVs 161 to 163 are connected to the block 137 of the semiconductor chip 101$b$. When the three-dimensional integrated circuit 100 is viewed in perspective from above the top surface thereof in the Y-axis direction, the block 131 of the semiconductor chip 101$a$ and the block 137 of the semiconductor chip 101$b$ have a partial region 151 overlapping therebetween. In other words, the block 131 and the block 137 are arranged in layers such that a bottom surface of the region 151 of the block 131 of the semiconductor chip 101$a$ is in contact with a top surface of a partial region of the block 137 of the semiconductor chip 101$b$. Alternatively, the block 131 and the block 137 may be arranged in layers such that the bottom surface of the region 151 of the block 131 of the semiconductor chip 101$a$ is in contact with a top surface of the entire region of the block 137 of the semiconductor chip 101$b$.

Also, a bottom surface of the semiconductor chip 101$a$ and a top surface of the semiconductor chip 101$b$ may be connected to each other through one or more bumps provided therebetween. The same applies to a bottom surface of the semiconductor chip 101$b$ and a top surface of the semiconductor chip 101$c$. Alternatively, the bottom surface of the semiconductor chip 101$a$ and the top surface of the semiconductor chip 101$b$ may be adhered to each other using adhesive. The same applies to the bottom surface of the semiconductor chip 101$b$ and the top surface of the semiconductor chip 101$c$.

The block 131 of the semiconductor chip 101$a$ and the block 137 of the semiconductor chip 101$b$ have an overlap region overlapping therebetween. The overlap region is a region that coincides with part or all of the block 137 in a direction perpendicular to a surface of the overlap region. According to the example shown in FIG. 3, the region 151 is a region that coincides with part or all of the block 137 in a direction perpendicular to a surface of the region 151, and accordingly is an overlap region overlapping between the block 131 and the block 137.

The TSVs 161 to 163 each connect the block 131 to the block 137, and accordingly are placed in the overlap region 151. Accordingly, respective reserved cells for the TSVs 161 to 163 may be placed in the overlap region 151.

In this way, reserved cells may be placed in an overlap region overlapping between a block where TSVs are to be placed and a block to which the TSVs are to be connected. In this case, the overlap region is determined as a target region.

(2) Method of Determining the Number of Reserved Cells to be Placed in Target Region The following describes how to determine the number of reserved cells to be placed in a target region. Note that the number of reserved cells to be placed, which is determined with use of a determination method shown below, is used for later-described various methods of placing reserved cells.

According to a first method, the number of reserved cells to be placed may be determined by a user's designation.

According to a second method, the number of reserved cells to be placed may be determined by a percent rule. The percent rule defines that the number of reserved cells to be placed is determined such that the following formula is satisfied.

[total area of all reserved cells to be placed/area of target region]=designated area ratio of reserved cell In other words, the number of reserved cells to be placed is determined with use of an area ratio (%) of the total area of all the reserved cells to be placed in the target region to the area of the target region. In this case, the number of reserved cells to be placed is calculated by the following formula. Here, the area ratio is designated by the user. Alternatively, the area ratio may be always a fixed value instead of a value designated by the user.

the number of reserved cells to be placed=[area of target region×designated area ratio (%)/area of one reserved cell×100]

Here, the symbol [x] denotes a result of an operation truncation after the decimal point of the value x.

The designated area ratio is desirably 10% or less, and is more desirably 1% to 5%. This is because the increase in area ratio raises the probability that many wasteful regions which will not be used in the future remain in the block.

According to a third method, the number of reserved cells to be placed may be determined depending on the number of TSVs to be placed in the target region. For example, the number of TSVs to be placed in the target region is multiplied by a multiple number to obtain a value as the number of reserved cells to be placed. Reserved cells are placed in the entire target region by the determined number of reserved cells to be placed. Here, the multiple number is for example any of two to four.

the number of reserved cells to be placed=the number of TSVs to be placed×multiple number Here, with respect to each of the TSVs to be placed in the target region, reserved cells are placed not by twice to four times the number of TSVs to be placed but by the number of reserved cells, which is determined depending on the number of TSVs to be placed. According to this method, with respect to each of the TSVs, reserved cells are always placed by twice to four times the number of TSVs to be placed. This enables flexible processing in response to a case of change of a placement position of any TSV. Here, the multiple number may be designated by the user or may be always fixed.

According to a fourth method, the number of reserved cells to be placed may be determined depending on positions and the number of TSVs to be placed in the target region. For example, all the TSVs to be placed in the target region are classified into a plurality of groups such that TSVs to be placed adjacent to each other belong to the same group. Any of twice to quadruple the number of the groups is determined as the number of reserved cells to be placed in the target region. Alternatively, a multiple number may be set depending on the number of TSVs belonging to each group to calculate the number of reserved cells to be placed. Here, the multiple number may be designated by the user or may be always fixed. Also in this case, reserved cells may be placed adjacent to the group by the number of reserved cells to be placed determined for the group.

Furthermore, there is a case where it is unnecessary to determine beforehand a method of determining the number of reserved cells to be placed, such as a case of adoption of a method of placing reserved cells such that respective placement positions of the reserved cells and respective placement positions of TSVs are symmetrical. In this case, one reserved cell is placed for each TSV. In other words, the same number of reserved cells are placed as the number of TSVs to be placed. Accordingly, it is unnecessary to determine beforehand a method of determining the number of reserved cells to be placed.

(3) Method of Placing Reserved Cells

The following describes, as placement of reserved cells, random placement of reserved cells, placement of reserved cells at regular intervals, placement of reserved cells in respective positions designated by a user, placement of reserved cells such that respective placement positions of the reserved cells and respective placement positions of TSVs are symmetrical, placement of reserved cells in respective positions at an equal distance from a TSV, and placement of reserved cells for each group to which TSVs belong.

(a) Avoidance of Collision

In the case where reserved cells are placed (here referred to as "placement target reserved cells") after respective placement positions of other cells have been already determined (referred to as "determined cells"), it is necessary to take into consideration avoidance of collision between respective placement positions of the placement target reserved cells and respective placement positions of the determined cells on each semiconductor chip, that is, avoidance of overlapping of the respective placement positions of the placement target reserved cells and the respective placement positions of the determined cells on the one semiconductor chip. Also, the determined cells include TSVs to be placed on a semiconductor chip to which the one semiconductor chip. In other words, in the case where a first semiconductor chip is bonded onto a second semiconductor chip, it is necessary to take into consideration avoidance of overlapping between placement target reserved cells on the first semiconductor chip and TSVs that have been already placed on the second semiconductor chip.

Accordingly, in the case where respective placement positions of placement target reserved cells are temporarily determined with use of a method of placing reserved cells shown below, judgment is made as to whether each of the placement target reserved cells overlaps in placement position with any of the determined cells. When the placement target reserved cell overlaps in placement position with any of the determined cells, the placement position of the placement target reserved cell is moved. The placement position of the placement target reserved cell is moved by a distance equal to the width of the reserved cell, for example. After the placement position of the placement target reserved cell is moved by the width of the reserved cell, judgment is made again as to whether the placement target reserved cell overlaps in placement position with any of the determined cells. When the placement target reserved cell overlaps in placement position with any of the determined cells, the placement position of the placement target reserved cell is further moved. The above judgment and move are repeatedly performed until the placement target reserved cell does not overlap in placement position with any of the determined cells. When the placement target reserved cell does not overlap in placement position with any of the determined cells, a placement position of the placement target reserved cell at this time is determined as a placement position of the reserved cell.

The placement position of the placement target reserved cell is repeatedly moved for example in the X-axis positive direction, the X-axis negative direction, the Y-axis positive direction, and the Y-axis negative direction in this order. Each time the placement position of the placement target reserved cell is moved, judgment is made as to overlapping in placement position. If overlapping in placement position occurs even after the above move is repeatedly performed, the placement position of the placement target reserved cell is repeatedly moved by a distance equal to twice, three times, . . . the width of the reserved cell. Each time the placement position of the placement target reserved cell is moved, judgment is made as to overlapping in placement position.

(b) Random Placement of Reserved Cells (Placement in Target Region)

Reserved cells may be placed in respective positions that are randomly determined in a target region where TSVs are to be placed.

In the phase of the initial design, it is difficult to predict a new placement position of any of the TSVs whose placement position in the target region will change after completion of the initial design. Accordingly, random placement of the reserved cells in the target region increases the probability of appropriately selecting the new placement position of the any TSV among the respective random placement positions of the reserved cells.

(Example of Placement in Block)

Reserved cells may be placed in respective positions that are randomly determined in a block where TSVs are to be placed.

Figure 4:
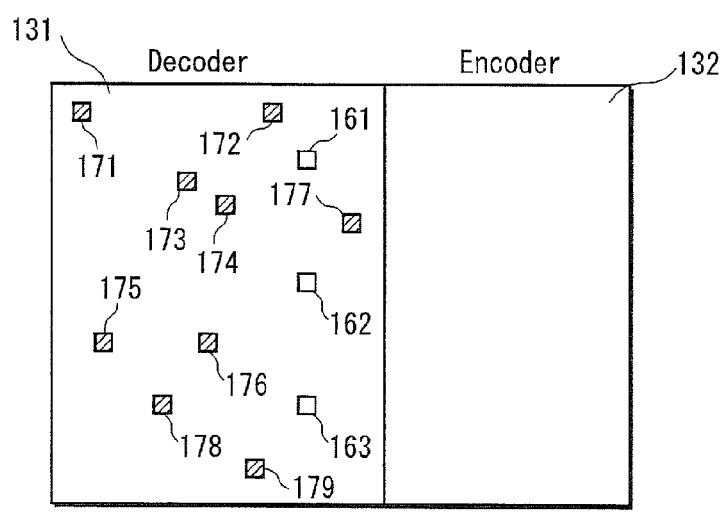
FIG. 4 is a plan conceptual view showing that a plurality of reserved cells are randomly placed in the block 131 of the semiconductor chip 101a constituting the three-dimensional integrated circuit 100.

As shown in FIG. 4 as an example, in the block 131, the TSVs 161 to 163 are placed so as to each penetrate the block 131. A target region in this case is the block 131, and reserved cells 171 to 179 are randomly placed in the block 131 as the target region.

(Example of Placement in Overlap Region)

Also, reserved cells may be placed in respective positions that are randomly determined in an overlap region overlapping between a block where TSVs are to be placed and a block to which the TSVs are to be connected.

Figure 5:
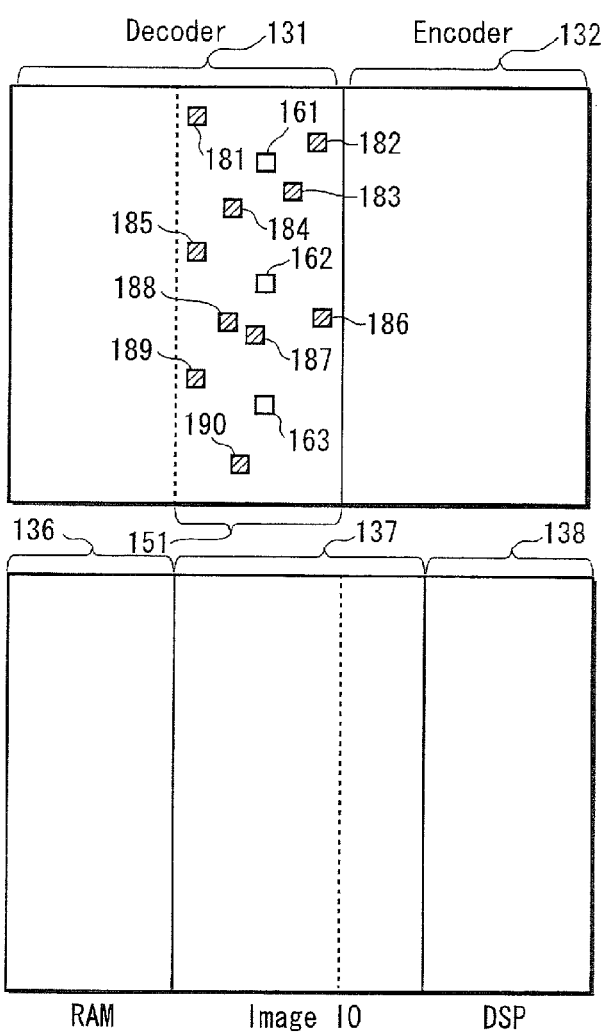
FIG. 5 is a plan conceptual view showing that a plurality of reserved cells are randomly placed in the overlap region 151 overlapping between the block 131 of the semiconductor chip 101a and the block 137 of the semiconductor chip 101b constituting the three-dimensional integrated circuit 100.

As shown in FIG. 5 as an example, in the block 131 of the semiconductor chip 101a, the TSVs 161 to 163 are placed so as to each penetrate the block 131. The TSVs 161 to 163 are connected to the block 137 of the semiconductor chip 101b. The block 131 of the semiconductor chip 101a and the block 137 of the semiconductor chip 101b have an overlap region 151 overlapping therebetween.

A target region in this case is the overlap region 151, and reserved cells 181 to 190 are randomly placed in the overlap region 151 as the target region.

(c) Placement of Reserved Cells at Regular Intervals (Placement in Target Region)

Reserved cells may be placed in respective positions at regular intervals determined in a target region where TSVs are to be placed. In other words, respective placement positions of the reserved cells are determined in the target region such that a distance between a placement position of a first reserved cell and a placement position of a second reserved cell that is adjacent to the first reserved cell is equal to a distance between a placement position of the first reserved cell and a placement position of a third reserved cell that is adjacent to the first reserved cell. The reserved cells are placed in a matrix.

In the target region, a plurality of row lines are drawn parallel to one side of the target region so as to be at a distance L from each other, and a plurality of column lines are drawn perpendicular to the one side of the target region so as to be at the distance L from each other. Next, a reserved cell is placed in each of positions of intersection points of the row lines and the column lines.

Here, the row line closest to the one side is drawn at a distance of L/2 from the one side, for example. Also, the column line closest to another side orthogonal to the one side is drawn at a distance of L/2 from the other side. Note that these closest row line and column line are not limited to be drawn at a distance of L/2 from the one side and at a distance of L/2 from the other side, respectively. Alternatively, the closest row line and column line may be placed in respective positions designated by the user or respective fixed positions which have been determined beforehand, for example.

Here, the distance L, which is the placement interval between each two of the reserved cells, may be determined as follows.

In the target region, a unit area to be allocated to each reserved cell is calculated by the following formula.

unit area=[area of target region/the number of reserved cells to be placed]

Next, the distance L, which is the placement interval between each two of the reserved cells, may be calculated by the following formula.

distance L=[square root (unit area)]

By placing reserved cells in this manner, it is possible to place reserved cells at regular intervals in the target region by the approximately designated number of reserved cells to be placed.

In the phase of the initial design, it is difficult to predict a new placement position of any of the TSVs whose placement position in the target region will change after completion of the initial design. Accordingly, placement of the reserved cells at regular intervals in the target region increases the probability of appropriately selecting the new placement position of the any TSV among the respective placement positions at regular intervals of the reserved cells.

(Example of Placement in Block)

Reserved cells may be placed in respective positions at regular intervals determined in a block where TSVs are to be placed.

Figure 6:
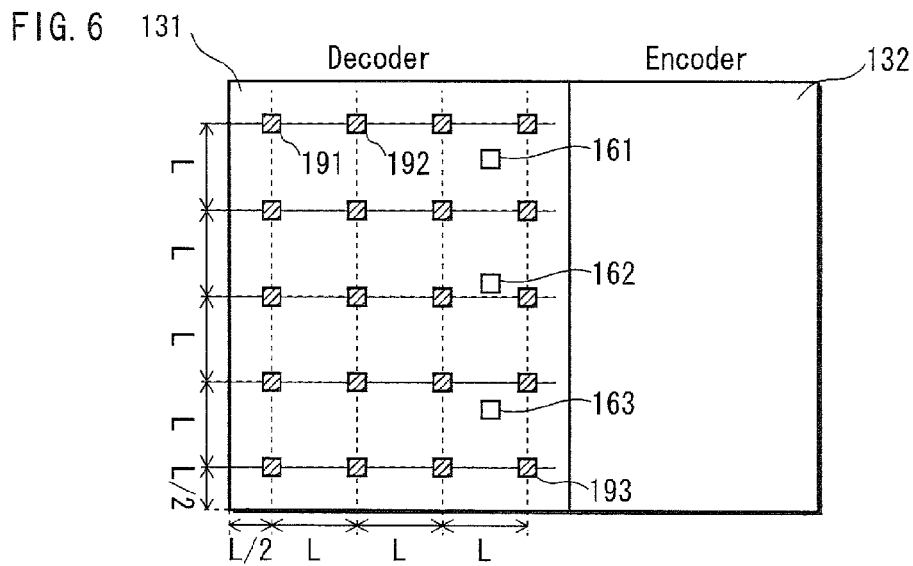
FIG. 6 is a plan conceptual view showing that a plurality of reserved cells are placed at regular intervals in the block 131 of the semiconductor chip 101a constituting the three-dimensional integrated circuit 100.

As shown in FIG. 6 as an example, in the block 131, the TSVs 161 to 163 are placed so as to each penetrate the block 131. A target region in this case is the block 131, and the reserved cells 191, 192, . . . , 193 are placed at regular intervals in the block 131 as the target region.

In other words, a plurality of row lines are drawn parallel to one side of the block 131 so as to be at the distance L from each other, and a plurality of column lines are drawn perpendicular to the one side of the block 131 so as to be at the distant L from each other. Next, a reserved cell is placed in each of positions of intersection points of the row lines and the column lines.

(Example of Placement of Reserved Cells in Overlap Region)

Also, reserved cells may be placed in respective positions at regular intervals determined in an overlap region overlapping between a block where TSVs are to be placed and a block to which the TSVs are to be connected.

Figure 7:
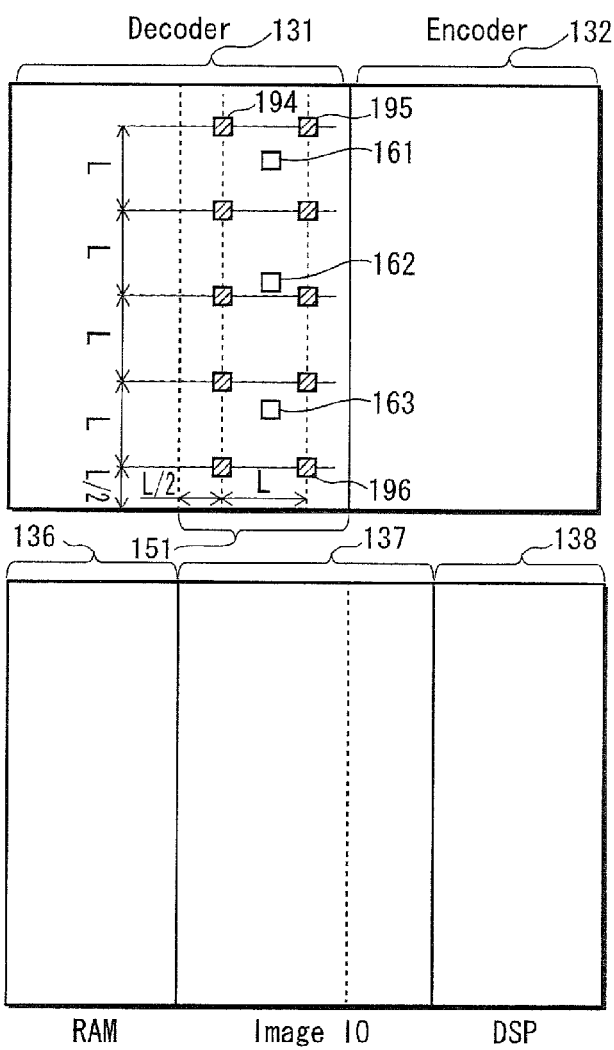
FIG. 7 is a plan conceptual view showing that a plurality of reserved cells are placed at regular intervals in the overlap region 151 overlapping between the block 131 of the semiconductor chip 101a and the block 137 of the semiconductor chip 101b constituting the three-dimensional integrated circuit 100.

As shown in FIG. 7 as an example, in the block 131 of the semiconductor chip 101a, the TSVs 161 to 163 are placed so as to each penetrate the block 131. The TSVs 161 to 163 are connected to the block 137 of the semiconductor chip 101b. The block 131 of the semiconductor chip 101a and the block 137 of the semiconductor chip 101b have the overlap region 151 overlapping therebetween.

A target region in this case is the overlap region 151, and the reserved cells 194, 195, . . . , 196 are placed at regular intervals in the overlap region 151 as the target region.

(d) Placement in Symmetrical Position (Axis Symmetrical Placement in Target Region)

Reserved cells may be placed in a target region where TSVs are to be placed such that respective placement positions of the reserved cells and respective placement positions of the TSVs are axis symmetrical with respect to the center line of the target region.

In the target region, the center line is defined so as to be parallel to two sides in the Y-axis direction of the target region and pass through the midpoint between the two sides. Alternatively, in the target region, the center line may be defined so as to be parallel to two sides in the X-axis direction of the target region and pass through the midpoint between the two sides.

Next, in the target region, one of the TSVs is selected, and a position is calculated such that the calculated position and a placement position of the selected TSV are axis symmetrical with respect to the center line of the target region. Then, a reserved cell is placed in the calculated position. The same applies to other TSVs to place respective reserved cells.

In the phase of the initial design, it is difficult to predict a new placement position of any of the TSVs whose placement position in the target region will change after completion of the initial design. Accordingly, respective placement positions of the reserved cells in the target region are determined such that the respective placement positions of the reserved cells and respective placement positions of the TSVs are axis symmetrical. This increases the probability of appropriately selecting the new placement position of the any TSV among the respective placement positions of the reserved cells.

(Example of Axis Symmetrical Placement in Block)

Reserved cells may be placed in a block where TSVs are to be placed such that respective placement positions of the reserved cells and respective placement positions of the TSVs are axis symmetrical with respect to the center line of the block.

Figure 8:
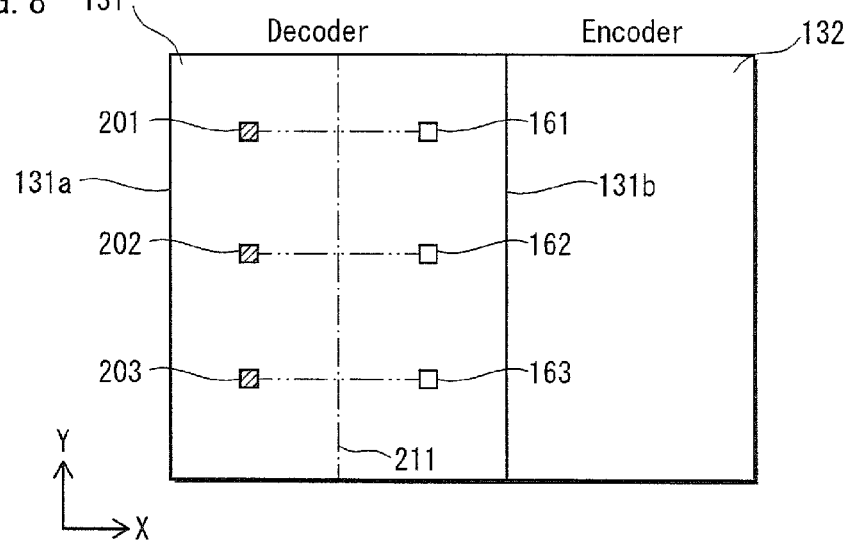
FIG. 8 is a plan conceptual view showing that a plurality of reserved cells are placed in the block 131 of the semiconductor chip 101a constituting the three-dimensional integrated circuit 100, such that respective placement positions of the reserved cells and respective placement positions of a plurality of TSVs in the block 131 are axis symmetrical with respect to a center line 211 of the block 131.

As shown in FIG. 8 as an example, in the block 131, the TSVs 161 to 163 are placed so as to each penetrate the block 131. A target region in this case is the block 131, and reserved cells 201, 202, and 203 are placed in the block 131 as the target region.

In the block 131, a center line 211 is defined so as to be parallel to two sides 131a and 131b in the Y-axis direction of the block 131 and pass through the midpoint between the sides 131a and 131b.

Next, the TSV 161 is selected, and a position is calculated such that the calculated position and a placement position of the TSV 161 are axis symmetrical with respect to the center line 211. Then, the reserved cell 201 is placed in the calculated position. The same applies to the TSVs 162 and 163 to place the reserved cells 202 and 203, respectively.

(Example of Axis Symmetrical Placement in Overlap Region)

Also, reserved cells may be placed in an overlap region overlapping between a block where TSVs are to be placed and a block to which the TSVs are to be connected, such that respective placement positions of the reserved cells and respective placement positions of the TSVs are axis symmetrical with respect to the center line of the overlap region.

Figure 9:
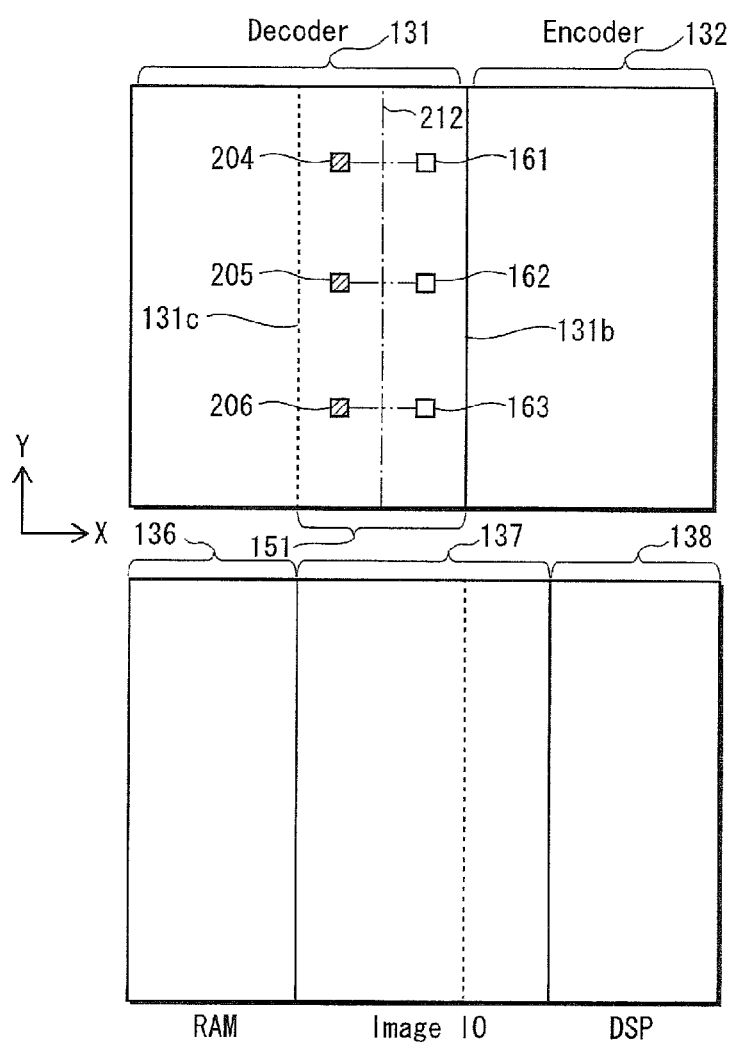
FIG. 9 is a plan conceptual view showing that a plurality of reserved cells are placed in the overlap region 151 overlapping between the block 131 of the semiconductor chip 101a and the block 137 of the semiconductor chip 101b constituting the three-dimensional integrated circuit 100, such that respective placement positions of the reserved cells and respective placement positions of a plurality of TSVs in the overlap region 151 are axis symmetrical with respect to a center line 212 of the overlap region 151.

As shown in FIG. 9 as an example, in the block 131 of the semiconductor chip 101a, the TSVs 161 to 163 are placed so as to each penetrate the block 131. The TSVs 161 to 163 are connected to the block 137 of the semiconductor chip 101b. The block 131 of the semiconductor chip 101a and the block 137 of the semiconductor chip 101b have the overlap region 151 overlapping therebetween.

A target region in this case is the overlap region 151, and reserved cells 204, 205, and 206 are placed in the overlap region 151 as the target region.

In the overlap region 151A, the center line 212 is defined so as to be parallel to two sides 131b and 131c in the Y-axis direction of the overlap region 151 and pass through the midpoint between the sides 131b and 131c.

Next, the TSV 161 is selected, and a position is calculated such that the calculated position and a placement position of the TSV 161 are axis symmetrical with respect to the center line 212. Then, the reserved cell 204 is placed in the calculated position. The same applies to the TSVs 162 and 163 to place the reserved cells 205 and 206, respectively.

(Axis Symmetrical Placement in Target Region)

Reserved cells may be placed in a target region where TSVs are to be placed such that respective placement positions of the reserved cells and respective placement positions of the TSVs are point symmetrical with respect to the center point of the target region.

In the target region, a center point 215 is defined so as to be an intersection point of two diagonal lines of the target region.

Next, in the target region, one of the TSVs is selected, and a position is calculated such that the calculated position and a placement position of the selected TSV are point symmetrical with respect to the center point of the target region. Then, a reserved cell is placed in the calculated position. The same applies to other TSVs to place respective reserved cells.

In the phase of the initial design, it is difficult to predict a new placement position of any of the TSVs whose placement position in the target region will change after completion of the initial design. Accordingly, respective placement positions of the reserved cells in the target region are determined such that the respective placement positions of the reserved cells and respective placement positions of the TSVs are point symmetrical. This increases the probability of appropriately selecting the new placement position of the any TSV among the respective placement positions of the reserved cells.

(Example of Point Symmetrical Placement in Block)

Also, reserved cells may be placed in a block where TSVs are to be placed such that respective placement positions of the reserved cells and respective placement positions of the TSVs are point symmetrical with respect to the center point of the block.

Figure 10:
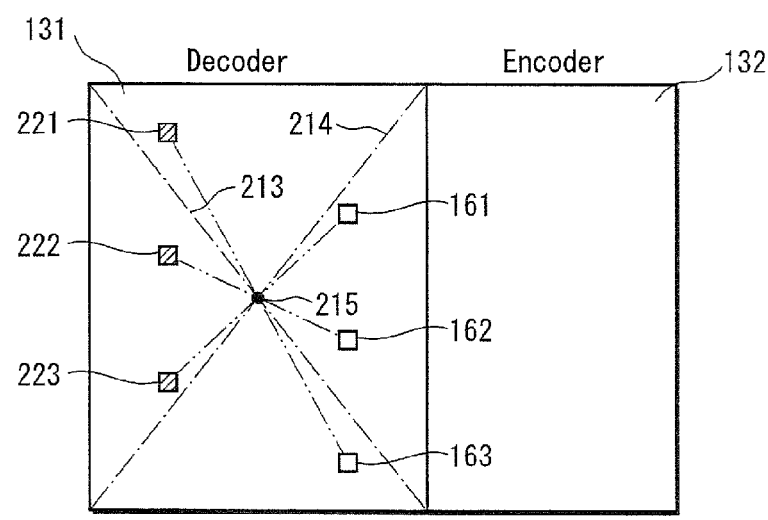
FIG. 10 is a plan conceptual view showing that a plurality of reserved cells are placed in the block 131 of the semiconductor chip 101a constituting the three-dimensional integrated circuit 100, such that respective placement positions of the reserved cells and respective placement positions of a plurality of TSVs in the block 131 are point symmetrical with respect to a center point 215 of the block 131.

As shown in FIG. 10 as an example, in the block 131, the TSVs 161 to 163 are placed so as to each penetrate the block 131. A target region in this case is the block 131, and reserved cells 221, 222, and 223 are placed in the block 131 as the target region.

In the block 131, a center point 215 is defined so as to be an intersection point of two diagonal lines 213 and 214 of the block 131.

Next, the TSV 161 is selected, and a position is calculated such that the calculated position and a placement position of the TSV 161 are point symmetrical with respect to the center point 215 of the block 131. Then, the reserved cell 223 is placed in the calculated position. The same applies to the TSVs 162 and 163 to place the reserved cells 222 and 221, respectively.

(Example of Point Symmetrical Placement in Overlap Region)

Also, reserved cells may be placed in an overlap region overlapping between a block where TSVs are to be placed and a block to which the TSVs are to be connected, such that respective placement positions of the reserved cells and respective placement positions of the TSVs are point symmetrical with respect to the center point of the overlap region.

Figure 11:
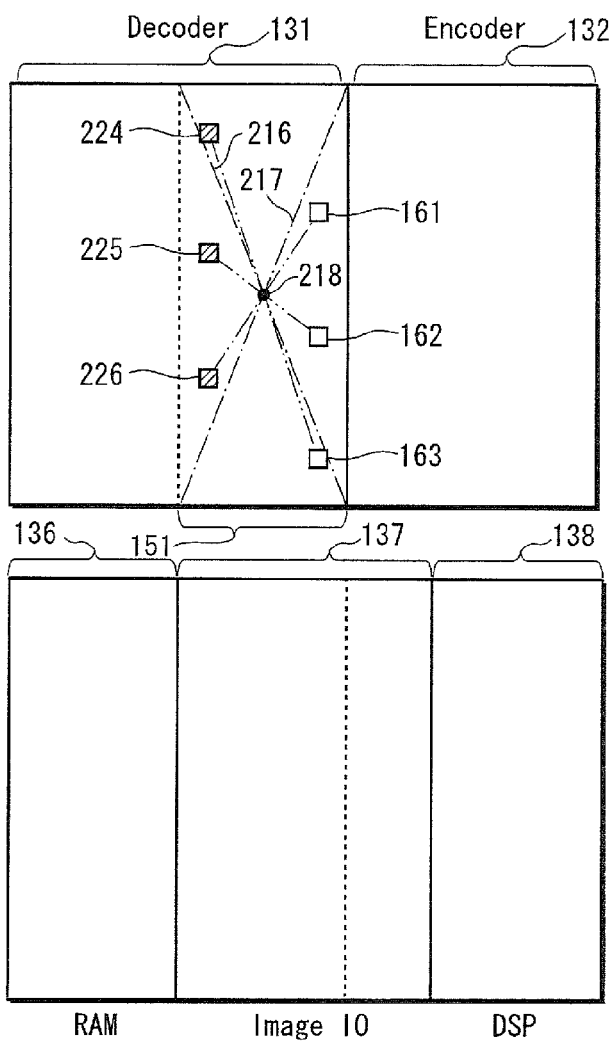
FIG. 11 is a plan conceptual view showing that a plurality of reserved cells are placed in the overlap region 151 overlapping between the block 131 of the semiconductor chip 101a and the block 137 of the semiconductor chip 101b constituting the three-dimensional integrated circuit 100, such that respective placement positions of the reserved cells and respective placement positions of a plurality of TSVs in the overlap region 151 are point symmetrical with respect to a center point 218 of the overlap region 151.

As shown in FIG. 11 as an example, in the block 131 of the semiconductor chip 101a, the TSVs 161 to 163 are placed so as to each penetrate the block 131. The TSVs 161 to 163 are connected to the block 137 of the semiconductor chip 101b. The block 131 of the semiconductor chip 101a and the block 137 of the semiconductor chip 101b have the overlap region 151 overlapping therebetween.

A target region in this case is the overlap region 151, and reserved cells 224, 225, and 226 are placed in the overlap region 151 as the target region.

In the overlap region 151, a center point 218 is defined so as to be an intersection point of two diagonal lines 216 and 217 of the overlap region 151.

Next, the TSV 161 is selected, and a position is calculated such that the calculated position and a placement position of the TSV 161 are point symmetrical with respect to the center point 218 of the overlap region 151. Then, the reserved cell 226 is placed in the calculated position. The same applies to the TSVs 162 and 163 so as to place the reserved cells 225 and 224, respectively.

(e) Placement of Reserved Cells in Respective Positions at Equal Distance from TSV (Placement in Target Region)

Reserved cells may be placed in a target region where TSVs are to be placed such that respective placement positions of the reserved cells are equally distant from a placement position of one TSV.

Firstly, the number of TSVs to be placed in the target region is calculated. Then, the placement number N is calculated by the following formula, which represents the number of reserved cells to be placed for each TSV.

the placement number $N$=[the number of reserved cells to be placed/the number of TSVs to be placed]

Next, a distance M is obtained, which is a distance between the placement position of the TSV and the placement position of each of the reserved cells, as a value designated by the user. The method of determining the distance M is not limited to this, and the distance M may be calculated by the following formula.

distance $M$=[constant/operating speed of circuit provided in block]

This formula makes use of the inverse proportion between the distance M and the operating speed of the circuit provided in the block. Here, the constant is an experimentally determined value.

Reserved cells are placed in the target region for each TSV by the calculated placement number N. The N reserved cells are placed in the following manner.

One of the TSVs is selected, and a regular N-polygon is drawn, whose center point coincides with a placement position of the selected TSV and is at the distance M from each vertex. Here, for example, the Y-coordinate of a position of one vertex of the regular N-polygon is defined so as to coincide with the Y-coordinate of the placement position of the selected TSV. This enables to uniquely define other vertexes of the regular N-polygon. Next, N reserved cells are placed in respective positions of N vertexes of the regular N-polygon.

The method of placing reserved cells is not limited to this. Alternatively, not a regular N-polygon but an N-polygon may be drawn, whose center point coincides with the placement position of the selected TSV, and the N reserved cells may be placed in respective positions of N vertexes of the N-polygon. Further alternatively, a circle having a diameter of the distance M may be drawn, whose center point coincides with the placement position of the selected TSV, and the N reserved cells may be placed randomly on the circumference of the drawn circle.

Furthermore, judgment is made as to whether each of the respective placement positions of the reserved cells determined as described above is inside or outside the target region. When the placement position of the reserved cell is outside the target region, the placement position of the reserved cell is moved inward by the width of the reserved cell. Then, the similar judgment is further performed, and when the placement position is still outside the target region, the placement position of the reserved cell is moved further inward by the width of the reserved cell. In this way, the judgment and movement are repeatedly performed until the reserved cell is placed inside the target region.

The same applies to each of other TSVs to be placed in the target region to place reserved cells.

After N reserved cells are determined to be placed for each of all the TSVs in this way, the total number of the reserved cells to be placed in the target region sometimes exceeds the number of reserved cells which has been initially calculated. In such a case, it may be unnecessary to change the total number of the reserved cells to be placed, assuming that substantially the same number of reserved cells are to be placed as the initially calculated number of reserved cells. Alternatively, placement of reserved cells may be cancelled by the number exceeding the initially calculated number.

In the phase of the initial design, it is difficult to predict a new placement position of any of the TSVs whose placement position in the target region will change after completion of the initial design. Accordingly, respective placement positions of the reserved cells in the target region are determined such that a plurality of reserved cells are placed in respective positions at an equal distance from a placement position of each of the TSVs. This increases the probability of appropriately selecting the new placement position of the any TSV among the respective placement positions of the reserved cells.

(Example of Placement in Block)

Figure 12:
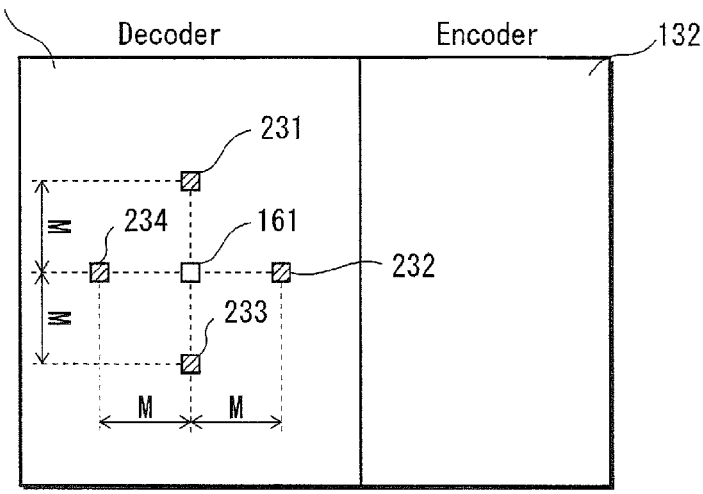
FIG. 12 is a plan conceptual view showing that a plurality of reserved cells are placed in the block 131 of the semiconductor chip 101a constituting the three-dimensional integrated circuit 100, such that the reserved cells are placed in respective positions at an equal distance from a placement position of a TSV 161 in the block 131 as a center point.

As shown in FIG. 12 as an example, in the block 131, the TSV 161 is placed so as to penetrate the block 131. A target region in this case is the block 131. In the block 131 as the target region, reserved cells 231, 232, 233, and 234 are placed in respective positions of vertexes of a square whose center point coincides with a placement position of the TSV 161 and is at the distance M from each vertex.

(Example of Placement in Overlap Region)

Reserved cells may be placed in an overlap region overlapping between a block where TSVs are to be placed and a block to which the TSVs are to be connected.

Figure 13:
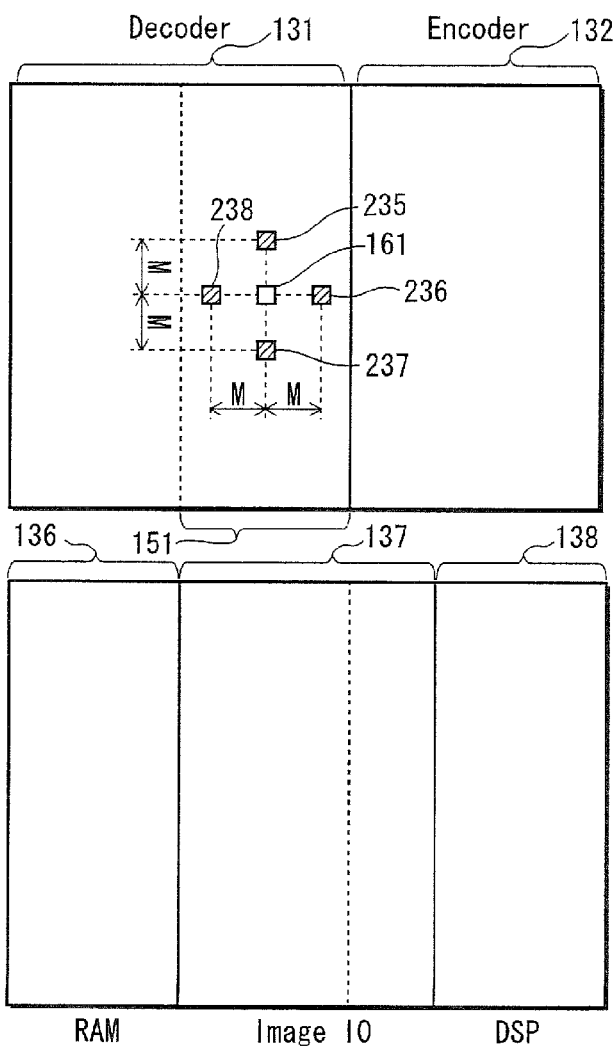
FIG. 13 is a plan conceptual view showing that reserved cells are placed in the overlap region 151 overlapping between the block 131 of the semiconductor chip 101a and the block 137 of the semiconductor chip 101b constituting the three-dimensional integrated circuit 100, such that the reserved cells are placed in respective positions at an equal distance from a placement position of the TSV 161 in the overlap region 151 as a center point.

As shown in FIG. 13 as an example, in the block 131 of the semiconductor chip 101a, the TSV 161 is placed so as to penetrate the block 131. The TSV 161 is connected to the block 137 of the semiconductor chip 101b. The block 131 of the semiconductor chip 101a and the block 137 of the semiconductor chip 101b have the overlap region 151 overlapping therebetween.

A target region in this case is the overlap region 151. In the overlap region 151 as the target region, reserved cells 235, 236, 237, and 238 are placed in respective positions of vertexes of a square whose center point coincides with a placement position of the TSV 161 and is at the distance M from each vertex.

(f) Placement of Reserved Cell for Each Group to which TSV Belongs (Placement in Target Region)

In a target region where TSVs are to be placed, reserved cells may be placed for a plurality of TSVs belonging to the same group, as described below. In other words, the TSVs to be placed in the target region are classified into one or more groups, a placement position of each of the reserved cells is determined based on respective placement positions of one or more TSVs belonging to each of the groups. Here, the TSVs are classified such that TSV placed adjacent to each other belong to the same group. Furthermore, the center position of the respective placement positions of the TSVs belonging to the same group is determined as the placement position of the reserved cell.

Firstly, a plurality of TSVs to be placed in the target region are classified into one or more groups. The TSVs are classified into the groups in the following manner.

A grouping distance G is obtained as a value designated by the user.

One of the TSVs that have not yet been classified into any group is selected, and the selected TSV is classified into a first group. Next, all the TSVs, which are to be placed at the distance G or less from a placement position of the selected TSV, are selected, and all the selected TSVs are classified into the first group.

Next, another one of the TSVs that have not yet been classified into any group is selected, and the selected TSV is classified into a second group. Next, all the TSVs, which are to be placed at the distance G or less from a placement position of the selected TSV, are selected, and all the selected TSVs are classified into the second group.

The same processing is performed until all the remaining TSVs are classified into any group.

The method of classifying all the TSVs to be placed in the target region into groups is not limited to this. Alternatively, the following method may be possible. For example, in the target region, an arbitrary point is selected, all the TSVs to be placed at the distance G or less from the arbitrary point are selected, and all the selected TSVs are classified into one group. Next, another arbitrary point of the target region is selected, and the same processing is performed to generate one group. The same processing is performed until all the remaining TSVs are classified into any group.

In this way, all the TSVs to be placed in the target region are classified into one or more groups.

Then, with respect to each of the groups, respective placement positions of all the TSVs belonging to each group are calculated. Based on the respective calculated placement positions of all the TSVs, one position is calculated for the group, and a reserved cell is placed in the calculated position.

As an example, the following may be employed. A polygon is virtually drawn whose vertexes coincide with the respective calculated placement positions of all the TSVs, one point of the polygon is determined, and a reserved cell is placed in a position of the determined point. Here, a position of the center of gravity of the polygon may be calculated as the position of the point, and the reserved cell may be placed in the calculated position of the center of gravity. Alternatively, two diagonal lines each connecting two vertexes of the polygon may be arbitrary selected, a position of an intersection point of the two diagonal lines may be calculated, and the reserved cell may be placed in the position of the intersection point. Further alternatively, the one point may be determined such that the sum of a distance between the one point and each of all the vertexes of the polygon is the minimum.

In the phase of the initial design, it is difficult to predict a new placement position of any of the TSVs whose placement position in the target region will change after completion of the initial design. Accordingly, respective placement positions of the reserved cells in the target region are determined such that one reserved cell is placed with respect to TSVs that are placed adjacent to each other and belong to a same group. This increases the probability of appropriately selecting the new placement position of the any TSV among the respective placement positions of the reserved cells.

(Example of Placement in Block)

Figure 14:
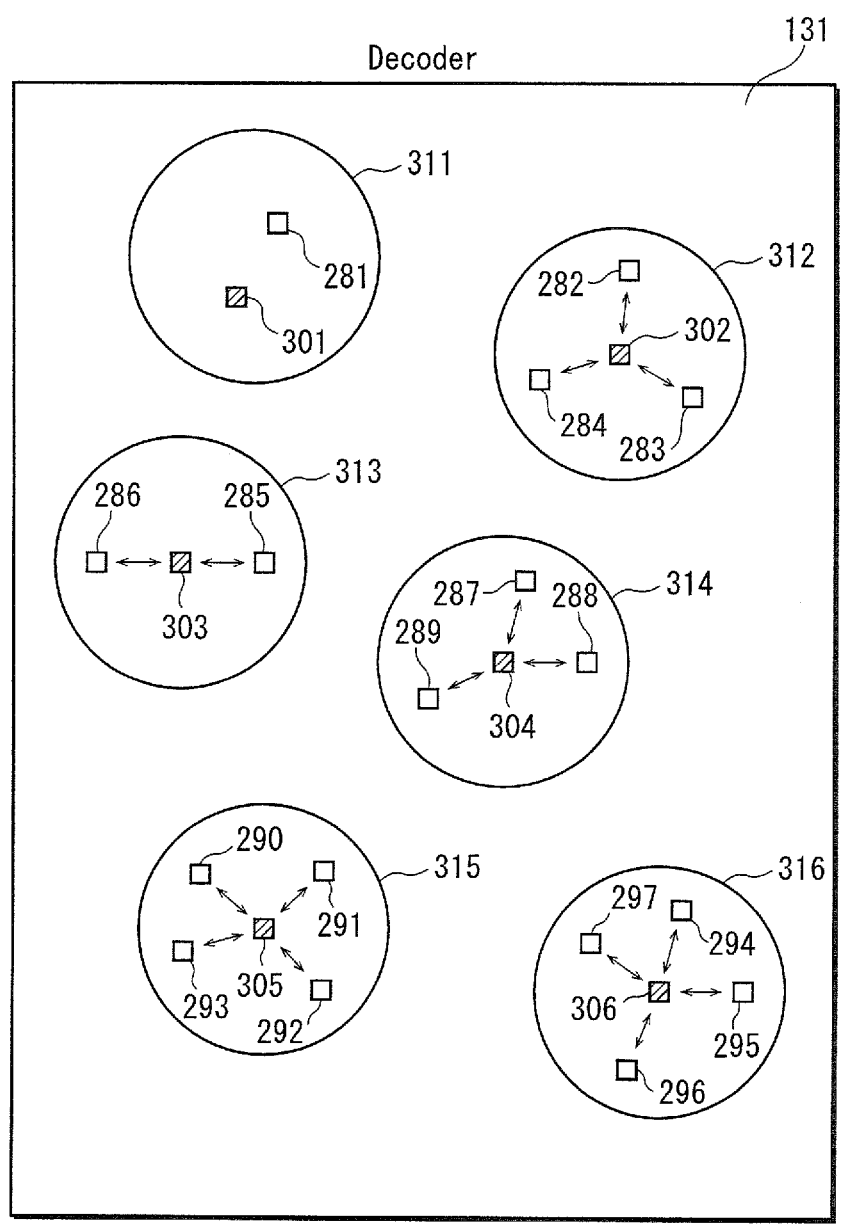
FIG. 14 is a plan conceptual view showing that reserved cells are placed in the block 131 of the semiconductor chip 101a constituting the three-dimensional integrated circuit 100, such that one reserved cell is placed in a position of the center of gravity of a polygon whose vertexes coincide with respective placement positions of TSVs belonging to each of a plurality of groups into which TSVs placed in the block 131 are classified.

As shown in FIG. 14 as an example, in the block 131, TSVs 281 to 297 are placed so as to each penetrate the block 131. A target region in this case is the block 131.

As shown in FIG. 14, a TSV 281, TSVs 282 to 284, TSVs 285 to 286, TSVs 287 to 289, TSVs 290 to 293, and TSVs 294 to 297 are classified into a group 311, a group 312, a group 313, a group 314, a group 315, and a group 316, respectively.

A reserved cell 301 is placed with respect to the group 311. The group 311 includes only one TSV, namely only the TSV 281, and accordingly it is impossible to apply the method of drawing a polygon whose vertexes coincide with respective placement positions of all the TSVs belonging to the group. The same applies to a case where two TSVs belong to the group (see the group 313 shown in FIG. 14). In such a case, with respect to the group 311 for example, a reserved cell is placed at the distance G or less from the TSV 281. Furthermore, with respect to the group 313, a reserved cell is placed in a position equally distant from the two TSVs 285 and 286.

The reserved cells 302, 303, 304, 305, and 306 are placed with respect to the groups 312, 313, 314, 315, and 316, respectively.

With respect to the group 312, the placement position of the reserved cell 302 is inside a polygon whose respective vertexes coincide with respective placement positions of the TSVs 282, 283, and 284. With respect to each of the groups 313, 314, 315, and 316, a reserved cell is placed inside a polygon whose vertexes coincide with respective placement positions of a plurality of TSVs, in the same way.

(Placement in Overlap Region)

As well as placement in the block, reserved cells may be placed in an overlap region overlapping between a block where TSVs are to be placed and a block to which the TSVs are to be connected.

1.4 Example of Before and after Placement of TSV

Figure 15:
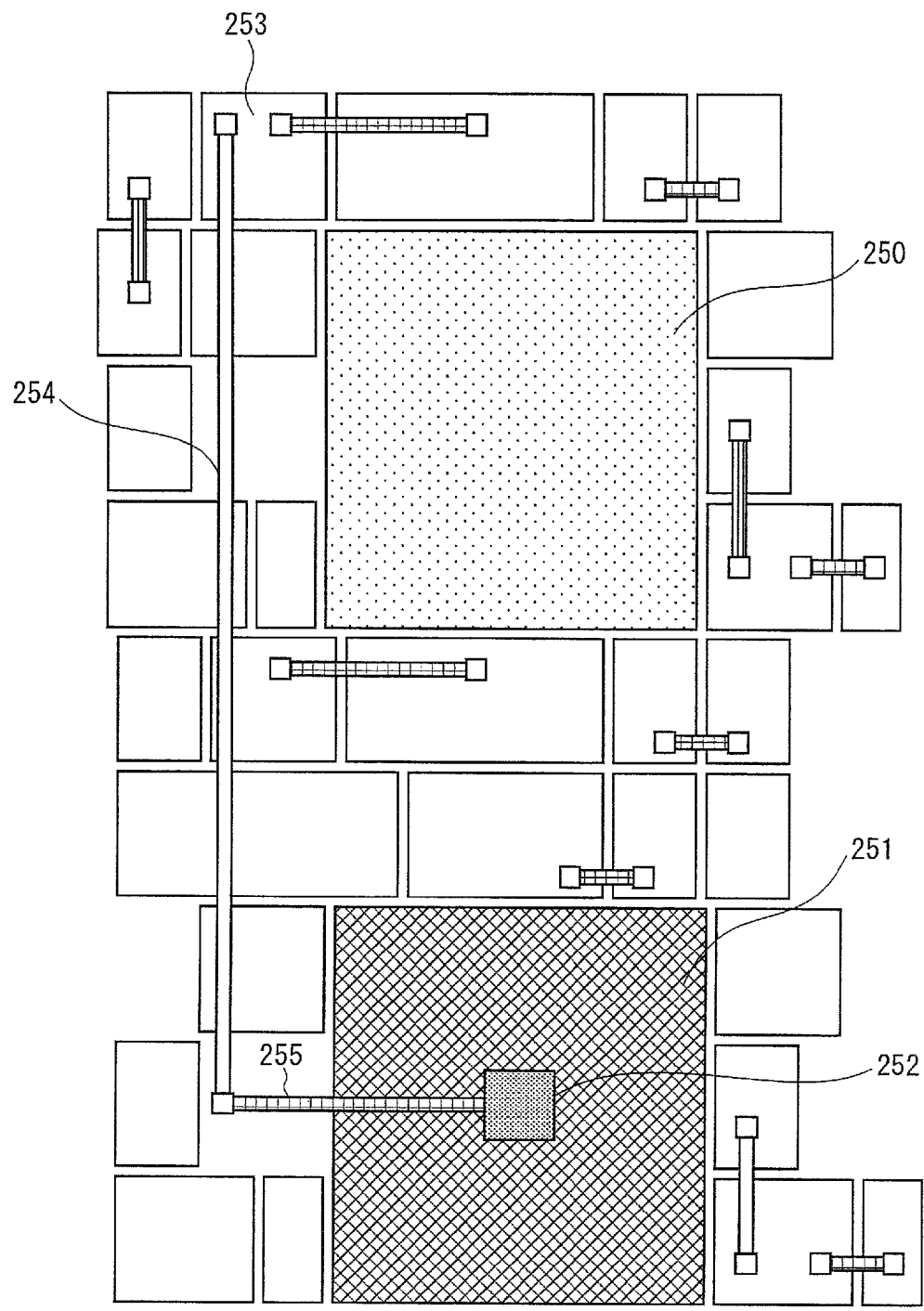
FIG. 15 is a plan conceptual view partially enlarging a block of a semiconductor chip constituting the three-dimensional integrated circuit 100 where a TSV 252, a placement prohibition region 251, and a reserved cell 250 are placed.

FIG. 15 is a plan conceptual view partially enlarging a block of a semiconductor chip constituting a three-dimensional integrated circuit designed with use of the design support device 400.

As shown in FIG. 15, in the block, a TSV 252, a placement prohibition region 251, a reserved cell 250, a standard cell 253, wirings 254 and 255, other cells, and other wirings are placed. Note that the TSV 252, the placement prohibition region 251, and the reserved cell 250 are each placed as a macro cell.

The TSV 252 is connected to the standard cell 253 through the wirings 254 and 255. Other cells are connected to the standard cell 253 through vias and wirings placed extensively.

Here, the reserved cell 250 has a volume equal to the sum of a volume of the TSV 252 and a volume of the placement prohibition region 251. The entire three-dimensional region where the reserved cell 250 is to be placed is a prohibition region (blockage) where cell placement and routing are prohibited, and is used as a functional cell for reserving a region for placing TSVs. Placement of TSVs exerts an influence on to the transistor layer, and accordingly this blockage is placed such that cells are prohibited from being placed in addition to wirings. The reserved cell 250 is placed after place-and-route completes. As a result, even in the case where a placement location of a TSV is changed, there needs no move of any cell for newly reserving an area for placing the TSV. It is possible to use the region where the reserved cell 250 is placed, as a region where the TSV is to be placed and a placement prohibition region.

The placement position of the TSV needs to be moved in the case where, for example in FIG. 15, strict timing constraints are imposed on a cell at the final stage of a logic to the TSV 252, and the cell at the final stage of the logic needs to be moved by constraints imposed on the cell and another cell. In this case, the placement position of the TSV needs to be moved toward the cell at the final stage (upward in FIG. 15).

Also, the placement position of the TSV needs to be moved in the case where wiring congestion occurs in a semiconductor chip that is a target for bonding, and this requires move of the placement position of the TSV to a position where the routing density is low. In this case, a first semiconductor chip needs to coincide in placement position of the TSV with a second semiconductor chip onto which the first semiconductor chip is to be bonded. Accordingly, the TSV needs to be moved even if the timing constraints are satisfied in the first semiconductor chip.

Figure 16:
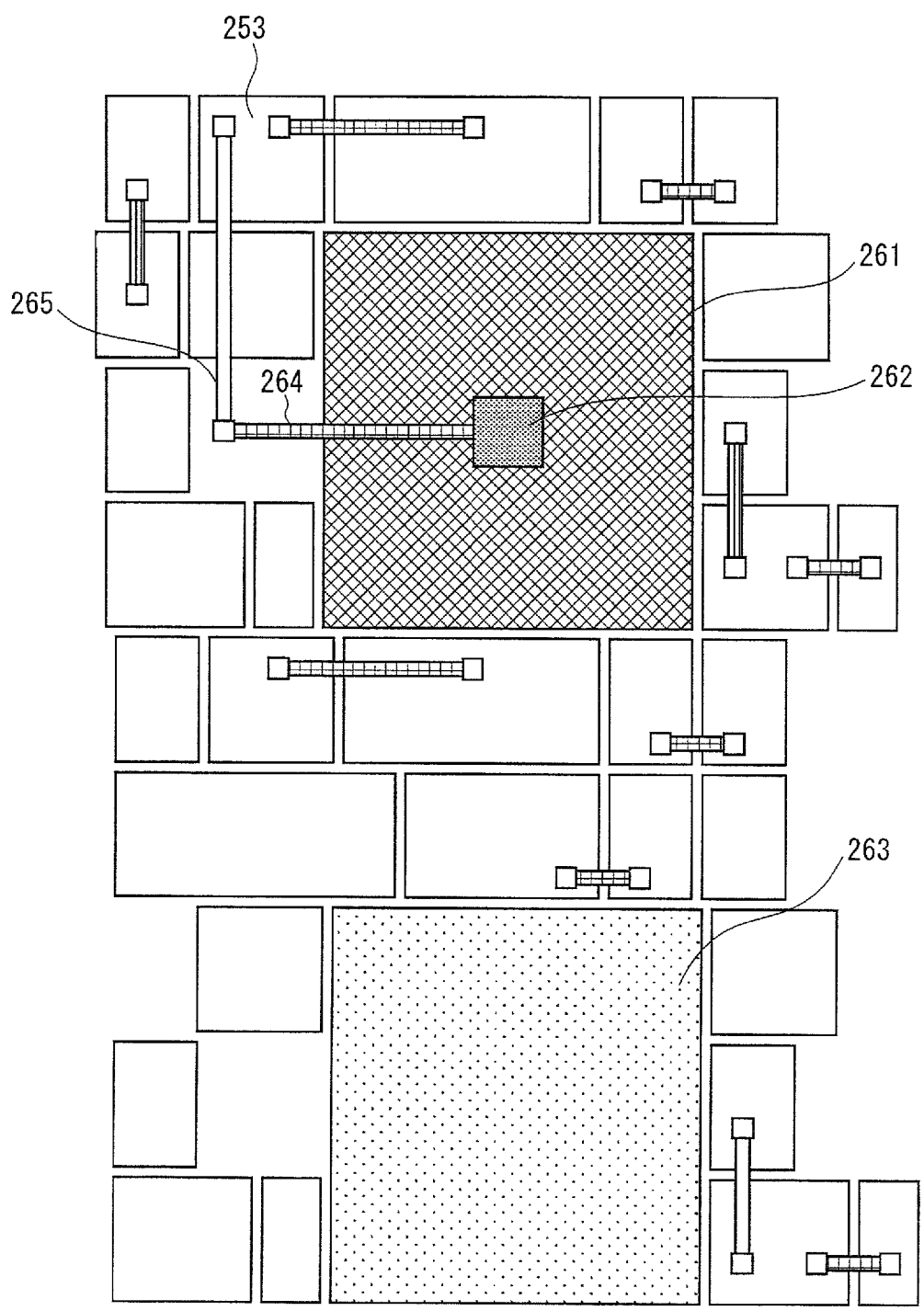
FIG. 16 is a plan conceptual view partially enlarging the block of the semiconductor chip constituting the three-dimensional integrated circuit 100 where a TSV 262, a placement prohibition region 261, and a spare region 263 are placed in a region that corresponds to the region where the TSV 252 and the placement prohibition region 251 are placed in a position that corresponds to the placement position of the reserved cell 250 in the plan conceptual view shown in FIG. 15.

Next, FIG. 16 is a plan conceptual view partially enlarging the block of the semiconductor chip after the placement position of the TSV 252 has been moved. After the placement position of the TSV 252 has been moved, in the block as shown in FIG. 16, the TSV 262 and the placement prohibition region 261 are now placed in the position where the reserved cell 250 has been placed, and the standard cell 253 and the TSV 262 are connected to each other through wirings 264 and 265 instead of the wirings 254 and 255. Also, the positions where the TSV 252 and the placement prohibition region 251 have been placed is now replaced with a placement position of a spare region 263.

As shown in FIG. 16, the placement position of the TSV is moved by replacing the reserved cell with the TSV and the placement prohibition region. In this way, it is possible to move the placement position of the TSV by only replacing with the TSV and the placement prohibition region and correcting the wirings.

After the move of the placement position of the TSV completes and all the processes for designing the mask layout complete, in other words, when the respective placement positions of all the TSVs are finally confirmed, the positions where the TSVs and the placement prohibition regions have been initially placed are treated as a spare region. In order to make efficient use of the spare region, a repair cell or a thermal-via can be placed in the spare region. Alternatively, the spare region may be remained as a free region.

Furthermore, in the case where the placement position of the reserved cell is not used as a placement position to which the TSV is to be moved, a repair cell or a thermal-via may be placed in the placement position of the reserved cell. Alternatively, such a reserved cell may be remained without being used.

Figure 17:
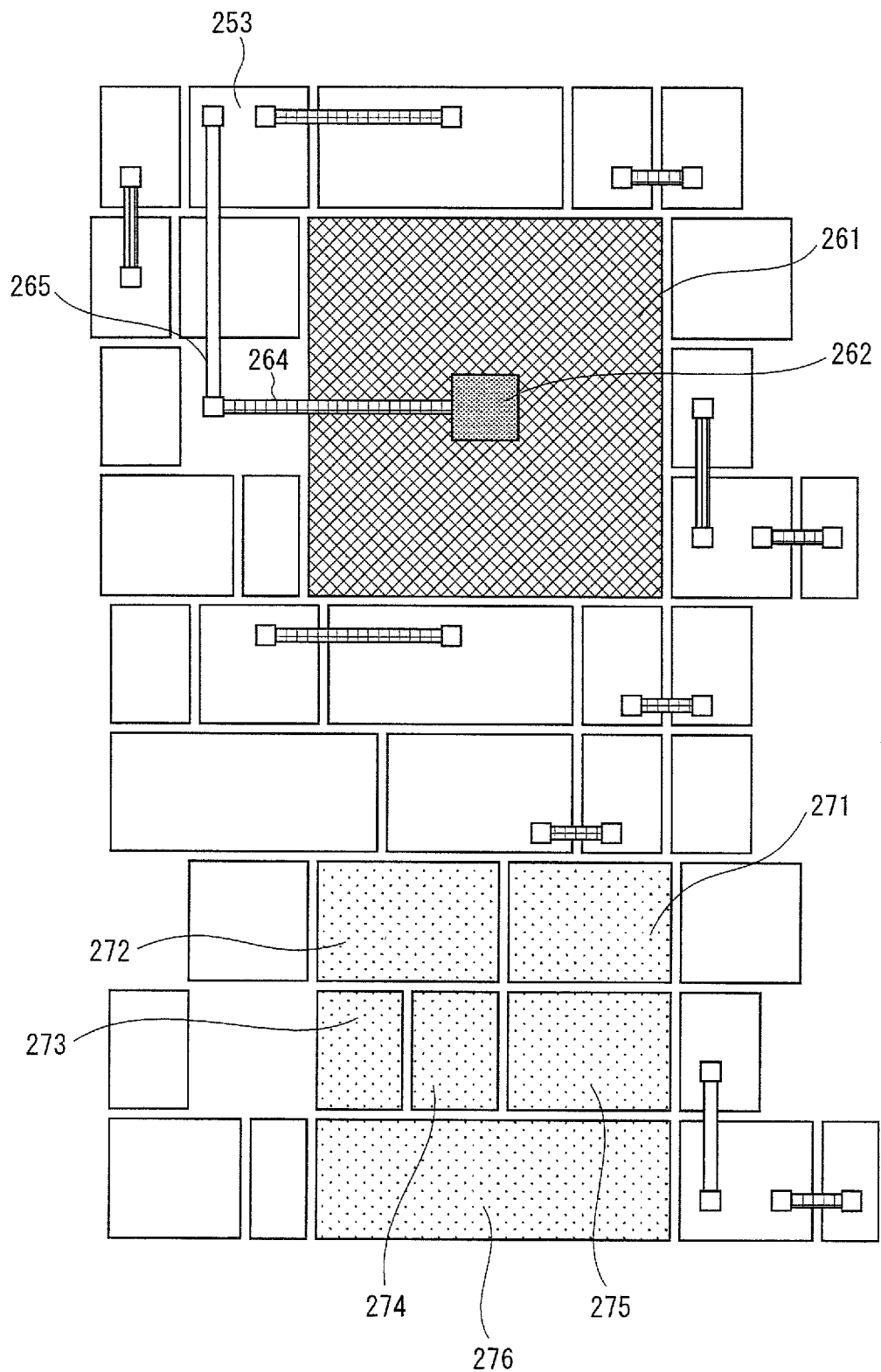
FIG. 17 is a plan conceptual view partially enlarging the block of the semiconductor chip constituting the three-dimensional integrated circuit 100 where repair cells 271 to 276 are placed in a position that corresponds to the placement position of the spare region 263 in the plan conceptual view shown in FIG. 16.

In FIG. 17, repair cells 271 to 276 are placed in a region, which corresponds to the spare region 263 shown in FIG. 16. The repair cells are each a reserved cell for use in correcting an error in the logic design by ECO (Engineering Change Order). The repair cells are each an AND cell, an INV cell, or the like. In the case where logic correction needs to be performed due to an error after mask layout, repair cells having necessary logic are selected, and the selected repair cells are routed. This realizes correction logic. Necessary standard cells have been already placed as repair cells in the mask layout under the transistor layer, and accordingly it is possible to limit a range that needs to be corrected to the wiring layers. This exhibits advantages such as reduction of correction period of the mask layout and cost-reduction of correction mask.

Figure 18:
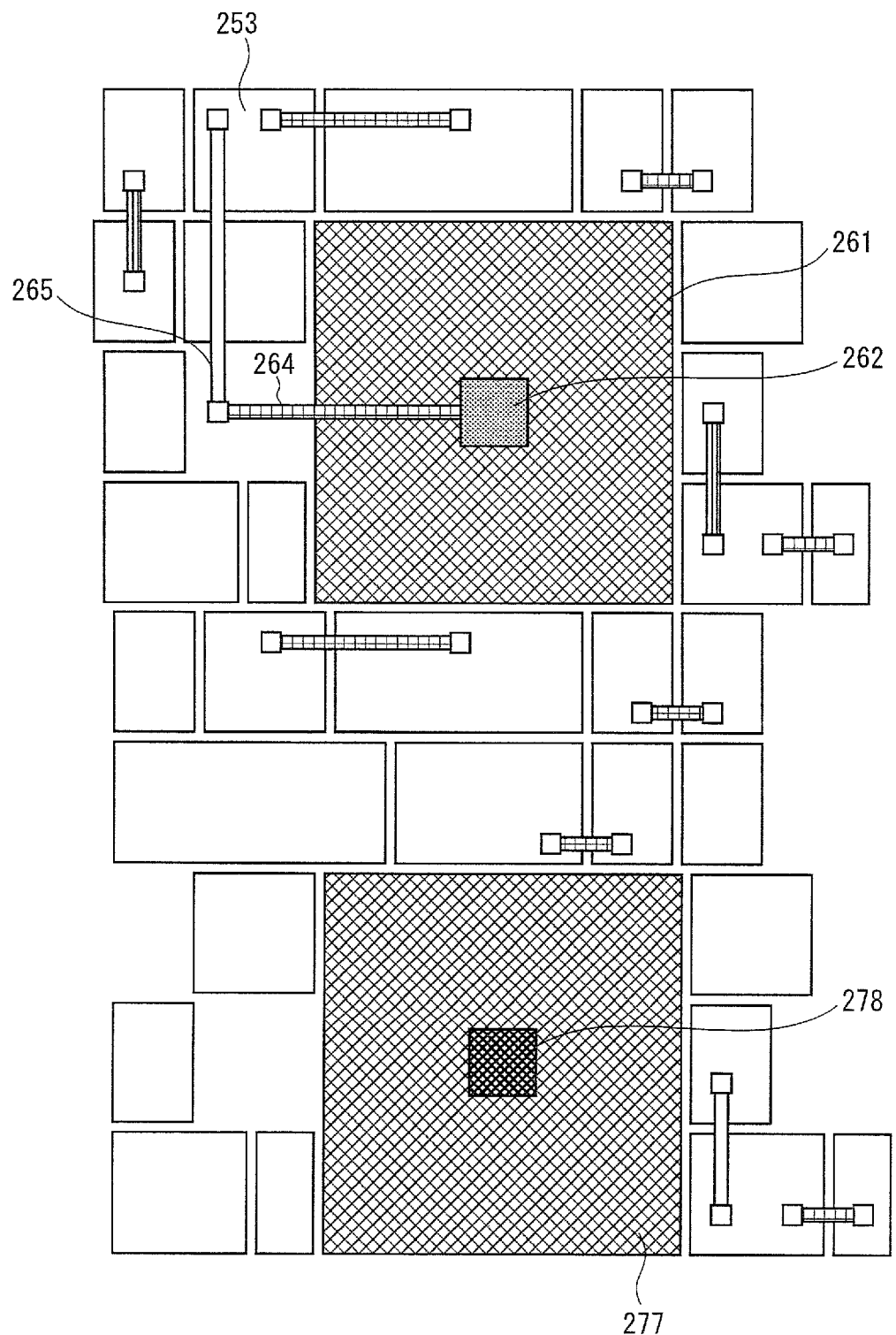
FIG. 18 is a plan conceptual view partially enlarging the block of the semiconductor chip constituting the three-dimensional integrated circuit 100 where a thermal-via 278 and a placement prohibition region 277 are placed in a region that corresponds to the spare region 263 in the plan conceptual view shown in FIG. 16.

Also, in FIG. 18, a placement prohibition region 277 is placed in and around a thermal-via 278, which corresponds to the spare region 263 shown in FIG. 16. The thermal-via is a via for connecting between semiconductor chips to conduct heat between the semiconductor chips. The thermal-via is formed from metal such as copper. Metal for the thermal-via such as copper used has a higher thermal conductivity than silicon, and accordingly easily conduct heat between semiconductor chips. Especially according to a device having the chip-stacked structure such as a three-dimensional integrated circuit, heat tends to remain within the device. Accordingly, it is important to take measures for heat dissipation such as provision of a thermal-via.

1.5 Mechanism of Design Support Device 400

Figure 19:
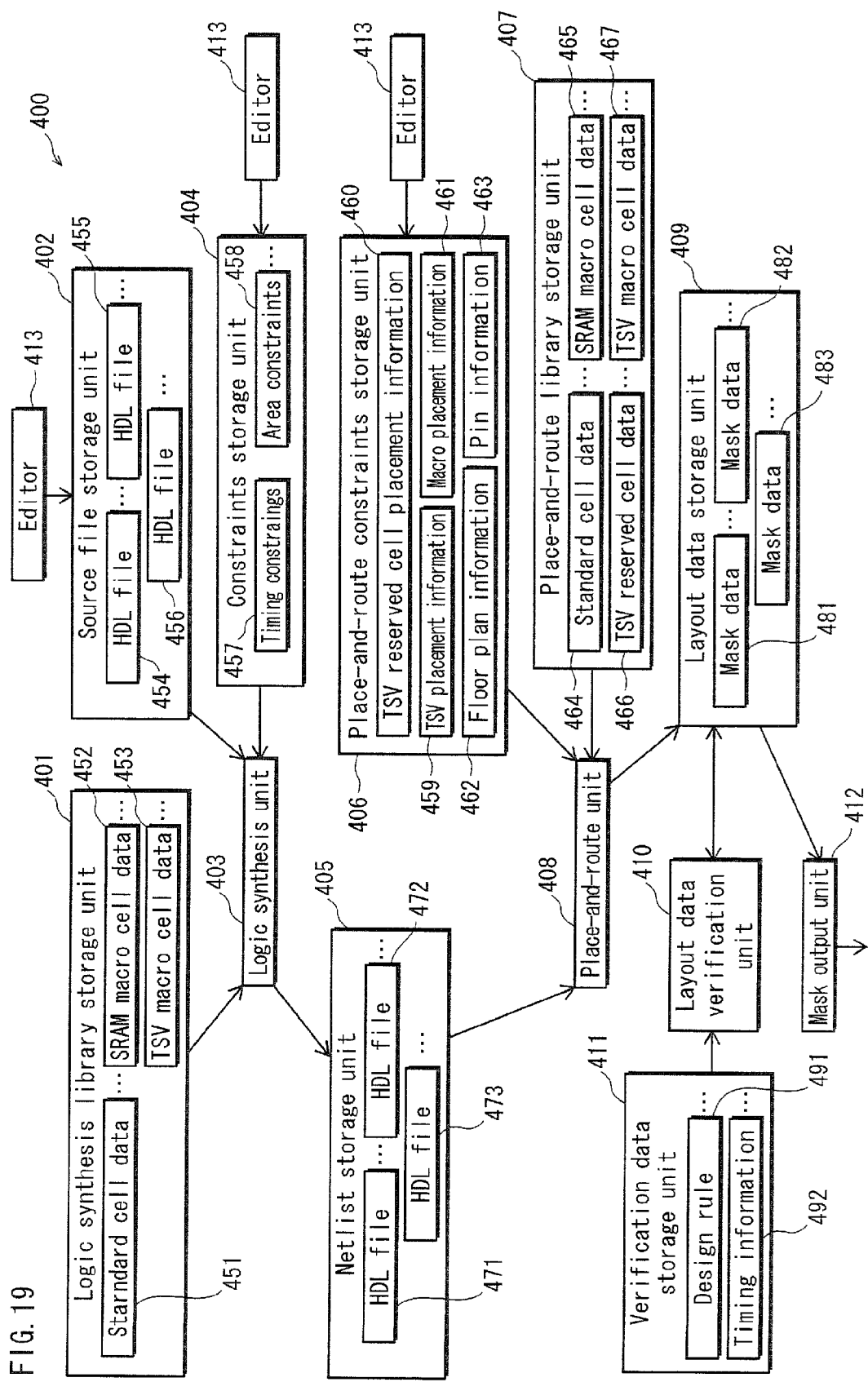
FIG. 19 is a block diagram showing the structure of a design support device 400.

The design support device 400 includes, as shown in FIG. 19, a logic synthesis library storage unit 401, a source file storage unit 402, a logic synthesis unit 403, a constraints storage unit 404, a netlist storage unit 405, a place-and-route constraints storage unit 406, a place-and-route library storage unit 407, a place-and-route unit 408, a layout data storage unit 409, a layout data verification unit 410, a verification data storage unit 411, a mask output unit 412, and an editor 413.

The design support device 400 is specifically a computer system that is composed of a microprocessor, a ROM, a RAM, a hard disk unit, a display unit, a keyboard, a mouse, and so on. The RAM or the hard disk unit stores therein a computer program for control. The logic synthesis unit 403, the place-and-route unit 408, the layout data verification unit 410, the mask output unit 412, and the editor 413 of the design support device 400 realize respective functions by the microprocessor operating in accordance with the computer program. Also, the logic synthesis library storage unit 401, the source file storage unit 402, the constraints storage unit 404, the netlist storage unit 405, the place-and-route constraints storage unit 406, the place-and-route library storage unit 407, the layout data storage unit 409, and the verification data storage unit 411 are each composed of a hard disk unit for example.

The logic synthesis library storage unit 401 stores therein, as shown in FIG. 19, standard cell data 451, SRAM macro cell data 452, TSV macro cell data 453, and so on. These respective pieces of data indicate the shapes and delay values of a standard cell, an SRAM macro cell, a TSV macro cell, and so on. The external terminal, the SRAM memory, and so on are each called a macro cell. The TSV is also one kind of a macro cell.

The source file storage unit 402 stores therein, as shown in FIG. 19, HDL files 454, 455, 456, . . . which are each described in an HDL. The HDL files each correspond to one block or the like, and defines the block (module) or the like. FIG. 21 shows an example of the HDL file 454. The HDL file 454 includes, as shown in FIG. 21, module definition 454a for defining a name of the module and a terminal (port), input and output signal declaration 454b, lower layer module call 454c, assign statement 454d for describing a logic used in the circuits, and so on. The HDL files 454, 455, 456, . . . are each generated with use of the editor 413 by the user's creation, addition, modification, deletion, and so on.

The constraints storage unit 404 stores therein, as shown in FIG. 19, timing constraints 457 indicating constraints of operation timing of the circuits, area constraints 458 indicating constraints of an area to be placed in the circuits, and so on. The timing constraints 457, the constraints 458, and so on are each generated with use of the editor 413 by the user's creation, addition, modification, deletion, and so on.

The logic synthesis unit 403 analyzes the HDL to perform circuit mapping on the standard cell, which is the minimum unit of a logic circuit such as an AND gate and an NOR gate. Specifically, the logic synthesis unit 403 replaces a logic for use in the circuits with a combination of primitive gates such as an AND gate and an NOR gate. The logic synthesis unit 403 performs logic synthesis with use of the standard cell data 451, the SRAM macro cell data 452, the TSV macro cell data 453, and so on stored in the logic synthesis library storage unit 401, the HDL files 454, 455, 456, . . . stored in the source file storage unit 402, and the timing constraints 457, the area constraints 458, and so on stored in the constraints storage unit 404. Then, the logic synthesis unit 403 generates HDL files 471, 472, 473, . . . as netlists, and writes the generated HDL files 471, 472, 473, . . . into the netlist storage unit 405.

The netlist storage unit 405 stores therein, as shown in FIG. 19, the HDL files 471, 472, 473, . . . as netlists. The HDL files 471, 472, 473, . . . are generated by the logic synthesis unit 403. FIG. 23 shows an example of the HDL file 471. The HDL file 471 includes, as shown in FIG. 23, module definition 471a for defining a name of the module and a terminal (port), input and output signal declaration 471b, lower layer module calls 471c and 471d, and so on. The lower layer module call 471c is, for example, a result of replacing a logic of A+B with a combination of primitive gates such as an AND gate and an NOR gate.

The place-and-route constraints storage unit 406 stores therein, as shown in FIG. 19, TSV placement information 459, TSV reserved cell placement information 460, macro placement information 461, floor plan information 462, and pin information 463. The TSV placement information 459 defines a placement position of a TSV in each semiconductor chip. The TSV reserved cell placement information 460 is described later. The macro placement information 461 defines a placement position of a macro cell on the semiconductor chip. The floor plan information 462 defines the size of the semiconductor chip, a placement position of a block on the semiconductor chip. The pin information 463 defines a placement position of a pin (terminal) in the block. Here, the TSV placement information 459, the TSV reserved cell placement information 460, the macro placement information 461, the floor plan information 462, and the pin information 463 are each generated with use of the editor 413 by the user's creation, addition, modification, deletion, and so on.

The place-and-route library storage unit 407 stores therein, as shown in FIG. 19, standard cell data 464, SRAM macro cell data 465, TSV reserved cell data 466, TSV macro cell data 467, and so on. The standard cell data 464, the SRAM macro cell data 465, the TSV reserved cell data 466, and the TSV macro cell data 467, and so on indicate the shapes of a standard cell, an SRAM macro cell, a TSV reserved cell, a TSV macro cell, and so on, respectively.

The place-and-route unit 408 determines placement of the macro cell, the TSV cell, the pin, the wiring, and so on. The place-and-route unit 408 is described later.

The layout data storage unit 409 stores therein, as shown in FIG. 19, pieces of mask data 481, 482, 483, . . . . The pieces of mask data 481, 482, 483, . . . one-to-one correspond to a plurality of semiconductor chips. The pieces of mask data each include a plurality of pieces of mask layout data. The pieces of mask layout data one-to-one correspond to a plurality of layers constituting a semiconductor chip. The pieces of mask layout data each indicate the shape of each of cells and wirings placed on a semiconductor chip in a corresponding layer.

The verification data storage unit 411 stores therein a design rule 491, timing information 492, and so on. The design rule 491 defines the distance between wiring layers and the width of a wiring of a wiring layer. For example, the design rule 491 defines that a wiring of the metal wiring layer 1 needs to have a width of 100 nm or larger. The timing information 492 defines timing of operations of each of the cells placed on the semiconductor chip.

The layout data verification unit 410 verifies the pieces of mask data 481, 482, 483, . . . stored in the layout data storage unit 409 based on the design rule 491, the timing information 492, and so on.

The mask output unit 412 outputs the pieces of mask data 481, 482, 483, . . . stored in the layout data storage unit 409.

The editor 413 performs, in response to the user's operations, edition such as generation, addition, correction, and deletion, on the HDL files 454, 455, 456, . . . stored in the source file storage unit 402, the timing constraints 457, the area constraints 458, and so on stored in the constraints storage unit 404, and the TSV placement information 459, the TSV reserved cell placement information 460, the macro placement information 461, the floor plan information 462, and the pin information 463 stored in the place-and-route constraints storage unit 406.

1.6 Mechanism of Place-and-Route Unit 408

The place-and-route unit 408 determines placement of cells, wiring, and so on for each semiconductor chip or for each block. Also, the place-and-route unit 408 generates mask data and outputs the generated mask data for each semiconductor chip or each layer of the semiconductor chip.

Figure 20:
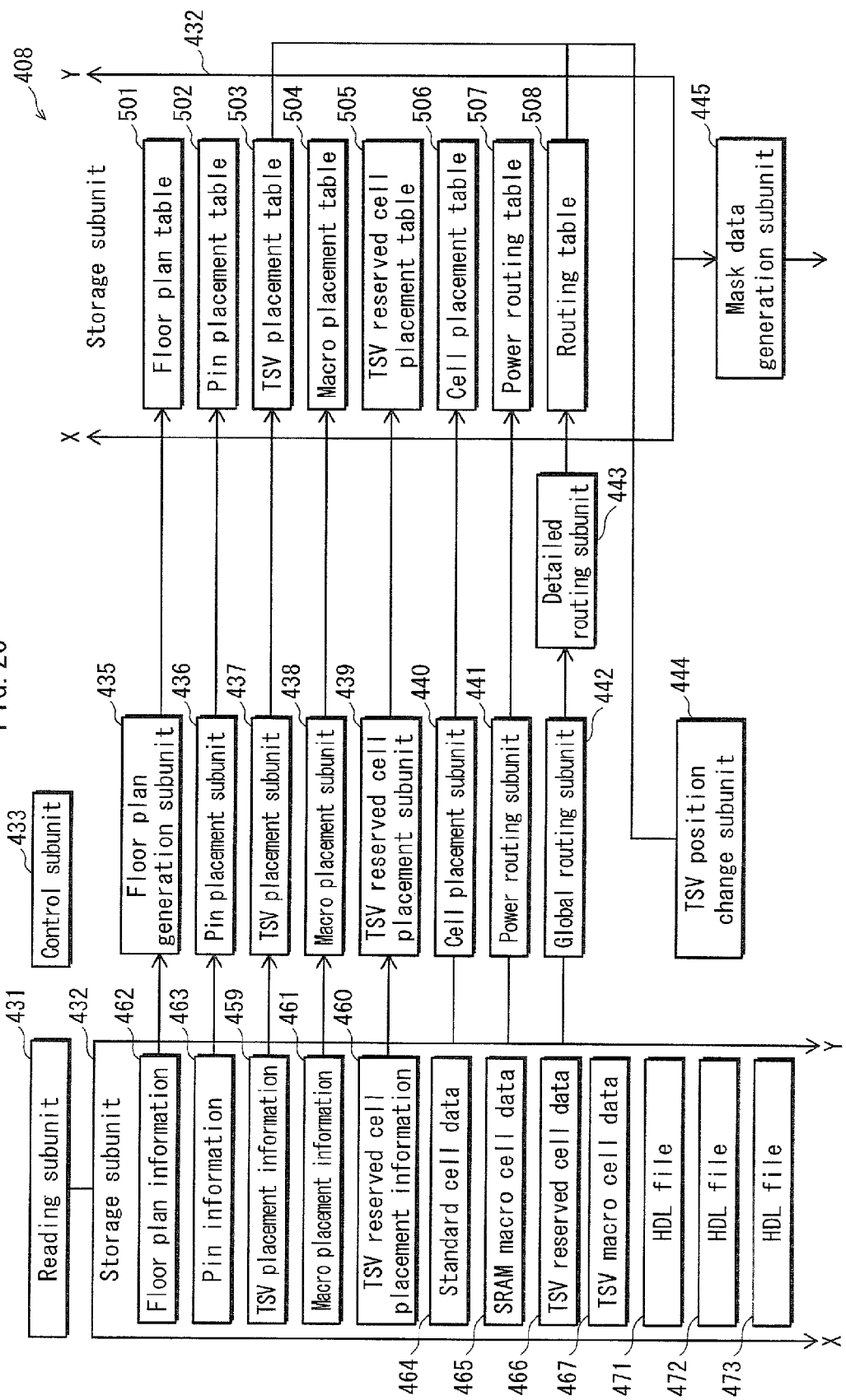
FIG. 20 is a block diagram showing the structure of a place-and-route unit 408.

The place-and-route unit 408 includes, as shown in FIG. 20, a reading subunit 431, a storage subunit 432, a control subunit 433, a floor plan generation subunit 435, a pin placement subunit 436, a TSV placement subunit 437, a macro placement subunit 438, a TSV reserved cell placement subunit 439, a cell placement subunit 440, a power routing subunit 441, a global routing subunit 442, a detailed routing subunit 443, a TSV position change subunit 444, and a mask data generation subunit 445.

The reading subunit 431 reads the HDL files 471, 472, 473, . . . from the netlist storage unit 405. The reading subunit 431 reads the TSV placement information 459, the TSV reserved cell placement information 460, the macro placement information 461, the floor plan information 462, and the pin information 463 from the place-and-route constraints storage unit 406. The reading subunit 431 reads the standard cell data 464, the SRAM macro cell data 465, the TSV reserved cell data 466, the TSV macro cell data 467, and so on from the place-and-route library storage unit 407. Then, the reading subunit 431 writes, into the storage subunit 432, the read HDL files 471, 472, 473, . . . , TSV placement information 459, TSV reserved cell placement information 460, macro placement information 461, floor plan information 462, pin information 463, standard cell data 464, SRAM macro cell data 465, TSV reserved cell data 466, TSV macro cell data 467, and so on.

Figure 24:
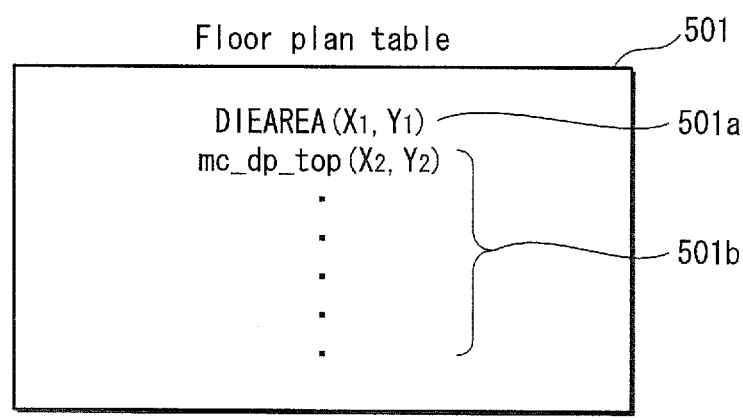
FIG. 24 shows an example of a floor plan table 501.

The floor plan generation subunit 435 generates a floor plan table 501 with use of the floor plan information 462, and writes the generated floor plan table 501 into the storage subunit 432. FIG. 24 shows an example of the floor plan table 501. As shown in FIG. 24, the floor plan table 501 includes data 501a defining the size of each semiconductor chip and data group 501b indicating respective placement positions of a plurality blocks on the semiconductor chip.

Figure 25:
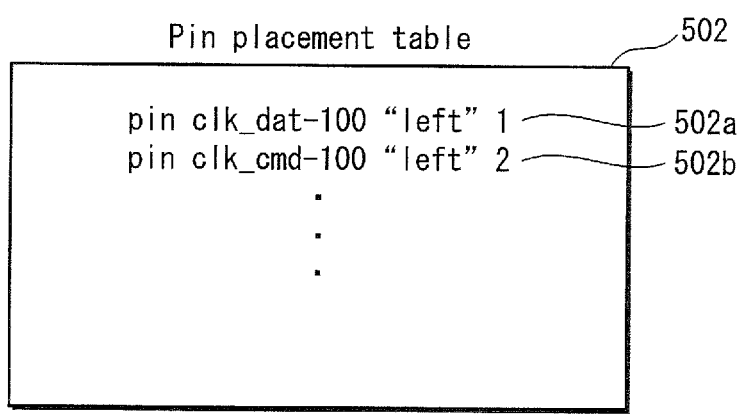
FIG. 25 shows an example of a pin placement table 502.

The pin placement subunit 436 generates a pin placement table 502 with use of the pin information 463, and writes the generated pin placement table 502 into the storage subunit 432. FIG. 25 shows an example of the pin placement table 502. As shown in FIG. 25, the pin placement table 502 includes pieces of pin placement data 502a, 502b, . . . . The pieces of pin placement data 502a, 502b, . . . one-to-one-correspond to a plurality of pins (terminals) placed in each block. The pin placement data 502a indicates a name of a pin, a layer where the pin is to be placed, the size of the pin, a placement position of the pin, and so on. In the example shown in FIG. 25, the number "−100" indicates automatic determination of the layer where the pin is to be placed and the size of the pin. Also, the letters "left" indicates that the pin is to be placed along left side of the block, and the number "1" following this indicates a placement turn of the pin.

Figure 26:
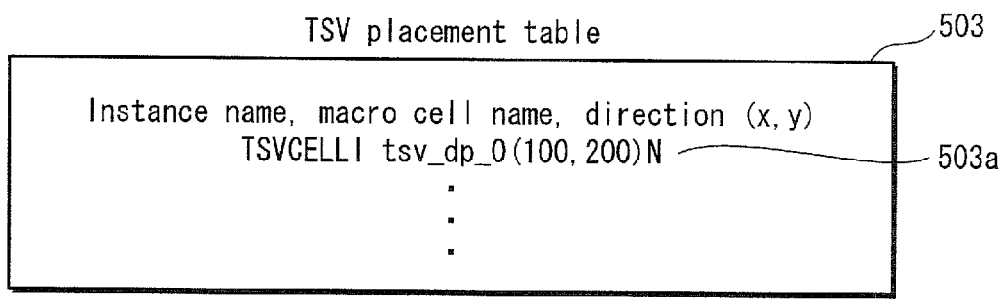
FIG. 26 shows an example of a TSV placement table 503.

The TSV placement subunit 437 generates a TSV placement table 503 with use of the TSV placement information 459, and writes the generated TSV placement table 503 into the storage subunit 432. FIG. 26 shows an example of the TSV placement table 503. As shown in FIG. 26, the TSV placement table 503 includes pieces of TSV placement data 503a, . . . . The pieces of TSV placement data 503a, . . . one-to-one-correspond to a plurality of TSVs placed in each block. The TSV placement data 503a indicates an instance name of a corresponding TSV and a placement position and a placement direction of the TSV in the block. Here, the last letter "N" of the TSV placement data 503a for example means the northward direction, and indicates that the TSV is to be placed in the block in a particular direction.

The macro placement unit 438 generates a macro placement table 504 with use of the macro placement information 461, and writes the generated macro placement table 504 into the storage subunit 432.

The TSV reserved cell placement subunit 439 generates a TSV reserved cell placement table 505 with use of the TSV reserved cell placement information 460, and writes the generated TSV reserved cell placement table 505 into the storage subunit 432. The TSV reserved cell placement information 439 is described later.

Figure 27:
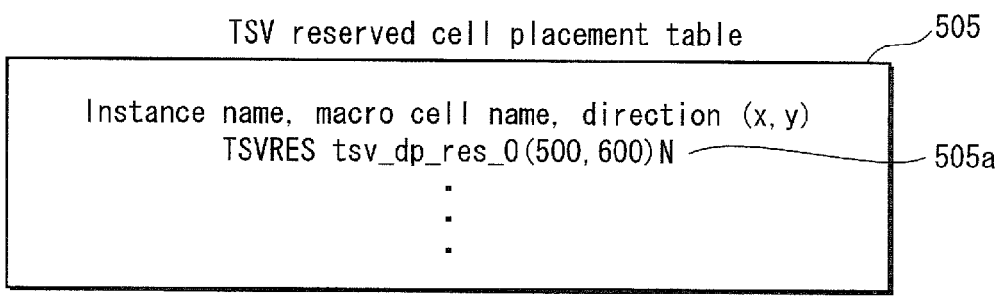
FIG. 27 shows an example of a TSV reserved cell table 505.

FIG. 27 shows an example of the TSV reserved cell placement table 505. As shown in FIG. 27, the TSV reserved cell placement table 505 includes pieces of TSV reserved cell placement data 505a, . . . . The pieces of TSV reserved cell placement data 505a, . . . one-to-one-correspond to a plurality of reserved cells placed in each block. The TSV reserved cell placement data 505a indicates an instance name of a corresponding reserved cell, a placement position and a placement direction of the reserved cell in the block. The TSV reserved cell placement data 505a has the same data structure as the TSV placement data 503a.

The cell placement subunit 440 generates a cell placement table 506 with use of the standard cell data 464 and the HDL files 471, 472, 473, . . . , and writes the generated cell placement table 506 into the storage subunit 432.

Figure 28:
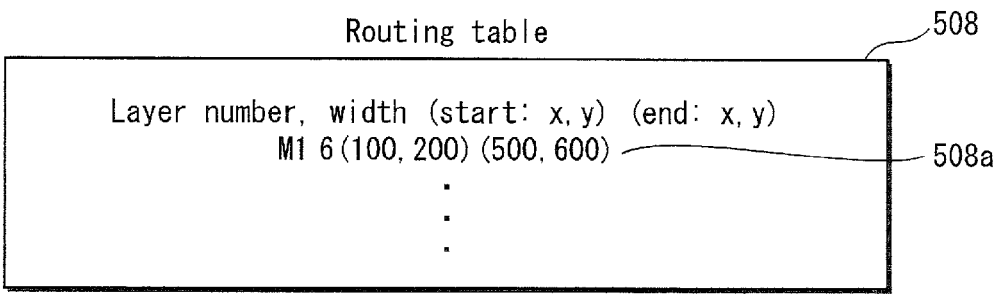
FIG. 28 shows an example of a routing table 508.

The power routing subunit 441 generates a power routing table 507, and writes the generated power routing table 507 into the storage subunit 432. The global routing subunit 442 performs global routing. The detailed routing subunit 443 generates a routing table 508 based on the global routing, and writes the generated routing table 508 into the storage subunit 432. FIG. 28 shows an example of the routing table 508. As shown in FIG. 28, the routing table 508 includes pieces of wiring data 508a, . . . . The pieces of wiring data 508a, . . . one-to-one correspond to a plurality of wirings provided on each semiconductor chip. The wiring data 508a includes an item "layer number" indicating a layer where a corresponding wiring is to be placed, an item "width" indicating a width of the wiring, and an item "(start point and end point)" indicating a start point and an end point of the wiring represented by the X-coordinate and the Y-coordinate, respectively.

Until placement position change becomes unnecessary, the TSV location change unit 444 re-changes the placement position of the TSV, the power routing unit 441 re-generates the power routing table 507, the global routing unit 442 re-performs global routing, and the detailed routing unit 443 re-generates the routing table 508.

Also, the mask data generation subunit 445 generates mask data that is layout data for generating photomask, with use of the floor plan table 501, the pin placement table 502, the TSV placement table 503, the macro placement table 504, the TSV reserved cell placement table 505, the cell placement table 506, the power routing table 507, and the routing table 508 that are written into the storage subunit 432. Then, the mask data generation subunit 445 outputs the generated mask data.

1.7 Data Structure of TSV Reserved Cell Placement Information 460

Figure 22:
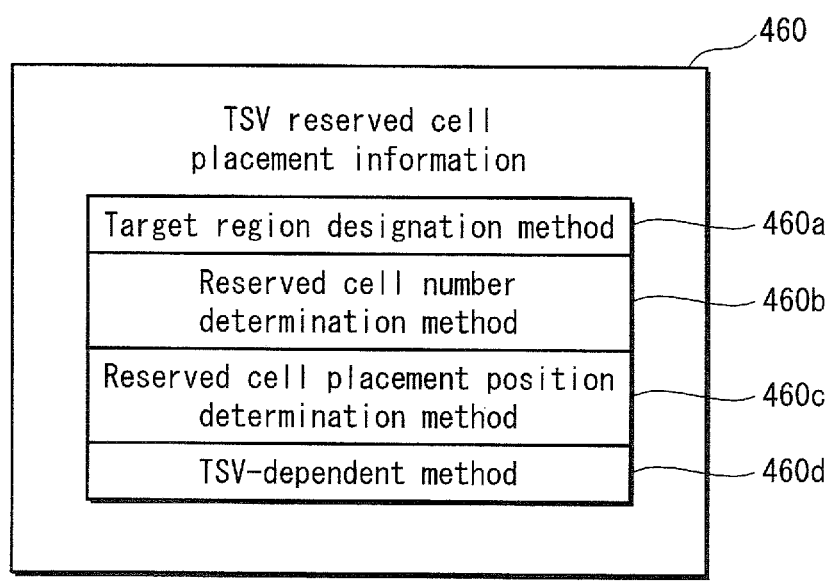
FIG. 22 shows an example of the data structure of TSV reserved cell placement information 460.

The TSV reserved cell placement information 460 includes, as shown in FIG. 22, a target region designation method 460a, a reserved cell number determination method 460b, a reserved cell placement position determination method 460c, and a TSV-dependent method 460d.

(Target Region Designation Method 460a)

The target region designation method 460a indicates which of a block and an overlap region a target region is. Specifically, the target region designation method 460a has, for example, a value of "0" indicating that the target region is a block or a value of "1" indicating that the target region is an overlap region.

(Reserved Cell Number Determination Method 460b)

The reserved cell number determination method 460b indicates how to determine the number of all reserved cells to be placed in the block or the overlap region. The reserved cell number determination method 460b has a value of "0", "1", "2", "3", or "4".

The reserved cell number determination method 460b having a value of "0" indicates that no method of determining the number of reserved cells to be placed is determined beforehand. This is applied to the case where one reserved cell is placed for each TSV, for example.

The reserved cell number determination method 460b having a value of "1" represents the first method described above, and indicates that the number of reserved cells to be placed is determined by the user's designation. In this case, the determination method 460b includes the number designated by the user.

The reserved cell number determination method 460b having a value of "2" represents the second method described above, and indicates that the number of reserved cells to be placed is determined by the percent rule. In this case, the reserved cell number determination method 460b includes an area ratio of a reserved cell that has been designated beforehand.

The reserved cell number determination method 460b having a value of "3" represents the third method described above, and indicates that the number of reserved cells to be placed is determined depending on the number of TSVs to be placed in the target region. In this case, the reserved cell number determination method 460b includes a multiple number that has been designated beforehand.

The reserved cell number determination method 460b having a value of "4" represents the fourth method described above, and indicates that the number of reserved cells to be placed is determined depending on the number and positions of TSVs to be placed in the target region. In this case, the reserved cell number determination method 460b includes a multiple number that has been designated beforehand.

(Reserved Cell Placement Position Determination Method 460c)

The reserved cell placement position determination method 460c indicates how to place reserved cells in a block or an overlap region. The reserved cell placement position determination method 460c has a value of "0", "1", "2", or "3".

The reserved cell placement position determination method 460c having a value of "1" indicates that reserved cells are to be randomly placed in the block or the overlap region. The reserved cell placement position determination method 460c having a value of "2" indicates that reserved cells are to be placed at regular intervals in the block or the overlap region. The reserved cell placement position determination method 460c having a value of "3" indicates that reserved cells are to be placed in respective positions designated by the user in the block or the overlap region. In this case, the TSV reserved cell placement information 460 includes the respective user's designated placement positions of the reserved cells. The reserved cell placement position determination method 460c having a value of "0" indicates other case such as a case where respective placement positions of the reserved cells are to be determined depending on placement of TSVs.

(TSV-Dependent Method 460d)

The TSV-dependent method 460d indicates whether to determine respective placement positions of reserved cells depending on TSVs. Also, if indicating the respective placement positions of the reserved cells are to be determined depending on the TSVs, the TSV-dependent method 460d indicates how to depend on the TSVs. The TSV-dependent method 460d has a value of "0", "1", "2", or "3".

The TSV-dependent method 460d having a value of "0" indicates that the respective placement positions of the reserved cells are to be determined without depending on the TSVs.

On the other hand, the TSV-dependent method 460d having a value of other than "0" indicates that the respective placement positions of the reserved cells are to be determined depending on the TSVs. The TSV-dependent method 460d having a value of "1" indicates that the respective placement positions of the reserved cells are to be determined such that the respective placement positions of the reserved cells and respective placement positions of the TSVs are symmetrical. In this case, the TSV-dependent method 460d includes center information, which indicates whether the reserved cells are to be placed such that the respective placement positions of the reserved cells and the respective placement positions of the placed TSVs are symmetrical with respect to the center point of the target region or symmetrical with respect to the center axis of the target region. The center information indicates which one is to be used among the center point of the target region, the center axis in the longitudinal direction of the target region, and the center axis in the transverse direction of the target region. Also, the TSV-dependent method 460d having a value of "2" indicates that the respective placement positions of the reserved cells are to be determined such that reserved cells are placed in respective positions at an equal distance from one TSV. Furthermore, the TSV-dependent method 460d having a value of "3" indicates that the respective placement positions of the reserved cells are to be determined such that TSVs are classified into one or more groups, and one reserved cell is placed for each of the groups. In this case, the determination method 460d includes a grouping distance G.

1.8 TSV Reserved Cell Placement Subunit 439

The TSV reserved cell placement subunit 439 includes a placement control subunit 439a, a random placement subunit 439b, a regular interval placement subunit 439c, a designation placement subunit 439d, a symmetrical placement subunit 439e, an equal distance placement subunit 439f, and a group placement subunit 439g (which are not illustrated).

(Placement Control Subunit 439a)

The placement control subunit 439a reads, from the TSV reserved cell placement information 460, the target region designation method 460a, the reserved cell number determination method 460b, the reserved cell placement position determination method 460c, and the TSV-dependent method 460d.

Also, the placement control subunit 439a reads all the pieces of TSV placement data from the TSV placement table 503 stored in the storage subunit 432, and counts the number of the read pieces of TSV placement data to obtain the number of TSVs to be placed. Then, the placement control subunit 439a judges whether the obtained number of TSVs to be placed is zero. When the obtained number of TSVs to be placed is zero, there is no TSV to be placed in a target region. Accordingly, the placement control subunit 439a places no reserved cell, and ends processing.

When the obtained number of TSVs to be placed is not zero, the placement control subunit 439a further judges which value of "0" and "1" the target region designation method 460a has. When the target region designation method 460a has a value of "0", the placement control subunit 439a determines each block as the target region. Also, when the target region designation method 460a has a value of "1", the placement control subunit 439a calculates a position of an overlap region overlapping between a block where the TSVs are to be placed and a block to which the TSVs are to be connected. The target region designation method 460a determines the overlap region indicated by the calculated position as the target region.

Next, the placement control subunit 439a judges which value of "0", "1", "2", "3", and "4" the reserved cell number determination method 460b has.

When the reserved cell number determination method 460b has a value of "0", the placement control subunit 439a perform no processing.

When the reserved cell number determination method 460b has a value of "1", the placement control subunit 439a determines the user's designated number as the number of reserved cells to be placed.

When the reserved cell number determination method 460b has a value of "2", the placement control subunit 439a calculates the area of the target region, and calculates an area of one reserved cell. Then, the placement control subunit 439a calculates the number of reserved cells to be placed by the following formula.

the number of reserved cells to be placed=[area of target region×designated area ratio (%)/area of one reserved cell×100]

When the reserved cell number determination method 460b has a value of "3", the placement control subunit 439a calculates the number of reserved cells to be placed by the following formula.

the number of reserved cells to be placed=the number of TSVs to be placed×designated multiple number When the reserved cell number determination method 460b has a value of "4", the placement control subunit 439a calculates the number of reserved cells to be placed by the following formula.

the number of reserved cells to be placed=the number of TSVs to be placed×designated multiple number Next, the placement control subunit 439a judges which value of "0", "1", "2", "3", and "4" the reserved cell placement position determination method 460c has. When the reserved cell placement position determination method 460c has a value of "1", the random placement subunit 439b randomly places the reserved cells in the block or the overlap region. When the reserved cell placement position determination method 460c has a value of "2", the regular interval placement subunit 439c places the reserved cells at regular intervals in the block or the overlap region. When the reserved cell placement position determination method 460c has a value of "3", the designation placement subunit 439c places the reserved cells in respective designated positions in the block or the overlap region.

When the reserved cell placement position determination method 460c has a value of "0", the placement control subunit 439a further judges which value of "0", "1", "2", "3", and "4"

the TSV-dependent method 460d has. When the TSV-dependent method 460d has a value of "1", the symmetrical placement subunit 439e determines the respective placement positions of the reserved cells such that respective placement positions of the reserved cells and respective placement positions of the TSVs are symmetrical. Also, when the TSV-dependent method 460d has a value of "2", the equal distance placement subunit 439f determines the respective placement positions of the reserved cells such that reserved cells are placed in respective positions at an equal distance from a placement position of each of the TSVs. Furthermore, when the TSV-dependent method 460d has a value of "3", the group placement subunit 439g determines the respective placement positions of the reserved cells such that the TSVs are classified into one or more groups, and one reserved cell is placed for each of the groups.

This completes the processing of the TSV reserved cell placement subunit 439.

(Random Placement Subunit 439b)

Firstly, the random placement subunit 439b judges whether the reserved cell number determination method 460b has a value of "0" or other value. When the reserved cell number determination method 460b has a value of "0", the random placement subunit 439b ends processing.

When the reserved cell number determination method 460b has a value of other than "0", the random placement subunit 439b repeatedly performs the following processing (a) to (d) by the number of reserved cells to be placed determined by the placement control subunit 439a.

In processing (a), a random number that is greater than 0 and smaller than 1 is generated, and the horizontal width of a target region is multiplied by the generated random number to obtain a coordinate value X.

coordinate value $X$=horizontal width of target region× random number

In processing (b), a random number that is greater than 0 and smaller than 1 is generated, and the vertical width of the target region is multiplied by the generated random number to obtain a coordinate value Y.

coordinate value $Y$=vertical width of target region× random number

In processing (c), coordinates (X,Y) are temporarily determined as a placement position of a reserved cell. Here, the coordinates (X,Y) represent a position of the center point of the cross section of the reserved cell to be placed on each semiconductor chip. Judgment is made as to whether the reserved cell defined by the coordinates (X,Y) overlaps in placement position with any other cell that has been already determined to be placed. When the defined reserved cell overlaps in placement position with any other cell, processing is repeatedly performed from the processing (a). In this way, overlapping of placement positions of cells is avoided.

In processing (d), when the defined reserved cell does not overlap in placement position with any other cell, the coordinates (X,Y) are written into the TSV reserved cell placement table 505, as the placement position of the reserved cell.

In this way, the random placement subunit 439b places reserved cells by the number of reserved cells determined to be placed.

(Regular Interval Placement Subunit 439c)

Firstly, the regular interval placement subunit 439c judges whether the reserved cell number determination method 460b has a value of "0" or other value. When the reserved cell number determination method 460b has a value of "0", the regular interval placement subunit 439c ends processing.

When the reserved cell number determination method 460b has a value of other than "0", the regular interval placement subunit 439c calculates a unit area by the following formula.

unit area=[area of target region/the number of reserved cells to be placed]

Next, the regular interval placement subunit 439c calculates a distance L by the following formula.

distance $L$=[square root (unit area)]

Then, the regular interval placement subunit 439c sets a default position $(X_0,Y_0)$ where the first reserved cell is to be placed. Here, $(X_0,Y_0)=(L/2,L/2)$ is satisfied.

Then, the regular interval placement subunit 439c calculates the maximum integer m that satisfies the following formula.

$X_0+m \times L$<(horizontal width of target region)

Also, the regular interval placement subunit 439c calculates the maximum integer n that satisfies the following formula.

$Y_0+n \times L$<(vertical width of target region)

Then, the regular interval placement subunit 439c repeatedly performs the following processing (a) on the variable j=0, 1, 2, . . . , n in the Y-axis direction.

In processing (a), the following processing (a-1) to (a-4) is repeatedly performed on the variable i=0, 1, 2, . . . , m in the X-axis direction.

In processing (a-1), $(X,Y)=(X_0+i \times L, Y_0+j \times L)$ is calculated.

In processing (a-2), coordinates (X,Y) are temporarily determined as a placement position of a reserved cell. Here, the coordinates (X,Y) represent a position of the center point of the cross section of the reserved cell to be placed on each semiconductor chip. Judgment is made as to whether the reserved cell defined by the coordinates (X,Y) overlaps in placement position with any other cell that has been already determined to be placed. When the defined reserved cell overlaps in placement position with any other cell, the placement position of the defined reserved cell is displaced such that the defined reserved cell does not overlap in placement position with any other cell.

In processing (a-3), when the defined reserved cell does not overlap in placement position with any other cell, the coordinates (X,Y) is written into the TSV reserved cell placement table 505, as the placement position of the reserved cell.

In processing (a-4), judgment is made as to whether the coordinates (X,Y) have been written into the TSV reserved cell placement table 505 by the number of reserved cells to be placed. When the coordinates (X,Y) have been written by the number of reserved cells to be placed, the processing of the regular interval placement subunit 439c ends.

In this way, the regular interval placement subunit 439c places reserved cells by the number of reserved cells determined to be placed.

(Designation Placement Subunit 439d)

The designation placement subunit 439d reads respective placement positions of reserved cells designated by the user from the TSV reserved cell placement information 460 stored in the storage subunit 432, and writes the read placement positions into the TSV reserved cell placement table 505, as respective placement positions of the reserved cells.

(Symmetrical Placement Subunit 439e)

The symmetrical placement subunit 439e repeatedly performs the following processing (a) to (e) by the number of TSVs to be placed in a target region.

In processing (a), the symmetrical placement subunit 439e reads one piece of TSV placement data from the TSV placement table 503.

In processing (b), the symmetrical placement subunit 439e obtains center information, and judges which one of axis symmetry and point symmetry is to be formed with use of the obtained center information.

Processing (c)

In processing (c-1), when point symmetry is to be formed, the symmetrical placement subunit 439e calculates the center point (or the center of gravity) of the target region, and calculates a position (X,Y) such that the calculated position and a placement position of a TSV defined by the read piece of TSV placement data are point symmetrical with respect to the calculated center point. Note that the symmetrical point is not limited to the center point. An arbitrary point of the target region may be selected as the symmetrical point. Alternatively, a point of the target region designated beforehand by the user may be selected as the symmetrical point. Further alternatively, a randomly selected point of the target region may be selected as the symmetrical point.

In processing (c-2), when axis symmetry is to be formed, the symmetrical placement subunit 439e calculates the center line (center axis) of the target region, and calculates a position (X,Y) such that the calculated position and the placement position of the TSV defined by the read piece of TSV placement data are symmetrical with respect to the calculated center line. Note that the symmetrical line is not limited to the center line. An arbitrary line (axis) of the target region may be selected as the symmetrical line. Alternatively, a line (axis) of the target region designated beforehand by the user may be selected as the symmetrical line. Further alternatively, a randomly selected line (axis) of the target region may be selected as the symmetrical line. Further alternatively, a diagonal line (diagonal axis) of the target region may be selected as the symmetrical line.

In processing (d), the symmetrical placement subunit 439e temporarily determines the coordinates (X,Y) as a placement position of a reserved cell. Here, the coordinates (X,Y) represent a position of the center point of the cross section of the reserved cell to be placed on each semiconductor chip. The symmetrical placement subunit 439e judges whether the reserved cell defined by the coordinates (X,Y) overlaps in placement position with any other cell that has been already determined to be placed. When the defined reserved cell overlaps in placement position with any other cell, the symmetrical placement subunit 439e displaces the placement position of the defined reserved cell such that the defined reserved cell does not overlap in placement position with any other cell.

In processing (e), when the defined reserved cell does not overlap in placement position with any other cell, the symmetrical placement subunit 439e writes the coordinates (X,Y) into the TSV reserved cell placement table 505, as the placement position of the reserved cell.

In this way, the symmetrical placement subunit 439e places reserved cells by the number of reserved cells determined to be placed.

(Equal Distance Placement Subunit 439f)

The equal distance placement subunit 439f reads all the pieces of TSV placement data from the TSV placement table 503 stored in the storage subunit 432, and counts the number of the read pieces of TSV placement data to obtain the number of TSVs to be placed.

Next, the equal distance placement subunit 439f judges whether the reserved cell number determination method 460b has a value of "0" or other value. When the reserved cell number determination method 460b has a value of "0", the equal distance placement subunit 439f ends processing.

When the reserved cell number determination method 460b has a value of other than "0", the equal distance placement subunit 439f calculates the placement number N by the following formula.

the placement number $N$=[the number of reserved cells to be placed/the number of TSVs to be placed]

The placement number N indicates the number of reserved cells to be placed for each TSV.

Next, the equal distance placement subunit 439f repeatedly performs the following processing (a) to (e) by the number of TSVs to be placed in a target region.

In processing (a), the equal distance placement subunit 439f reads one piece of TSV placement data from the TSV placement table 503 stored in the storage subunit 432.

In processing (b), the equal distance placement subunit 439f obtains a distance M. For example, the distance M is obtained as a value designated by the user. Alternatively, the distance M may be calculated by the above formula: distance M=[constant/operating speed of circuit provided in block].

In processing (c), the equal distance placement subunit 439f calculates coordinates (X,Y) of each of N vertexes of a regular N-polygon whose center point is in a placement position of a TSV indicated by the read piece of TSV placement data and is distant from each vertex by the distance M.

In processing (d), the equal distance placement subunit 439f temporarily determines the N coordinates (X,Y) as respective placement positions of reserved cells. Here, the N coordinates (X,Y) each represent a position of the center point of the cross section of a corresponding one of the N reserved cells to be placed on each semiconductor chip. The equal distance placement subunit 439f judges whether the respective reserved cells defined by the N coordinates (X,Y) each overlap in placement position with any other cell that has been already determined to be placed. When the defined reserved cell overlaps in placement position with any other cell, the equal distance placement subunit 439f displaces the placement position of the defined reserved cell such that the defined reserved cell does not overlap in placement position with any other cell.

In processing (e), when the defined reserved cell does not overlap in placement position with any other cell, the equal distance placement subunit 439f writes the N coordinates (X,Y) into the TSV reserved cell placement table 505, as the respective placement positions of the defined reserved cells.

In this way, the equal distance placement subunit 439f places reserved cells by the number of reserved cells determined to be placed.

(Group Placement Subunit 439g)

The group placement subunit 439g classifies one or more TSVs to be placed in a target region into one or more groups in the following manner such that TSVs, which are placed at the distance G or less from one TSV, are classified into the same group.

In processing (a), the group placement subunit 439g obtains a grouping distance G.

In processing (b), the group placement subunit 439g sets a variable i to "1".

In processing (c), the group placement subunit 439g reads one piece of TSV placement data corresponding to one of the TSVs that have not yet been classified into any group from the TSV placement table 503, classifies TSV Ti indicated by the read piece of TSV placement data into an i-th group, and stores the TSV Ti in correspondence with the i-th group.

In processing (d), the group placement subunit 439g reads pieces of TSV placement data one-to-one corresponding to the TSVs that have not yet been classified into any group among the pieces of TSV placement data stored in the TSV placement table 503, and classifies all the TSVs to be placed at the distance G or less from Ti into the i-th group, and stores the classified TSVs in correspondence with the i-th group.

In processing (e), the group placement subunit 439g judges whether all the TSVs have been classified into any group.

In processing (f), when any of the TSVs has not yet been classified, the group placement subunit 439g increments the variable i by 1, and repeatedly performes the above processing (a) to (e).

In processing (g), when all the TSVs have been classified, the group placement subunit 439g repeatedly performes the following processing (h) to (j) with respect to each of all the groups.

In processing (h), the group placement subunit 439g calculates the center position among all the TSVs belonging to the group. The center position is calculated by, for example, virtually drawing a polygon whose vertexes coincide with respective placement positions of all the belonging TSVs and calculating a position (X,Y) of the center of gravity of the polygon. The center position is not limited to the center of gravity of the polygon. Alternatively, an arbitrary point of the polygon may be calculated as the center point among all the TSVs belonging to the group, for example.

In processing (i), the group placement subunit 439g temporarily determines coordinates (X,Y) as a placement position of a reserved cell. Here, the coordinates (X,Y) represent a position of the center point of the cross section of the reserved cell to be placed on each semiconductor chip. The group placement subunit 439g judges whether the reserved cell defined by the coordinates (X,Y) overlaps in placement position with any other cell that has been already determined to be placed. When the defined reserved cell overlaps in placement position with any other reserved cell, the group placement subunit 439g displaces the placement position of the defined reserved cell such that the defined reserved cell does not overlap in placement position with any other cell.

In processing (j), when the defined reserved cell does not overlap in placement position with any other cell, the group placement subunit 439g writes the coordinates (X,Y) into the TSV reserved cell placement table 505, as the placement position of the reserved cell.

In this way, the group placement subunit 439g places reserved cells by the number of reserved cells determined to be placed.

1.9 Operations of Design Support Device 400

(1) Operations of Place-and-Route Unit 408 of Design Support Device 400

Figure 29:
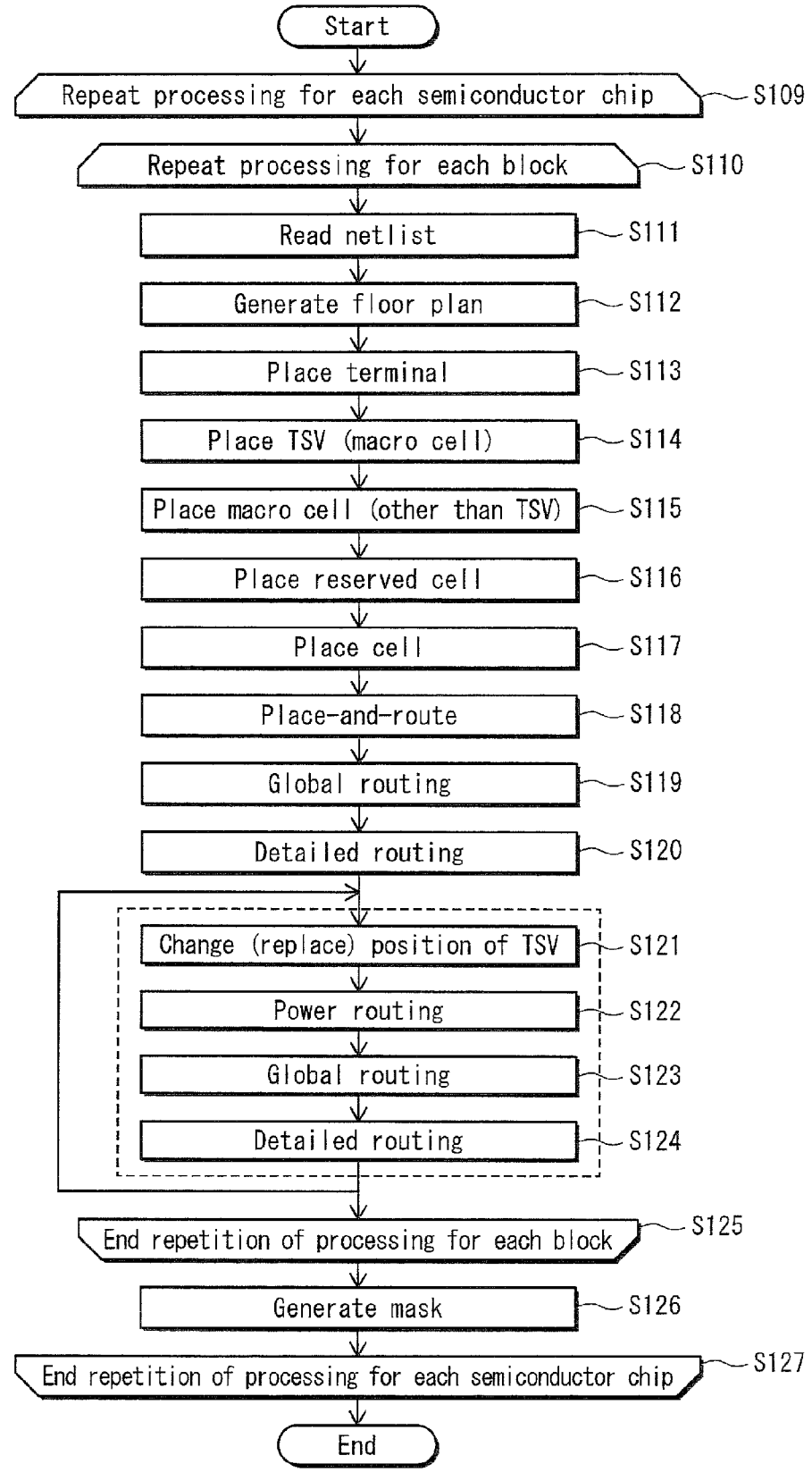
FIG. 29 is a flowchart showing operations of the place-and-route unit 408 of the design support device 400.

The following describes operations of the place-and-route unit 408 of the design support device 400 with reference to a flowchart shown in FIG. 29.

In FIG. 29, mask layout is firstly generated in Steps S111 to S120, and respective placement positions of TSVs are changed and the generated mask layout is corrected in Steps S121 to S124.

The place-and-route unit 408 repeatedly performs processing of Steps S110 to S126 for each semiconductor chip via control by the control subunit 433 (Steps S109 to S127).

Also, the place-and-route unit 408 repeatedly performs processing of Steps S111 to S124 for each block via control by the control subunit 433 (Steps S110 to S125).

The reading subunit 431 reads a netlist and so on (Step S111). The floor plan generation subunit 435 generates a floor plan table 501 (Step S112). The pin placement subunit 436 generates a pin placement table 502 (Step S113). The TSV placement subunit 437 generates a TSV placement table 503 (Step S114). The macro placement subunit 438 generates a macro placement table 504 (Step S115). The TSV reserved cell placement unit 439 generates a TSV reserved cell placement table 505 (Step S116). The cell placement subunit 440 generates a cell placement table 506 (Step S117). The power routing subunit 441 generates a power routing table 507 (Step S118). The global routing subunit 442 performs global routing (Step S119). The detailed routing subunit 443 generates a routing table 508 (Step S120).

Next, until placement position change becomes unnecessary, the TSV position change subunit 444 re-changes the respective placement positions of the TSVs (Step S121), the power routing subunit 441 re-generates the power routing table 507 (Step S122), the global routing subunit 442 re-performs global routing (Step S123), and the detailed routing subunit 443 re-generates the routing table 508 (Step S124).

The mask data generation subunit 445 generates mask data, and outputs the generated mask data (Step S126).

In the flowchart in FIG. 29 showing the operations of the place-and-route unit 408, processing of Steps S111 to S113 are the same as those in a method of designing a two-dimensional integrated circuit. Step S114 of placing TSVs is a design process of placing TSVs as macro cells in a three-dimensional integrated circuit. The TSVs to be placed as macro cells only need to have terminal information (port information), and may have the black box structure in this phase. Also, a placement prohibition region 103 needs to be placed around the each of the TSVs, where placement of standard cells and transistors is prohibited under design constraints. Step S115 of placing macro cells other than the TSVs is performed after placement of the TSVs.

Also, Step S116 of placing reserved cells is performed before Step S117 of placing cells.

After Step S116 of placing reserved cells, timing-driven standard cells are placed (Step S117) and various routing is performed (Steps S118 to S120), in the same way as in the design of a two-dimensional integrated circuit.

After completion of the place-and-route process described above, verification is performed as to whether all the circuit paths satisfy the timing constraints. In the case where TSVs are used for a three-dimensional integrated circuit, it is necessary to take into consideration connection relationship between one semiconductor chip and another semiconductor chip that is a target for bonding. Accordingly, even if one of these semiconductor chips satisfies timing constraints, the three-dimensional integrated circuit does not normally operate as a whole unless the other semiconductor chip also satisfies the timing constraints. For this reason, respective placement positions of the TSVs are repeatedly changed until the semiconductor chips that are bonded onto each other both satisfy the timing constraints under the design phase of place-and-route.

(2) Operations of Placement Control Subunit 439a of TSV Reserved Cell Placement Subunit 439

Figure 30:
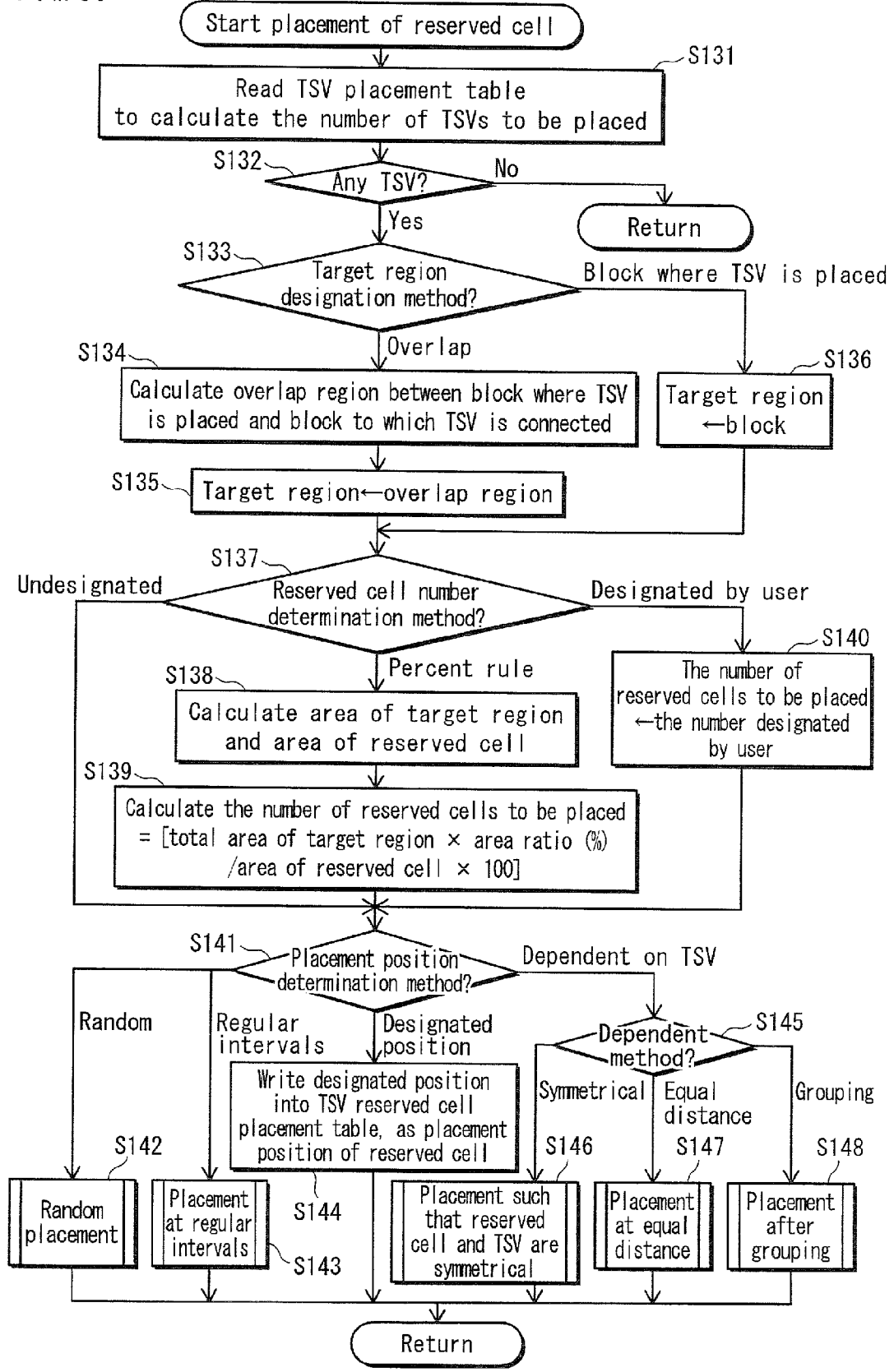
FIG. 30 is a flowchart showing operations of a TSV reserved cell placement unit 439.

The following describes operations of the placement control subunit 439a of the TSV reserved cell placement subunit 439 with reference to a flowchart shown in FIG. 30.

The placement control subunit 439a reads all the pieces of TSV placement data from the TSV placement table 503 stored in the storage subunit 432, and counts the number of the read pieces of TSV placement data to obtain the number of TSVs to be placed (Step S131). When the obtained number of TSVs to be placed is zero (Step S132), there is no TSV to be placed in a target region. Accordingly, the placement control subunit 439a places no reserved cell, and ends processing.

When the obtained number of TSVs to be placed is not zero (Step S132), the placement control subunit 439a judges which value of "0" and "1" the target region designation method 460a has (Step S133). When the target region designation method 460a has a value of "0" (Step S133), the placement control subunit 439a determines a block as the target region (Step S136). Also, when the target region designation method 460a has a value of "1" (Step S133), the placement control subunit 439a calculates an overlap region overlapping between a block where TSVs are to be placed and a block to which the TSVs are to be connected (Step S134), and determines the calculated overlap region as the target region (Step S135).

Next, the placement control subunit 439a judges which value of "0", "1", "2", "3", and "4" the reserved cell number determination method 460b has (Step S137).

When the reserved cell number determination method 460b has a value of "0" (Step S137), the placement control subunit 439a perform no processing.

When the reserved cell number determination method 460b has a value of "1" (Step S137), the placement control subunit 439a determines the user's designated number as the number of reserved cells to be placed (Step S140).

When the reserved cell number determination method 460b has a value of "2" (Step S137), the placement control subunit 439a calculates the area of the target region and an area of one reserved cell (Step S138) to calculate the number of reserved cells to be placed=[area of target region×designated area ratio (%)/area of one reserved cell×100] (Step S139).

When the reserved cell number determination method 460b has a value of "3" or "4", the placement control subunit 439a calculates the number of reserved cells to be placed by a method corresponding to the value.

Next, the placement control subunit 439a judges which value of "0", "1", "2", and "3" the reserved cell placement position determination method 460c has (Step S141). When the reserved cell placement position determination method 460c has a value of "1" (Step S141), the random placement subunit 439b randomly places reserved cells in the block or the overlap region (Step S142). When the reserved cell placement position determination method 460c has a value of "2" (Step S141), the regular interval placement subunit 439c places reserved cells at regular intervals in the block or the overlap region (Step S143). When the reserved cell placement position determination method 460c has a value of "3" (Step S141), the designation placement subunit 439c places reserved cells in respective designated positions in the block or the overlap region (Step S144).

When the reserved cell placement position determination method 460c has a value of "0" (Step S141), the placement control subunit 439a judges which value of "0", "1", "2", and "3" the TSV-dependent method 460d has (Step S145). When the TSV-dependent method 460d has a value of "1" (Step S145), the symmetrical placement subunit 439e places reserved cells such that respective placement positions of the reserved cells and respective placement positions of TSVs are symmetrical (Step S146). Also, when the TSV-dependent method 460d has a value of "2" (Step S145), the equal distance placement subunit 439f places reserved cells in respective positions at an equal distance from one TSV (Step S147). Furthermore, when the TSV-dependent method 460d has a value of "3" (Step S145), the group placement subunit 439g classifies the TSVs into one or more groups, and places reserved cells for each of the groups (Step S148).

This completes the processing of the TSV reserved cell placement unit 439.

(3) Operations of Random Placement Subunit 439b of TSV Reserved Cell Placement Unit 439

Figure 31:
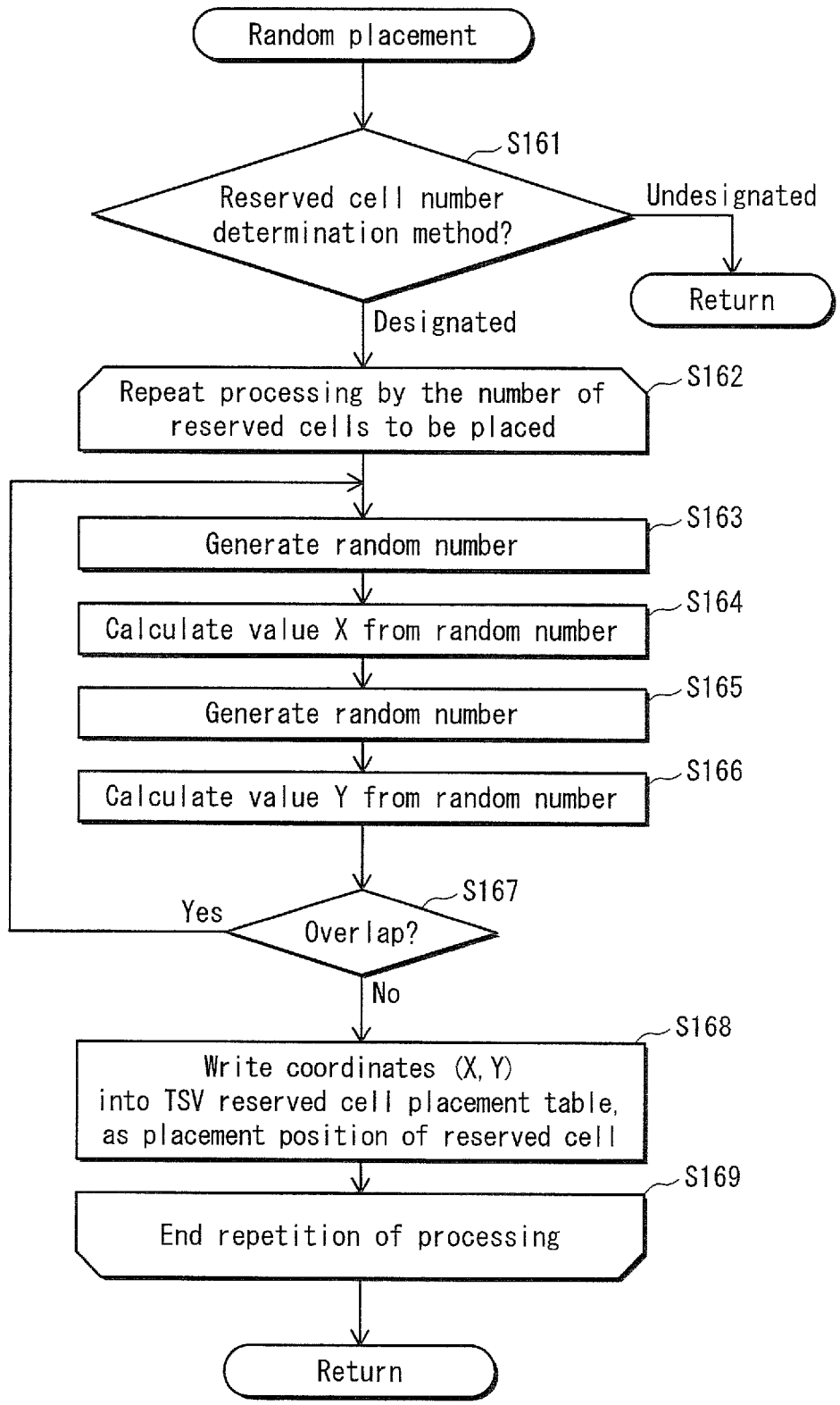
FIG. 31 is a flowchart showing operations for randomly placing reserved cells.

The following describes operations of the random placement subunit 439b of the TSV reserved cell placement subunit 439 with reference to a flowchart shown in FIG. 31. The operations described here are the details of Step S142 shown in FIG. 30.

The random placement subunit 439b judges whether the reserved cell number determination method 460b has a value of "0" or other value (Step S161). When the reserved cell number determination method 460b has a value of "0", the random placement subunit 439b ends processing.

When the reserved cell number determination method 460b has a value of other than "0" (Step S161), the random placement subunit 439b repeatedly performs the following Steps S163 to S168 by the number of reserved cells determined by the placement control subunit 439a (Steps S162 to S169).

The random placement subunit 439b generates a random number that is greater than 0 and smaller than 1 (Step S163), and multiplies the horizontal width of a target region by the generated random number to obtain a coordinate value X (Step S164). Then, the random placement subunit 439b generates a random number that is greater than 0 and smaller than 1 (Step S165), and multiplies the vertical width of the target region by the generated random number to obtain a coordinate value Y (Step S166). The random placement subunit 439b judges whether a reserved cell defined by the coordinates (X,Y) overlaps in placement position with any other cell that has been already determined to be placed (Step S167). When the defined reserved cell overlaps in placement position with any other cell (Step S167), the random placement subunit 439b repeatedly performs processing from Step S163. When the defined reserved cell does not overlap in placement position with any other cell (Step S167), the random placement subunit 439b writes the coordinates (X,Y) into the TSV reserved cell placement table 505, as the placement position of the reserved cell (Step S168).

In this way, the random placement subunit 439b places reserved cells by the number of reserved cells determined to be placed.

(4) Operations of Regular Interval Placement Subunit 439c of TSV Reserved Cell Placement Unit 439

Figure 32:
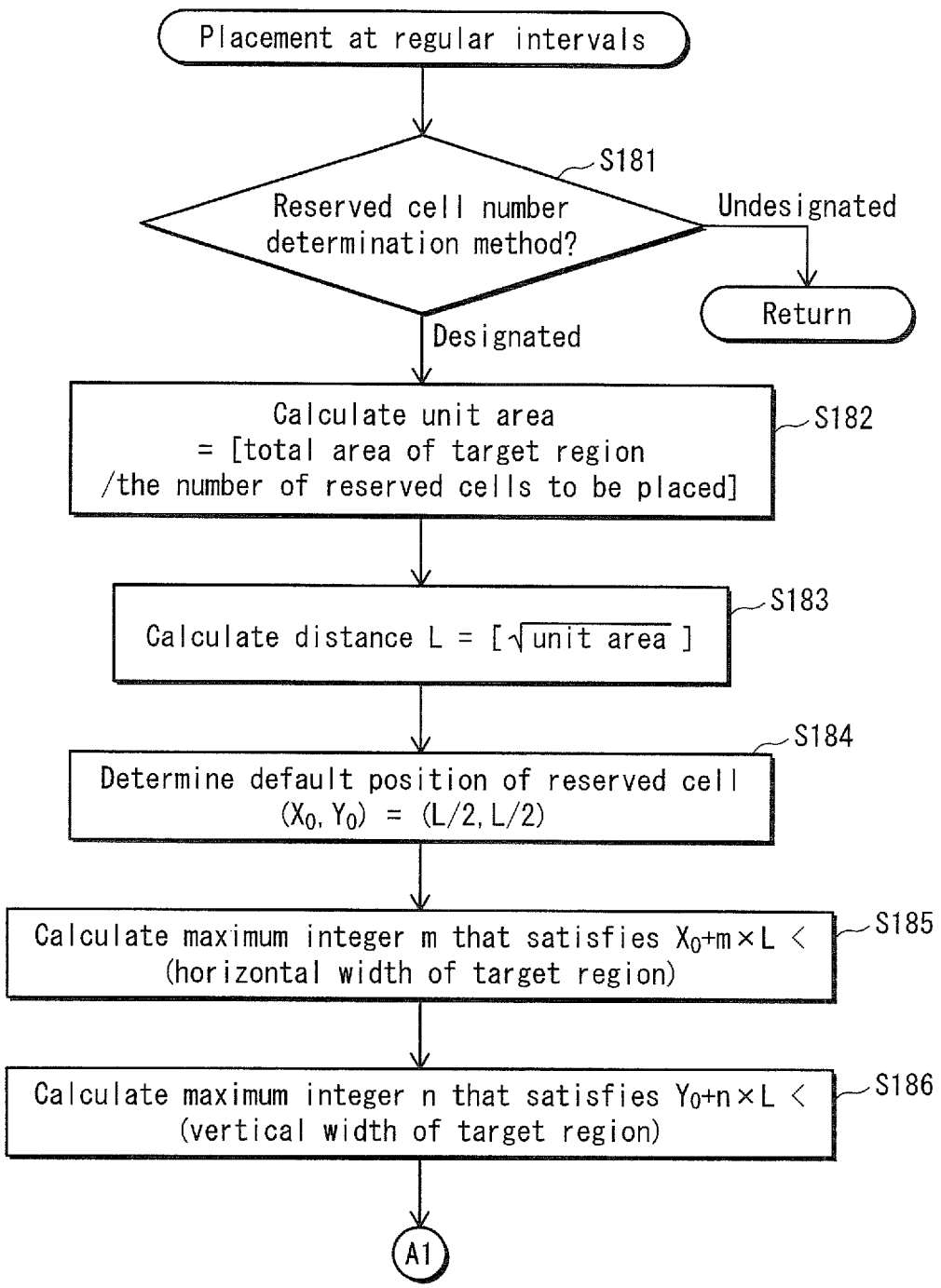
FIG. 32 is a flowchart showing operations for placing reserved cells at regular intervals, continuing to FIG. 33.
Figure 33:
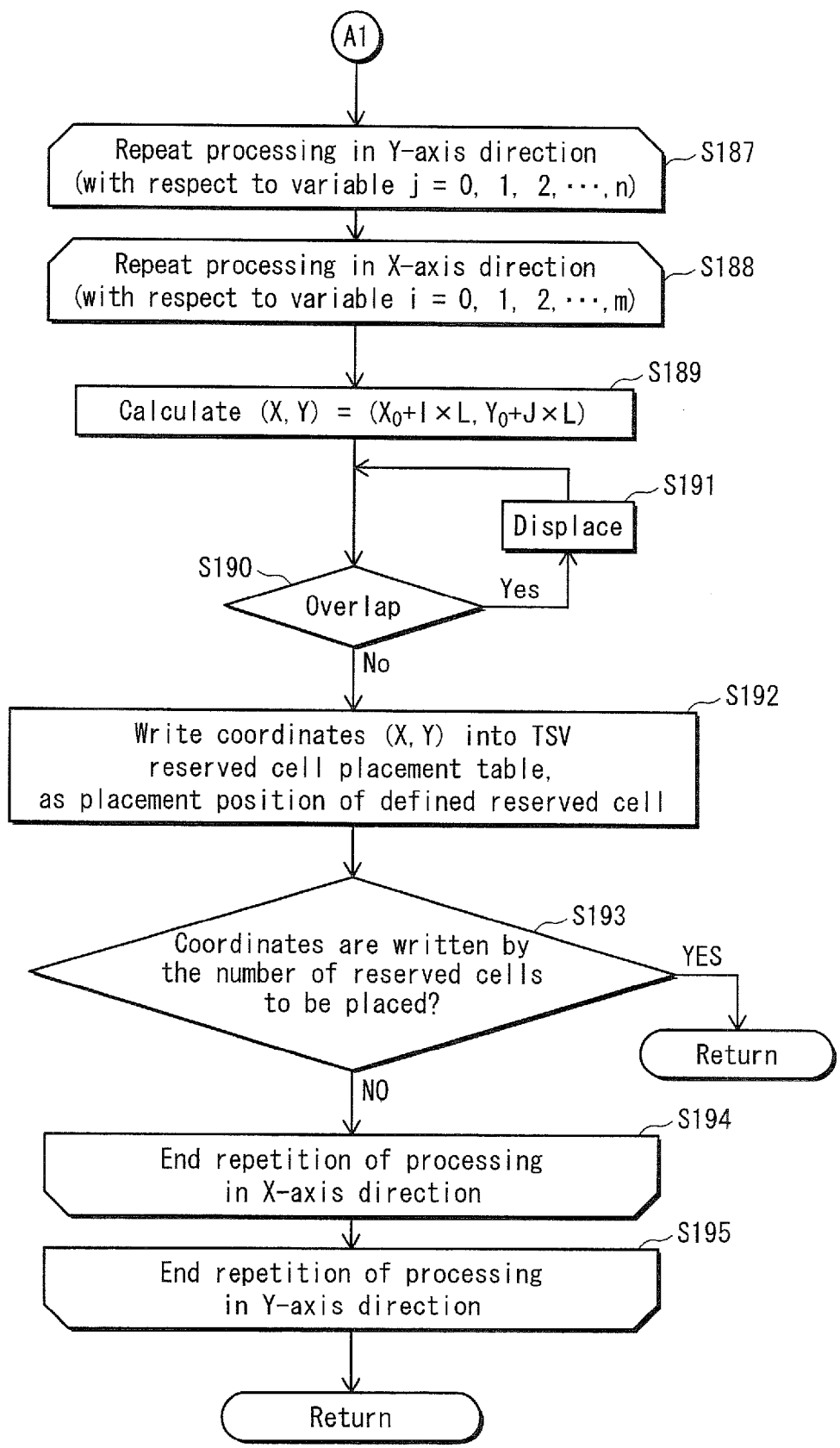
FIG. 33 is a flowchart showing the operations for placing the reserved cells at regular intervals, continuing from FIG. 32.

The following describes operations of the regular interval placement subunit 439c of the TSV reserved cell placement unit 439 with reference to flowcharts shown in FIG. 32 and FIG. 33. The operations described here are the details of Step S143 shown in FIG. 30.

Firstly, the regular interval placement subunit 439c judges whether the reserved cell number determination method 460b has a value of "0" or other value (Step S181). When the reserved cell number determination method 460b has a value of "0" (Step S181), the regular interval placement subunit 439c ends processing.

When the reserved cell number determination method 460b has a value of other than "0" (Step S181), the regular interval placement subunit 439c calculates a unit area=[area of target region/the number of reserved cells to be placed] (Step S182). Then, the regular interval placement subunit 439c calculates a distance L=[square root (unit area)] (Step S183) to set the default position $(X_0,Y_0)=(L/2,L/2)$ where the initial reserved cell is to be placed (Step S184).

Next, the regular interval placement subunit 439c calculates the maximum integer m that satisfies $X_0+m\times L<$(horizontal width of target region) (Step S185), and calculates the maximum integer n that satisfies $Y_0+n\times L<$(vertical width of target region) (Step S186).

The regular interval placement subunit 439c repeatedly performs processing of Steps S188 to S194 on the variable j=0, 1, 2, ..., n in the Y-axis direction (Steps S187 to S195).

The regular interval placement subunit 439c repeatedly performs processing of Steps S189 to S193 on the variable j=0, 1, 2, ..., m in the X-axis direction (Steps S188 to S194).

The regular interval placement subunit 439c calculates $(X,Y)=(X_0+i \times L, Y_0+j \times L)$ (Step S189). The regular interval placement subunit 439c judges whether a reserved cell defined by the coordinates (X,Y) overlaps in placement position with any other cell that has been already determined to be placed (Step S190). When the defined reserved cell overlaps in placement position with any other cell (Step S190), the regular interval placement subunit 439c displaces the placement position of the defined reserved cell such that the defined reserved cell does not overlap in placement position with any other cell (Step S191).

When the defined reserved cell does not overlap in placement position with any other cell (Step S190), the regular interval placement subunit 439c writes the coordinates (X,Y) into the TSV reserved cell placement table 505, as the placement position of the reserved cell (Step S192). The regular interval placement subunit 439c judges whether the coordinates (X,Y) have been written into the TSV reserved cell placement table 505 by the number of reserved cells to be placed (Step S193). When the coordinates (X,Y) have been written by the number of reserved cells to be placed (Step S193), the regular interval placement subunit 439c ends the processing. When the coordinates (X,Y) have not yet been written by the number of reserved cells to be placed (Step S193), the regular interval placement subunit 439c repeatedly performs the processing.

In this way, the regular interval placement subunit 439c places reserved cells by the number of reserved cells determined to be placed.

(5) Operations of Symmetrical Placement Subunit 439e of TSV Reserved Cell Placement Unit 439

Figure 34:
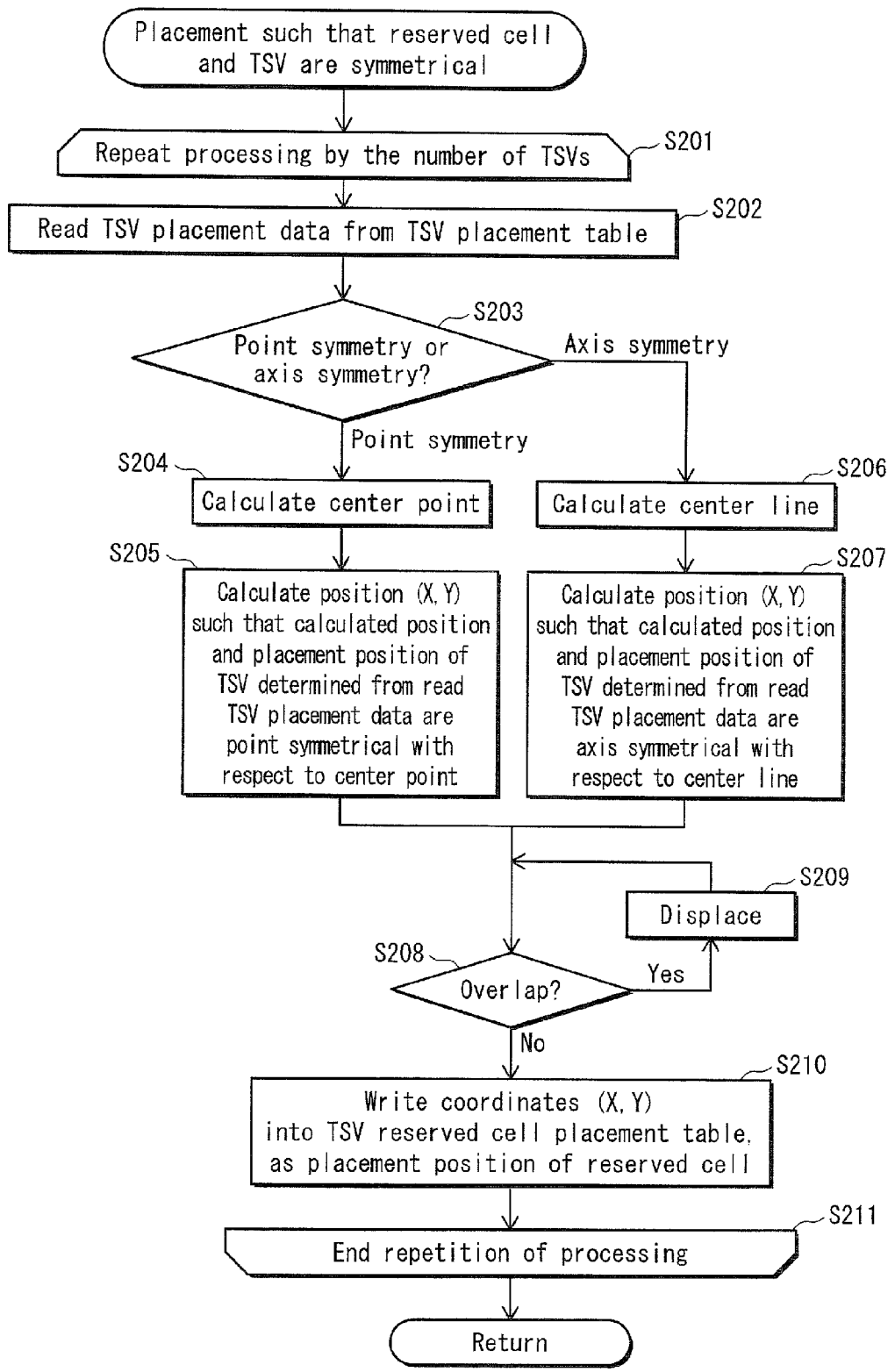
FIG. 34 is a flowchart showing operations for placing reserved cells in respective symmetrical positions.

The following describes operations of the symmetrical placement subunit 439e of the TSV reserved cell placement unit 439 with reference to a flowchart shown in FIG. 34. The operations described here are the details of Step S146 shown in FIG. 30.

The symmetrical placement subunit 439e repeatedly performs processing of Steps S202 to S210 by the number of TSVs to be placed in a target region (Steps S201 to S211).

The symmetrical placement subunit 439e reads one piece of TSV placement data from the TSV placement table 503 (Step S202), obtains center information, and judges which one of axis symmetry and point symmetry is to be formed with use of the obtained center information (Step S203). When point symmetry is to be formed (Step S203), the symmetrical placement subunit 439e calculates the center point of the target region (Step S204), and calculates a position (X,Y) such that the calculated position and a placement position of a TSV defined by the read piece of TSV placement data are symmetrical with respect to the calculated center point (Step S205). When axis symmetry is to be formed (Step S203), the symmetrical placement subunit 439e calculates the center line of the target region (Step S206), and calculates a position (X,Y) such that the calculated position and a placement position of a TSV defined by the read piece of TSV placement data are symmetrical with respect to the calculated center line (Step S207). The symmetrical placement subunit 439e judges whether a reserved cell defined by the coordinates (X,Y) overlaps in placement position with any other cell that has been already determined to be placed (Step S208). When the defined reserved cell overlaps in placement position with any other cell (Step S208), the symmetrical placement subunit 439e displaces the placement position of the defined reserved cell such that the defined reserved cell does not overlap in placement position with any other cell (Step S209).

When the defined reserved cell does not overlap in placement position with any other cell (Step S208), the group placement subunit 439g writes the coordinates (X,Y) into the TSV reserved cell placement table 505, as the placement position of the reserved cell (Step S210).

In this way, the symmetrical placement subunit 439e places reserved cells by the number of reserved cells determined to be placed.

(6) Operations of Equal Distance Placement Subunit 439f of TSV Reserved Cell Placement Unit 439

Figure 35:
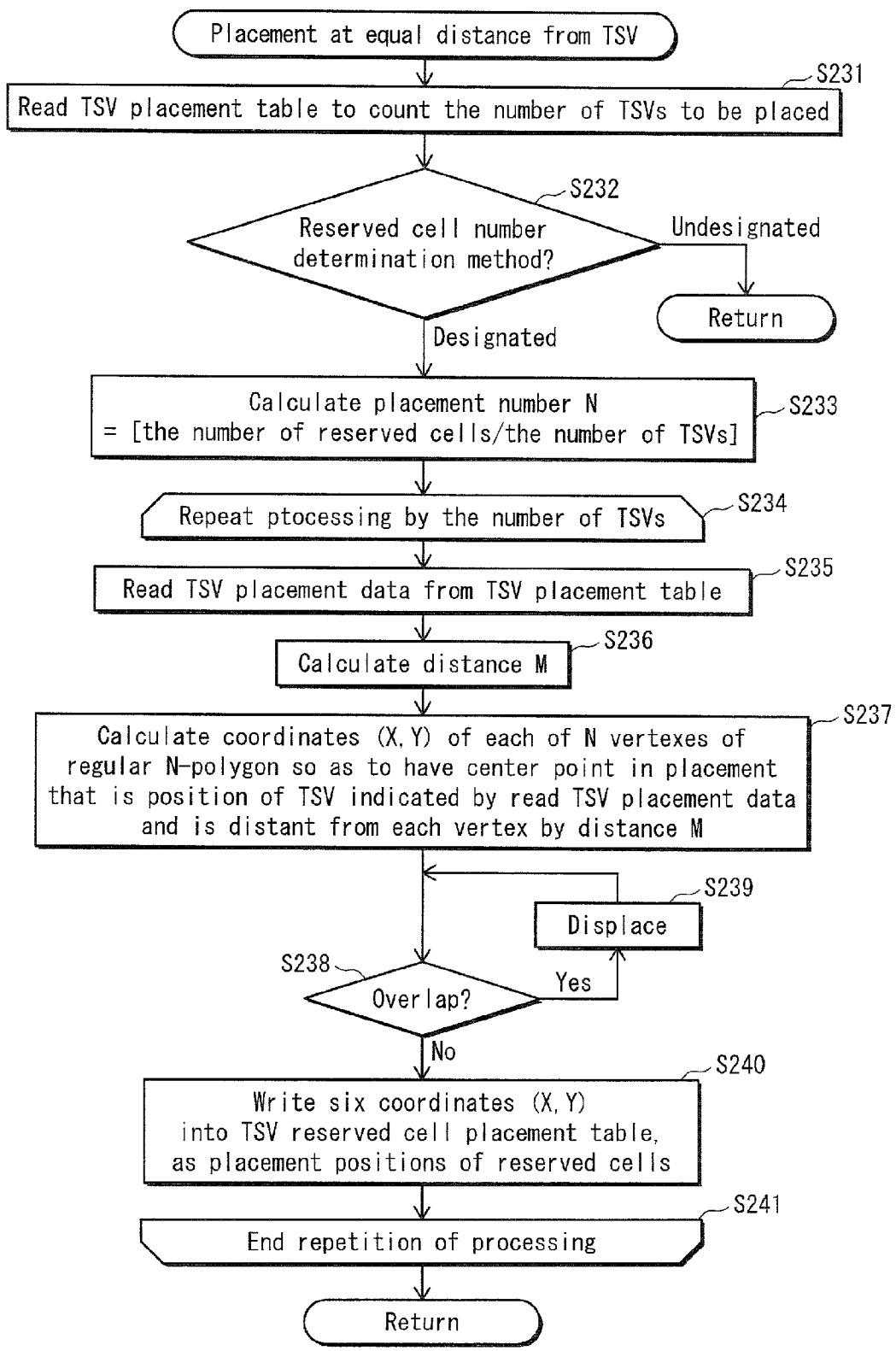
FIG. 35 is a flowchart showing operations for placing reserved cells in respective positions at an equal distance from a placement position of a TSV.

The following describes operations of the equal distance placement subunit 439f of the TSV reserved cell placement unit 439 with reference to a flowchart shown in FIG. 35. The operations described here are the details of Step S147 shown in FIG. 30.

The equal distance placement subunit 439f reads all the pieces of TSV placement data from the TSV placement table 503 stored in the storage subunit 432, and counts the number of the read pieces of TSV placement data to obtain the number of TSVs to be placed (Step S231).

Next, the equal distance placement subunit 439f judges whether the reserved cell number determination method 460b has a value of "0" or other value (Step S232). When the reserved cell number determination method 460b has a value of "0" (Step S232), the equal distance placement subunit 439f ends processing.

When the reserved cell number determination method 460b has a value of other than "0" (Step S232), the equal distance placement subunit 439f calculates the placement number N=[the number of reserved cells to be placed/the number of TSVs to be placed] (Step S233).

The equal distance placement subunit 439f repeatedly performs processing of Steps S235 to S240 by the number of TSVs to be placed in the target region (Steps S234 to S241).

The equal distance placement subunit 439f reads one piece of TSV placement data from the TSV placement table 503 stored in the storage subunit 432 (Step S235), and obtains a distance M (Step S236). Then, the equal distance placement subunit 439f calculates coordinates (X,Y) of each of N vertexes of a regular N-polygon whose center point coincides with a placement position of a TSV indicated by the read piece of TSV placement data and is at the distance M from each vertex (Step S237). The equal distance placement subunit 439f judges whether the reserved cell defined by the coordinates (X,Y) overlaps in placement position with any other cell that has been already determined to be placed (Step S238). When the defined reserved cell overlaps in placement position with any other cell (Step S238), the equal distance placement subunit 439f displaces the placement position of the defined reserved cell such that the defined reserved cell does not overlap in placement position with any other cell (Step S239).

When the defined reserved cell does not overlap in placement position with any other cell (Step S238), the equal distance placement subunit 439f writes the coordinates (X,Y) into the TSV reserved cell placement table 505, as the placement position of the reserved cell (Step S240).

In this way, the equal distance placement subunit 439f places reserved cells by the number of reserved cells determined to be placed.

(7) Operations of Group Placement Subunit 439g of TSV Reserved Cell Placement Unit 439

Figure 36:
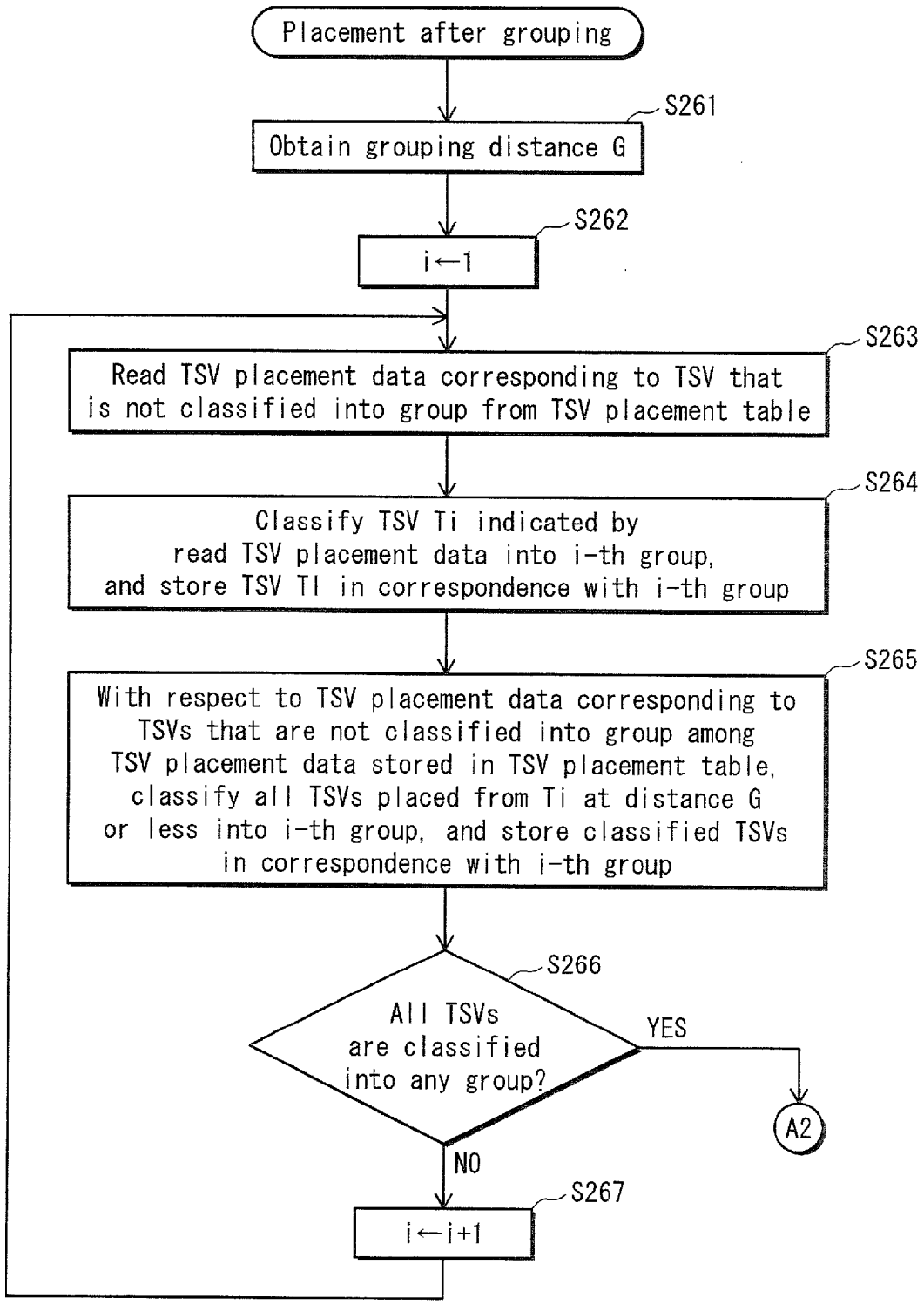
FIG. 36 is a flowchart showing operations for placing a reserved cell with respect to a plurality of TSVs classified into each group, continuing to FIG. 37.
Figure 37:
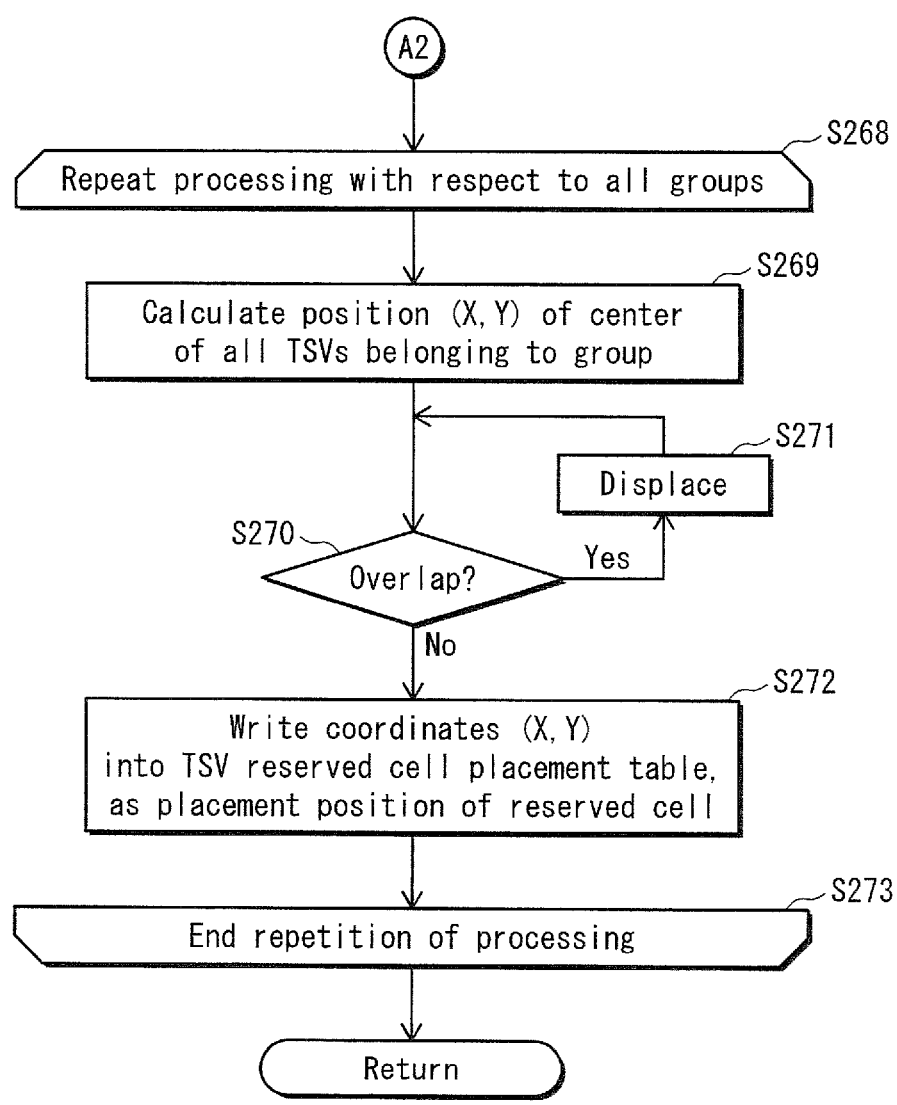
FIG. 37 is a flowchart showing the operations for placing the reserved cell with respect to the TSVs classified into each group, continuing from FIG. 36.

The following describes operations of the group placement subunit 439g of the TSV reserved cell placement unit 439 with reference to flowcharts shown in FIG. 36 and FIG. 37. The operations described here are the details of Step S148 shown in FIG. 30.

The group placement subunit 439g obtains a grouping distance G (Step S261), and sets the variable i to "1" (Step S262).

The group placement subunit 439g reads one piece of TSV placement data corresponding to one of the TSVs that have not yet been classified into any group from the TSV placement table 503 (Step S263), classifies TSV Ti indicated by the read piece of TSV placement data into an i-th group, and stores the TSV Ti in correspondence with the i-th group (Step S264). With respect to pieces of TSV placement data one-to-one corresponding to the TSVs that have not yet been classified into any group among the pieces of TSV placement data stored in the TSV placement table 503, the group placement subunit 439g classifies all the TSVs to be placed at the distance G or less from Ti into the i-th group, and stores the classified TSVs in correspondence with the i-th group (Step S265).

The group placement subunit 439g judges whether all the TSVs have been classified into any group (Step S266). When any of the TSVs has not yet been classified (Step S266), the group placement subunit 439g increments the variable i by 1 (Step S267), and repeatedly performs from Step S263.

When all the TSVs have been classified (Step S266), the group placement subunit 439g repeatedly performs Steps S269 to S272 with respect to each of all the groups (Steps S268 to S273).

The group placement subunit 439g calculates the center position among all the TSVs belonging to the group. For example, the group placement subunit 439g virtually draws a polygon whose vertexes coincide with respective placement positions of all the belonging TSVs, and calculates a position of coordinates (X,Y) of the center of gravity of the polygon (Step S269). Then, the group placement ubunit 439g judges whether a reserved cell defined by the coordinates (X,Y) overlaps in placement position with any other cell that has been already determined to be placed (Step S270). When the defined reserved cell overlaps in placement position with any other cell (Step S270), the group placement subunit 439g displaces the placement position of the defined reserved cell such that the defined reserved cell does not overlap in placement position with any other cell (Step S271).

When the defined reserved cell does not overlap in placement position with any other cell (Step S270), the group placement subunit 439g writes the coordinates (X,Y) into the TSV reserved cell placement table 505, as the placement position of the reserved cell (Step S272).

In this way, the group placement subunit 439g places reserved cells by the number of reserved cells determined to be placed.

1.10 Summary

According to the design support device 400 as described above, in the case where a placement position of a TSV needs to be changed, it is possible to move the placement position of the TSV by performing processing of selecting a reserved cell placed in a desired position to which the TSV is to be moved, replacing the selected reserved cell with the TSV and a placement prohibition region, and correcting wirings for connecting the TSV and the placement prohibition region. At this time, cells other than the reserved cell and the TSV are not moved.

If no reserved cell has been placed beforehand, the following is necessary. In the case where a placement position of a TSV is changed after all the processes of performing place-and-route complete, that is, after Steps S111 to S120 shown in FIG. 29 complete, it is necessary to perform all the processes of Step S115 of placing macro cells to Step S120 of performing detailed routing shown in FIG. 29 after changing the placement position of the TSV. This is because each TSV needs to have a large region around the TSV such as a placement prohibition region and accordingly standard cells and macro cells placed around the TSV need to be moved in order to reserve such a large region. Therefore, if no reserved cell has been placed beforehand, it is necessary to perform all the processes of Step S115 of placing macro cells to Step S120 of performing detailed routing shown in FIG. 29 after changing the placement position of the TSV. This takes long time to correct the placement position of the TSV.

2. Other Modification Examples

Although the present invention has been described based on the above embodiment, the present invention is of course not limited to the above embodiment.

The present invention includes the following cases.

(1) Modification Example of Operations of Place-and-Route Unit 408 of Design Support Device 400

Figure 38:
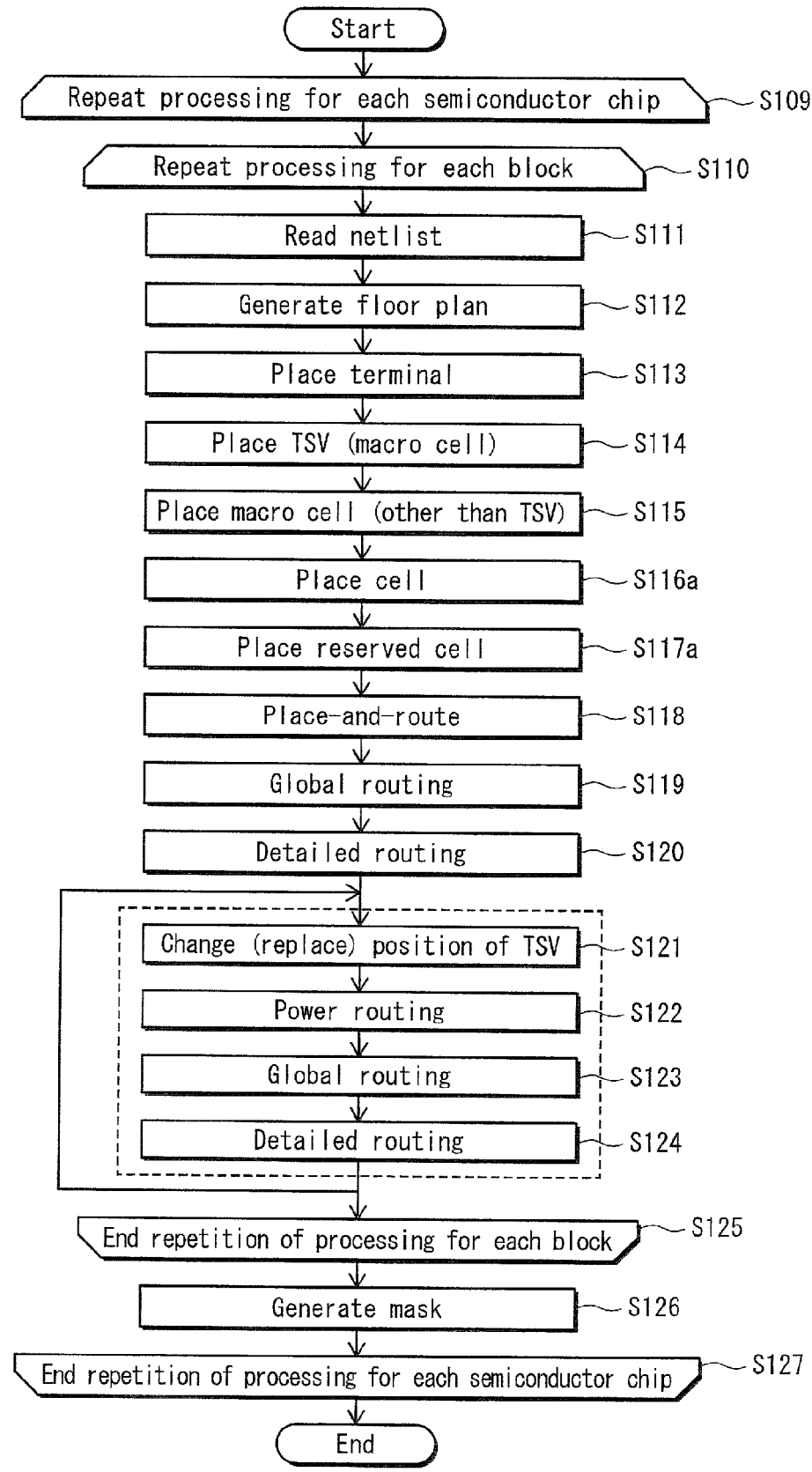
FIG. 38 is a flowchart showing a modification example of the operations of the place-and-route unit 408 of the design support device 400.

The following describes a modification example of the operations of the place-and-route unit 408 of the design support device 400 with reference to a flowchart shown in FIG. 38.

FIG. 38 differs from FIG. 29 in order of generation of the TSV reserved cell placement table 505 and generation of the cell placement table 506.

Namely, FIG. 38 shows that the cell placement subunit 440 generates the cell placement table 506 (Step S116a), and then the TSV reserved cell placement unit 439 generates the TSV reserved cell placement table 505 (Step S117a).

That is, the flowchart shown in FIG. 29 and the flowchart shown in FIG. 38 show the same processing order from Step S111 of reading a netlist to Step S115 of placing macro cells. In the present modification example, Step S116a of placing cells is performed after Step S115, and then Step S117a of placing reserved cells is performed.

In the present modification example, after standard cells are placed, reserved cells are placed in a free region where no standard cell is placed. In this way, the reserved cells are placed after the standard cells are placed. Accordingly, placement of the reserved cells does not hinder satisfaction of timing constraints between the standard cells.

Processing subsequent to Step S118 of place-and-route processing and TSV placement position change processing are the same as those in the embodiment.

Also, in the present modification example, after all the processes of designing the mask layout complete, in other words, when the respective placement positions of all the TSVs are finally confirmed, the region where the TSV and the placement prohibition region have been initially placed are treated as a spare region. In order to make efficient use of the spare region, a repair cell or a thermal-via can be placed in the spare region in the same way as in the embodiment. Alternatively, the spare region may be remained as a free region. Furthermore, in the case where a placement position of a reserved cell is not used as a placement position to which a TSV is to be moved, a repair cell or a thermal-via may be placed in the placement position of the reserved cell. Alternatively, such a reserved cell may be remained without being used.

(2) Modification Example of Placement of TSV and Reserved Cell in Block

Figure 39:
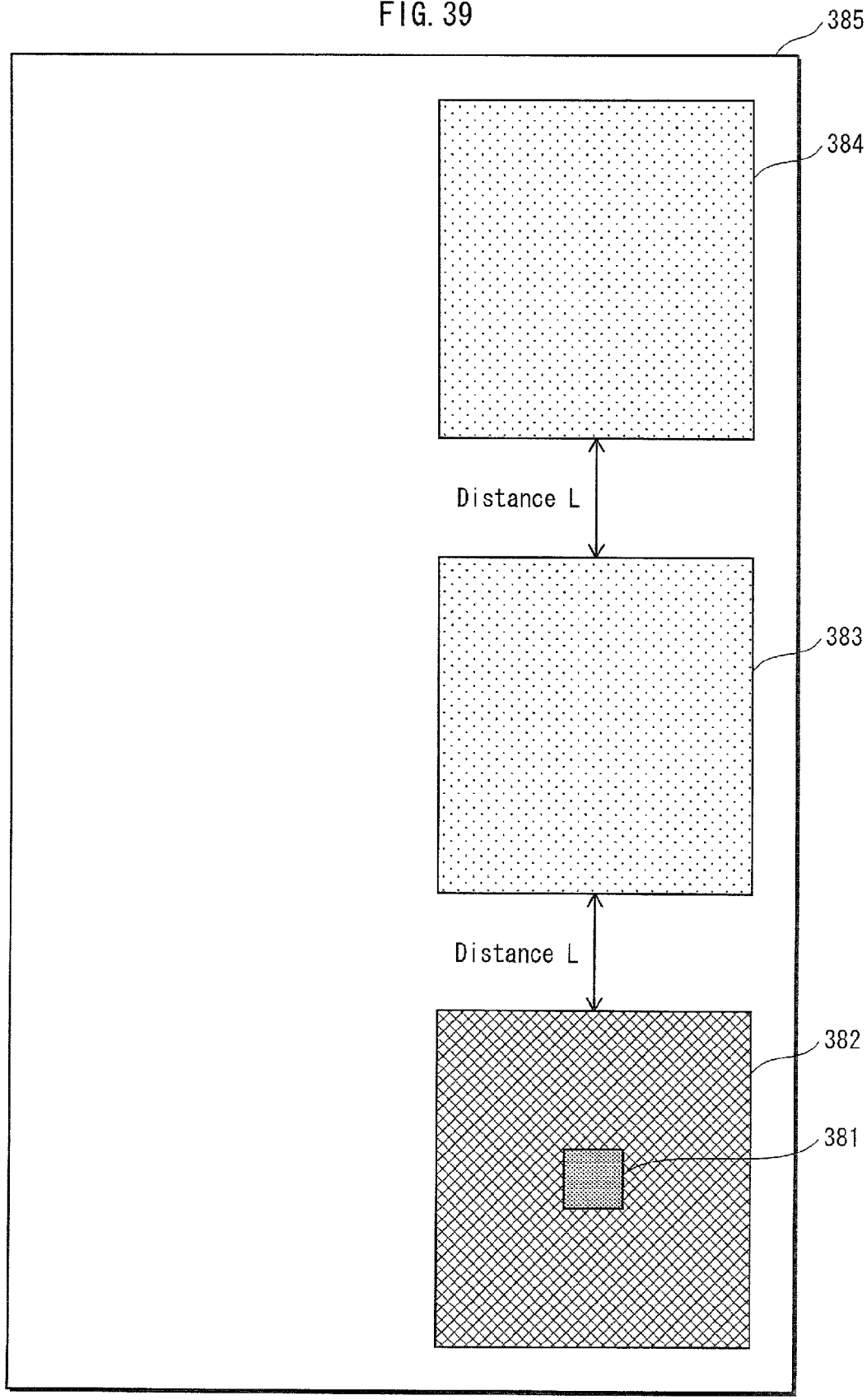
FIG. 39 shows an example of placement of a TSV 381, a placement prohibition region 382, and reserved cells 383 and 384 in a block.

As shown in FIG. 39, it may be possible to employ the structure in which, in a block 385, a TSV 381 is placed, a placement prohibition region 382 is placed around the TSV 381, a reserved cell 383 is placed at a distance L from the placement prohibition region 382, and a reserved cell 384 is placed at the distance L from the reserved cell 383.

(3) In the above embodiment, the design support device 400 places a reserved cell in a block or an overlap region designated with use of the target region designation method 460a. Alternatively, the design support device 400 may place a reserved cell in only a block where a TSV is to be placed or only an overlap region where a TSV is to be placed, without having the target region designation method 460a.

(4) In the above embodiment, the design support device 400 determines the number of reserved cells to be placed with use of a method designated by the reserved cell number determination method 460b. Alternatively, the design support device 400 may determine the number of reserved cells to be placed with use of only one of the above determination methods, without having the reserved cell number determination method 460b.

(5) In the above embodiment, the design support device 400 places reserved cells with use of a method designated by the reserved cell placement position determination method 460c. Alternatively, the design support device 400 may determine respective placement positions of the reserved cells with use of only one of the above placement methods, without having the reserved cell placement position determination method 460c. Further alternatively, the design support device 400 may determine the respective placement positions of the reserved cells with use of two or more of the above placement methods, without having the reserved cell placement position determination method 460c.

(6) In the above embodiment, the design support device 400 places reserved cells with use of a method designated by the TSV-dependent method 460d. Alternatively, the design support device 400 may place the reserved cells with use of only one of the above TSV-dependent methods, without having the TSV-dependent method 460d. Further alternatively, the design support device 400 may place the reserved cells with use of two or more of the above TSV-dependent methods, without having the TSV-dependent method 460d.

(7) In the above embodiment, the three-dimensional integrated circuit is composed of a plurality of semiconductor chips arranged in layers including a first semiconductor chip and a second semiconductor chip that are in contact with each other. The design support device 400 determines respective placement positions of one or more through-vias on the first semiconductor chip, each of which penetrate the first semiconductor chip so as to each connect to the second semiconductor chip, and determines, as respective spare placement positions of the through-vias, respective placement positions of one or more reserved cells on the first semiconductor chip based on the respective placement positions of the through-vias. However, the structure of the design support device relating to the present invention is not limited to this. The following structure may be employed.

The three-dimensional integrated circuit is composed of a plurality of semiconductor chips arranged in layers including a first semiconductor chip, a second semiconductor chip, and a third semiconductor chip, such that the first semiconductor chip is in contact with the second semiconductor chip and the second semiconductor chip is in contact with the third semiconductor chip. The design support device 400 includes a through-via placement unit operable to determine respective placement positions of one or more through-vias on the first semiconductor chip, each of which penetrate the first and second semiconductor chips to connect to the third semiconductor chip; and a reserved cell placement unit operable to determine, as respective spare placement positions of the through-vias, respective placement positions of one or more reserved cells on the first and second semiconductor chips based on the respective placement positions of the through-vias. In this case, the methods of placing reserved cells described in the embodiment may be applied.

Alternatively, the design support device 400 may include a through-via placement unit operable to determine respective placement positions of one or more through-vias on three or more semiconductor chips, each of which penetrate the three or more semiconductor chips to connect to a subsequent semiconductor chip; and a reserved cell placement unit operable to determine, as respective spare placement positions of the through-vias, respective placement positions of one or more reserved cells on the three or more semiconductor chips based on the respective placement positions of the through-vias. In this case, the methods of placing reserved cells described in the embodiment may be applied.

Further alternatively, the design support device 400 may include a through-via placement unit operable to determine respective placement positions of one or more through-vias on a group composed of a plurality of semiconductor chips, each of which penetrate one or more of the plurality of semiconductor chips to connect to a subsequent semiconductor chip; and a reserved cell placement unit operable to determine, as respective spare placement positions of the through-vias, respective placement positions of one or more reserved cells on the chip group based on the respective placement positions of the through-vias. In this case, the methods of placing reserved cells described in the embodiment may be applied.

(8) In the above embodiment, the design method of a three-dimensional integrated circuit has been described as a cell-base design method. Alternatively, the design method may be realized as a mask layout design program according to which all the processes are automated.

(9) The following structure may be employed.

A three-dimensional integrated circuit is composed of a plurality of semiconductor chips arranged in layers including a first semiconductor chip and a second semiconductor chip. A design support device that supports design of the three-dimensional integrated circuit comprises: a through-via placement unit operable to determine respective placement positions of one or more through-vias on the first semiconductor chip, the through-vias each penetrating the first semiconductor chip to connect to the second semiconductor chip; and a reserved cell placement unit operable to determine, based on the respective placement positions of the through-vias, respective placement positions of one or more reserved cells on the first semiconductor chip, as respective spare placement positions of the through-vias.

Here, the first semiconductor chip may include a target region where the through-vias are to be placed and a non-target region where the through-vias are not to be placed. The through-via placement unit may determine the respective placement positions of the through-vias in the target region, and the reserved cell placement unit may determine the respective placement positions of the reserved cells in the target region and suppress or prohibit placement of the reserved cells in the non-target region.

Here, the first semiconductor chip may include a target region where the through-vias are to be placed and a non-target region where the through-vias are not to be placed. The through-via placement unit may determine the respective placement positions of the through-vias in the target region. The reserved cell placement unit may judge whether a partial region of the first semiconductor chip is the target region or the non-target region. When judging that the partial region is the target region, the reserved cell placement unit may determine the respective placement positions of the reserved cells in the partial region. When judging that the partial region is the non-target region, the reserved cell placement unit may suppress or prohibit placement of the reserved cells in the partial region.

Here, the first semiconductor chip may include a target region where the through-vias are to be placed and a non-target region where the through-vias are not to be placed. The through-via placement unit may determine the respective placement positions of the through-vias in the target region. The reserved cell placement unit may judge whether the through-vias are to be placed in a partial region of the first semiconductor chip. When judging that the through-vias are to be placed in the partial region, the reserved cell placement unit may determine the respective placement positions of the reserved cells in the partial region. When judging that the through-vias are not to be placed in the partial region, the reserved cell placement unit may suppress or prohibit placement of the reserved cells in the partial region.

(10) The following structure may be employed.

A three-dimensional integrated circuit is composed of a plurality of semiconductor chips arranged in layers including a first semiconductor chip and a second semiconductor chip. The first semiconductor chip includes a plurality of blocks. A design support device that supports design of the three-dimensional integrated circuit comprises: a through-via placement unit operable to determine respective placement positions of one or more through-vias on the first semiconductor chip, the through-vias each penetrating the first semiconductor chip to connect to the second semiconductor chip; and a reserved cell placement unit operable to determine, based on the respective placement positions of the through-vias, respective placement positions of one or more reserved cells on the first semiconductor chip, as respective spare placement positions of the through-vias. The reserved cell placement unit may switch, for each block, between methods of placing reserved cell on the first semiconductor chip. In other words, the reserved cell placement unit may select and use, for each block, one among a plurality of methods of placing reserved cells on the first semiconductor chip. Here, the plurality of methods of placing reserved cells include, as described in the above embodiment, random placement of reserved cells, placement of reserved cells at regular intervals, placement of reserved cells in respective positions designated by a user, placement of reserved cells such that respective placement positions of the reserved cells and respective placement positions of TSVs are symmetrical, placement of reserved cells in respective positions at an equal distance from a TSV, and placement of reserved cells for each group to which TSVs belong.

(11) The following structure may be employed.

A computer system, which supports design of a three-dimensional integrated circuit that is composed of a plurality of semiconductor chips arranged in layers, comprises: a memory that stores therein a computer program composed of a plurality of computer instructions; and a processor operable to fetch the computer instructions one by one from the computer program stored in the memory, decode the read computer instructions, and operate in accordance with results of the decoded computer instructions. The computer program comprises: a through-via placement program for determining respective placement positions of one or more through-vias on the first semiconductor chip, the through-vias each penetrating the first semiconductor chip to connect to the second semiconductor chip; a reserved cell placement program for determining, based on the respective placement positions of the through-vias, respective placement positions of one or more reserved cells on the first semiconductor chip, as respective spare placement positions of the through-vias; and a generation program for generating layout data that includes the respective placement positions of the through-vias and the respective placement positions of the reserved cells. In this case, the methods of placing reserved cells described in the embodiment may be applied.

The following structure may be employed.

A design support device, which supports design of a three-dimensional integrated circuit that is composed of a plurality of semiconductor chips arranged in layers including a first semiconductor chip and a second semiconductor chip, comprises: a through-via placement unit operable to determine respective placement positions of one or more through-vias on the first semiconductor chip, the through-vias each penetrating the first semiconductor chip to connect to the second semiconductor chip; a reserved cell placement unit operable to determine, based on the respective placement positions of the through-vias, respective placement positions of one or more reserved cells on the first semiconductor chip, as respective spare placement positions of the through-vias; a cell wiring placement position unit operable to determine respective placement positions of other cells and wirings on the first semiconductor chip; and a generation unit operable to generate layout data that includes the respective placement positions of the through-vias, the respective placement positions of the reserved cells, and the respective placement positions of the other cells and the wirings.

The following structure may be employed.

A design support method, which is for use in a design support device that supports design of a three-dimensional integrated circuit that is composed of a plurality of semiconductor chips arranged in layers including a first semiconductor chip and a second semiconductor chip. The design support device comprises: a through-via placement unit; a reserved cell placement unit; and a generation unit. The design support method comprises: a through-via placing step of determining, by the through-via placement unit, respective placement positions of one or more through-vias on the first semiconductor chip, the through-vias each penetrating the first semiconductor chip to connect to the second semiconductor chip; a reserved cell placing step of determining, by the reserved cell placement unit, based on the respective placement positions of the through-vias, respective placement positions of one or more reserved cells on the first semiconductor chip, as respective spare placement positions of the through-vias; and a generating step of generating, by the generation unit, layout data that includes the respective placement positions of the through-vias and the respective placement positions of the reserved cells.

The following structure may be employed.

A computer program, which is for use in a design support device that supports design of a three-dimensional integrated circuit that is composed of a plurality of semiconductor chips arranged in layers including a first semiconductor chip and a second semiconductor chip. The design support device comprises: a through-via placement unit; a reserved cell placement unit; and a generation unit. The computer program causes the design support device that is a computer to perform: a through-via placing step of determining, by the through-via placement unit, respective placement positions of one or more through-vias on the first semiconductor chip, the through-vias each penetrating the first semiconductor chip to connect to the second semiconductor chip; a reserved cell placing step of determining, by the reserved cell placement unit, based on the respective placement positions of the through-vias, respective placement positions of one or more reserved cells on the first semiconductor chip, as respective spare placement positions of the through-vias; and a generating step of generating, by the generation unit, layout data that includes the respective placement positions of the through-vias and the respective placement positions of the reserved cells.

The following structure may be employed.

A recording medium having recorded therein a computer program for design support, which is for use in a design support device that supports design of a three-dimensional integrated circuit that is composed of a plurality of semiconductor chips arranged in layers including a first semiconductor chip and a second semiconductor chip. The design support device comprises: a through-via placement unit; a reserved cell placement unit; and a generation unit. The computer program causes the design support device that is a computer to perform: a through-via placing step of determining, by the through-via placement unit, respective placement positions of one or more through-vias on the first semiconductor chip, the through-vias each penetrating the first semiconductor chip to connect to the second semiconductor chip; a reserved cell placing step of determining, by the reserved cell placement unit, based on the respective placement positions of the through-vias, respective placement positions of one or more reserved cells on the first semiconductor chip, as respective spare placement positions of the through-vias; and a generating step of generating, by the generation unit, layout data that includes the respective placement positions of the through-vias and the respective placement positions of the reserved cells.

(12) The following structure may be employed.

One aspect of the present invention is a design support device that supports design of a three-dimensional integrated circuit that is composed of a plurality of semiconductor chips arranged in layers including a first semiconductor chip and a second semiconductor chip, the design support device comprising: a through-via placement unit operable to determine respective placement positions of one or more through-vias on the first semiconductor chip, the through-vias each penetrating the first semiconductor chip to connect to the second semiconductor chip; a reserved cell placement unit operable to determine, based on the respective placement positions of the through-vias, respective placement positions of one or more reserved cells on the first semiconductor chip, as respective spare placement positions of the through-vias; and a generation unit operable to generate layout data that includes the respective placement positions of the through-vias and the respective placement positions of the reserved cells.

With this structure, in the case where a placement position of a TSV needs to be changed during the design phase of a three-dimensional integrated circuit, it is possible to use a placement position of a reserved cell that has been determined beforehand as a new placement position of the TSV after change. This exhibits an excellent effect of avoiding a large design change in other circuit parts.

Here, the first semiconductor chip may include a target region where the through-vias are to be placed, the through-via placement unit may determine the respective placement positions of the through-vias in the target region, and the reserved cell placement unit may determine the respective placement positions of the reserved cells in the target region.

With this structure, the reserved cells are placed in the same target region where the through-vias are placed. Accordingly, the respective placement positions of the reserved cells are likely to be used as respective new placement positions of the through-vias after change.

Here, the plurality of semiconductor chips may each include one block, and the target region may be the block.

With this structure, the reserved cells are placed in the same block where the through-vias are placed. Accordingly, the respective placement positions of the reserved cells are likely to be used as respective new placement positions of the through-vias after change.

Here, the first semiconductor chip may include a first block, and the second semiconductor chip may include a second block, the first block and the second block may have an overlap region overlapping therebetween, the overlap region may coincide with part or all of the second block in a direction perpendicular to a surface of the overlap region, and the target region may be the overlap region.

With this structure, the reserved cells are placed in the same overlap region where the through-vias are placed. Accordingly, the respective placement positions of the reserved cells are likely to be used as respective new positions of the through-vias after change.

Here, the reserved cell placement unit may randomly determine the respective placement positions of the reserved cells in the target region.

With this structure, the reserved cells are randomly placed in the target region where the through-vias are placed. Accordingly, the respective placement positions of the reserved cells are likely to be used as respective new placement positions of the through-vias after change.

Here, the reserved cell placement unit may determine the number of reserved cells to be placed in the target region such that a ratio of a total area of the reserved cells to an area of the target region is a designated ratio.

With this structure, reserved cells, whose number satisfies the designated area ratio, are placed in the target region where the through-vias are placed. Accordingly, the respective placement positions of the reserved cells are likely to be used as respective new placement positions of the through-vias after change.

Here, the designated ratio may be 1% to 5%.

Here, the reserved cell placement unit may determine the respective placement positions of the reserved cells in the target region such that the respective placement positions of the reserved cells and the respective placement positions of the through-vias are symmetrical.

With this structure, the respective placement positions of the reserved cells are likely to be used as respective new placement positions of the through-vias after change.

Here, the reserved cell placement unit may define one axis of the target region, and the reserved cell placement unit may determine the respective placement positions of the reserved cells in the target region such that the respective placement positions of the reserved cells and the respective placement positions of the through-vias are axis symmetrical with respect to the defined axis.

Here, the reserved cell placement unit may define one point of the target region, and the reserved cell placement unit may determine the respective placement positions of the reserved cells in the target region such that the respective placement positions of the reserved cells and the respective placement positions of the through-vias are point symmetrical with respect to the defined point.

Here, the reserved cell placement unit may determine the respective placement positions of the reserved cells in the target region such that a plurality of reserved cells are placed in respective positions at an equal distance from a placement position of each of the through-vias.

With this structure, a plurality of reserved cells are placed in respective positions at an equal distance from a placement position of each of the through-vias. Accordingly, the respective placement positions of the reserved cells are likely to be used as respective new placement positions of the through-vias after change.

Here, the reserved cell placement unit may determine the distance so as to be inversely proportional to an operating speed of a circuit provided in the target region.

Here, the reserved cell placement unit may determine the respective placement positions of the reserved cells in the target region such that a placement position of one reserved cell is equally distant from respective placement positions of a plurality of reserved cells that are each adjacent to the one reserved cell.

With this structure, a plurality of reserved cells are placed at regular intervals. Accordingly, the respective placement positions of the reserved cells are likely to be used as respective new placement positions of the through-vias after change.

Here, the reserved cell placement unit may classify the through-vias into one or more groups, and determine a placement position of one reserved cell based on respective placement positions of one or more through-vias belonging to each of the groups.

With this structure, one reserved cell is placed based on respective placement positions of one or more through-vias belonging to each of one or more groups. Accordingly, the respective placement positions of the reserved cells are likely to be used as respective new placement positions of the through-vias after change.

Here, the reserved cell placement unit may classify the through-vias such that through-vias that are to be placed adjacent to each other belong to a same group.

Here, the reserved cell placement unit may determine the respective placement positions of the reserved cells such that one reserved cell is placed in a center of respective placement positions of through-vias belonging to each of the groups.

Also, another one aspect of the present invention is a design support method for use in a design support device that supports design of a three-dimensional integrated circuit that is composed of a plurality of semiconductor chips arranged in layers including a first semiconductor chip and a second semiconductor chip, the design support method comprising: a through-via placing step of determining respective placement positions of one or more through-vias on the first semiconductor chip, the through-vias each penetrating the first semiconductor chip to connect to the second semiconductor chip; a reserved cell placing step of determining, based on the respective placement positions of the through-vias, respective placement positions of one or more reserved cells on the first semiconductor chip, as respective spare placement positions of the through-vias; and a generating step of generating layout data that includes the respective placement positions of the through-vias and the respective placement positions of the reserved cells.

With this method, in the case where a placement position of a TSV needs to be changed during the design phase of a three-dimensional integrated circuit, it is possible to use a placement position of a reserved cell that has been determined beforehand as a new placement position of the TSV after change. This exhibits an excellent effect of avoiding a large design change in other circuit parts.

Also, another one aspect of the present invention is a computer program for design support for use in a design support device that supports design of a three-dimensional integrated circuit that is composed of a plurality of semiconductor chips arranged in layers including a first semiconductor chip and a second semiconductor chip, the computer program causing the design support device that is a computer to perform: a through-via placing step of determining respective placement positions of one or more through-vias on the first semiconductor chip, the through-vias each penetrating the first semiconductor chip to connect to the second semiconductor chip; a reserved cell placing step of determining, based on the respective placement positions of the through-vias, respective placement positions of one or more reserved cells on the first semiconductor chip, as respective spare placement positions of the through-vias; and a generating step of generating layout data that includes the respective placement positions of the through-vias and the respective placement positions of the reserved cells.

With this computer program, in the case where a placement position of a TSV needs to be changed during the design phase of a three-dimensional integrated circuit, it is possible to use a placement position of a reserved cell that has been determined beforehand as a new placement position of the TSV after change. This exhibits an excellent effect of avoiding a large design change in other circuit parts.

Also, another one aspect of the present invention is a recording medium having recorded therein a computer program for design support for use in a design support device that supports design of a three-dimensional integrated circuit that is composed of a plurality of semiconductor chips arranged in layers including a first semiconductor chip and a second semiconductor chip, the computer program causing the design support device that is a computer to perform: a through-via placing step of determining respective placement positions of one or more through-vias on the first semiconductor chip, the through-vias each penetrating the first semiconductor chip to connect to the second semiconductor chip; a reserved cell placing step of determining, based on the respective placement positions of the through-vias, respective placement positions of one or more reserved cells on the first semiconductor chip, as respective spare placement positions of the through-vias; and a generating step of generating layout data that includes the respective placement positions of the through-vias and the respective placement positions of the reserved cells.

With the computer program recorded in the recording medium, in the case where a placement position of a TSV needs to be changed during the design phase of a three-dimensional integrated circuit, it is possible to use a placement position of a reserved cell that has been determined beforehand as a new placement position of the TSV after change. This exhibits an excellent effect of avoiding a large design change in other circuit parts.

(13) One aspect of the present invention is a mask layout design method of a three-dimensional integrated circuit. According to the mask layout design method, reserved cells for silicon through-vias are included in a cell library, the reserved cells are placed before placing standard cells. In the case where respective placement positions of the silicon through-vias are changed after placing the standard cells other than the reserved cells, the reserved cells are removed and the silicon through-vias are placed instead. As a result, a range that needs to be corrected is only wiring layers.

Also, another one aspect of the present invention is a mask layout design program of a three-dimensional integrated circuit and a recording medium having recorded therein the program. According to the mask layout design method, reserved cells for silicon through-vias are included in a cell library, the reserved cells are placed before placing standard cells. In the case where respective placement positions of the silicon through-vias are changed after placing the standard cells other than the reserved cells, the reserved cells are removed and the silicon through-vias are placed instead. As a result, a range that needs to be corrected is only wiring layers.

Here, after respective placement positions of the silicon through-vias are finally confirmed, any of the reserved cells, which has not been used, may be replaced with a repair cell for logic correction.

Also, after respective placement positions of the silicon through-vias are finally confirmed, any of the reserved cells, which has not been used, may be replaced with a thermal-via for heat dissipation.

Also, another one aspect of the present invention is a mask layout design method of a three-dimensional integrated circuit. According to the mask layout design method, reserved cells for silicon through-vias are included in a cell library, the reserved cells are placed in a free region after placing standard cells. In the case where respective placement positions of the silicon through-vias are changed after placing the standard cells other than the reserved cells, the reserved cells are removed and the silicon through-vias are placed instead. As a result, a range that needs to be corrected is only wiring layers.

Also, another one aspect of the present invention is a mask layout design program of a three-dimensional integrated circuit and a recording medium having recorded therein the program. According to the mask layout design method, reserved cells for silicon through-vias are included in a cell library, the reserved cells are placed in a free region after placing standard cells. In the case where respective placement positions of the silicon through-vias are changed after placing the standard cells other than the reserved cells, the reserved cells are removed and the silicon through-vias are placed instead. As a result, a range that needs to be corrected is only wiring layers.

Here, after respective placement positions of the silicon through-vias are finally confirmed, any of the reserved cells, which has not been used, may be replaced with a repair cell for logic correction.

Also, after respective placement positions of the silicon through-vias are finally confirmed, any of the reserved cells, which has not been used, may be replaced with a thermal-via for heat dissipation.

(14) The design support device is specifically a computer system that is composed of a microprocessor, a ROM, a RAM, a hard disk unit, a display unit, a keyboard, a mouse, and so on. The RAM or the hard disk unit stores therein a computer program. Here, the computer program is composed of combinations of instruction codes each indicating an instruction to a computer so as to achieve predetermined functions. Functions of the design support device are achieved by the microprocessor operating in accordance with the computer program. In other words, the microprocessor reads the instructions contained in the computer program one by one, decodes the read instructions, and operates in accordance with a result of the decoding.

Note that the design support device is not limited to a computer system including all of a microprocessor, a ROM, a RAM, a hard disk unit, a display unit, a keyboard, a mouse, and so on. The design support device may be a computer system including part of these elements.

Furthermore, owing to the microprocessor operating in accordance with the instructions contained in the computer program stored in the RAM or the hard disk unit, it is possible to make the computer program and the microprocessor appear as if the computer program and the microprocessor constituted a single hardware circuit and this hardware circuit are operating.

(15) Part or all of the structural elements of the design support device may be implemented as a single system LSI (Large Scale Integration). The system LSI is a super multi-functional LSI manufactured by integrating a plurality of structural units onto a single chip, and specifically is a computer system including a microprocessor, a ROM, a RAM and so on. The RAM stores therein a computer program. Functions of each of the system LSI are achieved by the microprocessor operating in accordance with the computer program.

Also, each of the structural elements of the design support device may be separately integrated into a single chip, or integrated into a single chip including part or all of the structural elements. Furthermore, the LSI may be called an IC, a system LSI, a super LSI, and an ultra LSI, depending on the integration degree.

A method of circuit integration is not limited to an LSI, and may be realized by a dedicated circuit or a general processor. Furthermore, it may be possible to use an FPGA (Field Programmable Gate Array) programmable after manufacturing LSIs or a reconfigurable processor in which connection and setting of a circuit cell inside an LSI is reconfigurable after manufacturing LSIs.

Furthermore, when a new technology for forming integrated circuits that replaces LSIs becomes available as a result of progress in semiconductor technology or semiconductor-derived technologies, functional blocks may be integrated using such technology. One possibility lies in adaptation of biotechnology.

(16) Part or all of the structural elements of the design support device may be composed of an IC card detachable from the device or a single module. The IC card or the module is a computer system composed of a microprocessor, a ROM, a RAM, and so on. The IC card or the module may include the above super multifunctional LSI. Functions of the IC card or the module are achieved by the microprocessor operating in accordance with a computer program. The IC card or the module may be each tamper-resistant.

(17) The present invention may be the above-described method. Also, the present invention may be a computer program for realizing the methods by a computer or a digital signal each composed of the computer program.

Furthermore, the present invention may be a computer-readable recording medium such as a flexible disk, a hard disk, a CD-ROM, an MO, a DVD, a DVD-ROM, a DVD-RAM, a BD (Blu-ray Disc), and a semiconductor memory, which records therein the computer program or the digital signal. Furthermore, the present invention may be the computer program or the digital signal each recorded in the recording medium.

Also, the present invention may be the computer program or the digital signal transmitted via an electric communication network, a wireless or wired communication network, a network such as the Internet, data broadcasting, or the like.

Furthermore, the present invention may be a computer system that includes a microprocessor and a memory. The memory may store therein the computer program, and the microprocessor may operate in accordance with the computer program.

Furthermore, the present invention may be implemented by another computer system, by transmitting the computer program or the digital signal each recorded in the recording medium to the other computer system, or by transmitting the computer program or the digital signal to the other computer system via the network.

(18) The present invention may be any combination of the above embodiment and modification examples.

INDUSTRIAL APPLICABILITY

The design support device and the design support method of a three-dimensional integrated circuit relating to the present invention are each useful as an art of supporting design of a three-dimensional integrated circuit composed of a plurality of layered semiconductor integrated circuit chips. This is because in the case where respective placement positions of TSVs are changed during the design phase of a three-dimensional integrated circuit, respective placement positions of reserved cells which have been determined beforehand can be used as respective new placement positions of the TSVs, and a large design change in other circuit parts can be avoided.

REFERENCE SIGNS LIST 400 design support device
401 logic synthesis library storage unit
402 source file storage unit
403 logic synthesis unit
404 constraints storage unit
405 netlist storage unit
406 place-and-route constraints storage unit
407 place-and-route library storage unit
408 place-and-route unit
409 layout data storage unit
410 layout data verification unit
411 verification data storage unit
412 mask output unit
413 editor
431 reading unit
432 storage unit
433 control unit
435 floor plan generation unit
436 pin placement unit
437 TSV placement unit
438 macro placement unit
439 TSV reserved cell placement unit
440 cell placement unit
441 power routing unit
442 global routing unit
443 detailed routing unit
444 TSV position change unit
445 mask data generation unit

The invention claimed is:

1. A design support device that supports design of a three-dimensional integrated circuit that is composed of a plurality of semiconductor chips arranged in layers including a first semiconductor chip and a second semiconductor chip, the design support device comprising:
a non-transitory memory device that stores a program; and
a processing device that executes the program to cause the design support device to operate as:
a through-via placement unit operable to determine respective placement positions of one or more through-vias on the first semiconductor chip, the through-vias each penetrating the first semiconductor chip to connect to the second semiconductor chip;
a reserved cell placement unit operable to determine, based on the respective placement positions of the through-vias that have already been determined by the through-via placement unit, respective placement positions of one or more reserved cells on the first semiconductor chip where all other cells are prohibited from being placed, the reserved cells each penetrating the first semiconductor chip, and the respective placement positions of the reserved cells each being at a distance from a corresponding one of the respective placement positions of the through-vias; and
a generation unit operable to generate layout data that includes the respective placement positions of the through-vias and the respective placement positions of the reserved cells,
wherein when the design of the three-dimensional integrated circuit is changed such that the placement positions of the through-vias determined by the through-via placement unit are changed, the respective placement positions of the reserved cells are determined as respective new placement positions of the through-vias after the change.

2. The design support device of claim 1, wherein
the first semiconductor chip includes a target region where the through-vias are to be placed,
the through-via placement unit determines the respective placement positions of the through-vias in the target region, and
the reserved cell placement unit determines the respective placement positions of the reserved cells in the target region.

3. The design support device of claim 2, wherein
the plurality of semiconductor chips each include one block, and
the target region is the block.

4. The design support device of claim 2, wherein
the first semiconductor chip includes a first block, and the second semiconductor chip includes a second block,
the first block and the second block have an overlap region overlapping therebetween,
the overlap region coincides with part or all of the second block in a direction perpendicular to a surface of the overlap region, and
the target region is the overlap region.

5. The design support device of claim 2, wherein
the reserved cell placement unit randomly determines the respective placement positions of the reserved cells in the target region.

6. The design support device of claim 2, wherein
the reserved cell placement unit determines the number of reserved cells to be placed in the target region such that a ratio of a total area of the reserved cells to an area of the target region is a designated ratio.

7. The design support device of claim 6, wherein
the designated ratio is 1% to 5%.

8. The design support device of claim 2, wherein
the reserved cell placement unit determines the respective placement positions of the reserved cells in the target region such that the respective placement positions of the reserved cells and the respective placement positions of the through-vias are symmetrical.

9. The design support device of claim 8, wherein
the reserved cell placement unit defines one axis of the target region, and
the reserved cell placement unit determines the respective placement positions of the reserved cells in the target region such that the respective placement positions of the reserved cells and the respective placement positions of the through-vias are axis symmetrical with respect to the defined axis.

10. The design support device of claim 8, wherein
the reserved cell placement unit defines one point of the target region, and
the reserved cell placement unit determines the respective placement positions of the reserved cells in the target region such that the respective placement positions of the reserved cells and the respective placement positions of the through-vias are point symmetrical with respect to the defined point.

11. The design support device of claim 2, wherein
the reserved cell placement unit determines the respective placement positions of the reserved cells in the target region such that a plurality of reserved cells are placed in respective positions at an equal distance from a placement position of each of the through-vias.

12. The design support device of claim 11, wherein
the reserved cell placement unit determines the distance so as to be inversely proportional to an operating speed of a circuit provided in the target region.

13. The design support device of claim 2, wherein
the reserved cell placement unit determines the respective placement positions of the reserved cells in the target region such that a placement position of one reserved cell is equally distant from respective placement positions of a plurality of reserved cells that are each adjacent to the one reserved cell.

14. The design support device of claim 2, wherein
the reserved cell placement unit classifies the through-vias into one or more groups, and determines a placement position of one reserved cell based on respective placement positions of one or more through-vias belonging to each of the groups.

15. The design support device of claim 14, wherein
the reserved cell placement unit classifies the through-vias such that through-vias that are to be placed adjacent to each other belong to a same group.

16. The design support device of claim 15, wherein
the reserved cell placement unit determines the respective placement positions of the reserved cells such that one reserved cell is placed in a center of respective placement positions of through-vias belonging to each of the groups.

17. A design support method for use in a design support device including (i) a non-transitory memory that stores a program and (ii) a processing device that executes the program to cause the design support device to perform the design support method, the design support device supporting design of a three-dimensional integrated circuit that is composed of a plurality of semiconductor chips arranged in layers including a first semiconductor chip and a second semiconductor chip, the design support method comprising:
a through-via placing step of, using the processing device, respective placement positions of one or more through-vias on the first semiconductor chip, the through-vias each penetrating the first semiconductor chip to connect to the second semiconductor chip;
a reserved cell placing step of determining, based on the respective placement positions of the through-vias that have already been determined by the through-via placing step, respective placement positions of one or more reserved cells on the first semiconductor chip where all other cells are prohibited from being placed, the reserved cells each penetrating the first semiconductor chip, and the respective placement positions of the reserved cells each being at a distance from a corresponding one of the respective placement positions of the through-vias;
a generating step of generating layout data that includes the respective placement positions of the through-vias and the respective placement positions of the reserved cells,
wherein when the design of the three-dimensional integrated circuit is changed such that the placement positions of the through-vias determined in the through-via placing step are changed, the respective placement positions of the reserved cells are determined as respective new placement positions of the through-vias after the change.

18. A non-transitory computer readable recording medium having recorded therein a computer program for design support for use in a design support device that supports design of a three-dimensional integrated circuit that is composed of a plurality of semiconductor chips arranged in layers including a first semiconductor chip and a second semiconductor chip, the computer program causing the design support device that is a computer to perform:
a through-via placing step of determining respective placement positions of one or more through-vias on the first semiconductor chip, the through-vias each penetrating the first semiconductor chip to connect to the second semiconductor chip;
a reserved cell placing step of determining, based on the respective placement positions of the through-vias that have already been determined by the through-via placing step, respective placement positions of one or more reserved cells on the first semiconductor chip where all other cells are prohibited from being placed, the reserved cells each penetrating the first semiconductor chip, and the respective placement positions of the reserved cells each being at a distance from a corresponding one of the respective placement positions of the through-vias;
a generating step of generating layout data that includes the respective placement positions of the through-vias and the respective placement positions of the reserved cells
wherein when the design of the three-dimensional integrated circuit is changed such that the placement positions of the through-vias determined in the through-via placing step are changed, the respective placement positions of the reserved cells are determined as respective new placement positions of the through-vias after the change.

* * * * *